(12) United States Patent
Sexton et al.

(10) Patent No.: US 10,897,133 B2
(45) Date of Patent: Jan. 19, 2021

(54) ENERGY HARVESTING FROM CURRENT LOOPS

(71) Applicant: MSA TECHNOLOGY, LLC, Cranberry Township, PA (US)

(72) Inventors: Robert Kevin Sexton, Butler, PA (US); Mark Flori Zanella, Sr., Chicora, PA (US)

(73) Assignee: MSA TECHNOLOGY, LLC, Cranberry Township, PA (US)

( * ) Notice: Subject to any disclaimer, the term of this patent is extended or adjusted under 35 U.S.C. 154(b) by 0 days.

(21) Appl. No.: 16/518,942

(22) Filed: Jul. 22, 2019

(65) Prior Publication Data
US 2020/0028386 A1    Jan. 23, 2020

Related U.S. Application Data

(60) Provisional application No. 62/702,012, filed on Jul. 23, 2018.

(51) Int. Cl.
*H02J 1/06*    (2006.01)
*H02J 50/80*    (2016.01)
(Continued)

(52) U.S. Cl.
CPC .............. *H02J 1/06* (2013.01); *G01R 19/003* (2013.01); *G01R 27/02* (2013.01); *H02J 50/80* (2016.02); *G06F 1/3203* (2013.01)

(58) Field of Classification Search
CPC .......... H02J 1/06; H02J 50/80; G01R 19/003; G01R 27/02; G06F 1/3203
See application file for complete search history.

(56) References Cited

U.S. PATENT DOCUMENTS 4,533,520 A    8/1985    Bossart
5,535,243 A    7/1996    Voegele
(Continued)

FOREIGN PATENT DOCUMENTS

WO    2008157391 A1    12/2008
WO    2020023425 A1    1/2020

OTHER PUBLICATIONS

Cullis, C.F., Firth, J.G; Detection and Measurement of Hazardous Gases, Heinemann, Exeter, 29-67 (1981).
(Continued)

*Primary Examiner* — Carlos Amaya
(74) *Attorney, Agent, or Firm* — Bartony & Associates, LLC

(57) ABSTRACT

A system includes a two-conductor loop in which the loop current or current signal is controlled by a loop current controller to be proportional to a signal output from a sensor. The system further includes energy harvesting circuitry in electrical connection with the two-conductor loop which includes a second current controller in parallel electrical connection with the loop current controller and a power converter in electrical connection with the second current controller. The second current controls a portion of current drawn from the two-conductor loop and delivered to the power converter from an output port thereof. The portion of the current drawn from the two-conductor loop is returned to the loop current controller from the energy harvesting circuit. Noise in the portion of the current drawn from the two-conductor loop by the second current controller is controlled by the second current controller to be below a predetermined threshold.

33 Claims, 37 Drawing Sheets

(51) Int. Cl.
*G01R 19/00* (2006.01)
*G01R 27/02* (2006.01)
*G06F 1/3203* (2019.01)

(56) References Cited

U.S. PATENT DOCUMENTS

| | | | |
|---|---|---|---|
| 5,780,715 | A | 7/1998 | Imblum |
| 7,970,063 | B2 | 6/2011 | Schulte |
| 8,000,841 | B2 | 8/2011 | Orth |
| 8,826,721 | B2 | 9/2014 | Zanella, Sr. |
| 9,182,256 | B2 | 11/2015 | Wehrs |
| 9,228,967 | B2 | 1/2016 | Alepee |
| 2008/0013226 | A1* | 1/2008 | Kirst ............... H02H 9/008 361/18 |
| 2014/0074303 | A1 | 3/2014 | Haynes |
| 2017/0227498 | A1 | 8/2017 | Miller |
| 2017/0227499 | A1 | 8/2017 | Miller |
| 2018/0335411 | A1 | 11/2018 | Zanella, Sr. |
| 2018/0335412 | A1 | 11/2018 | Zanella, Sr. |

OTHER PUBLICATIONS

Firth, J.G. et al., The Principles of the Detection of Flammable Atmospheres by Catalytic Devices; Combustion and Flame 21, 303-311 (1973).
Mosely, P.T. and Tofield, B.C., Solid State Gas Sensors, Adams Hilger Press, Bristol, England 17-31, (1987).

\* cited by examiner

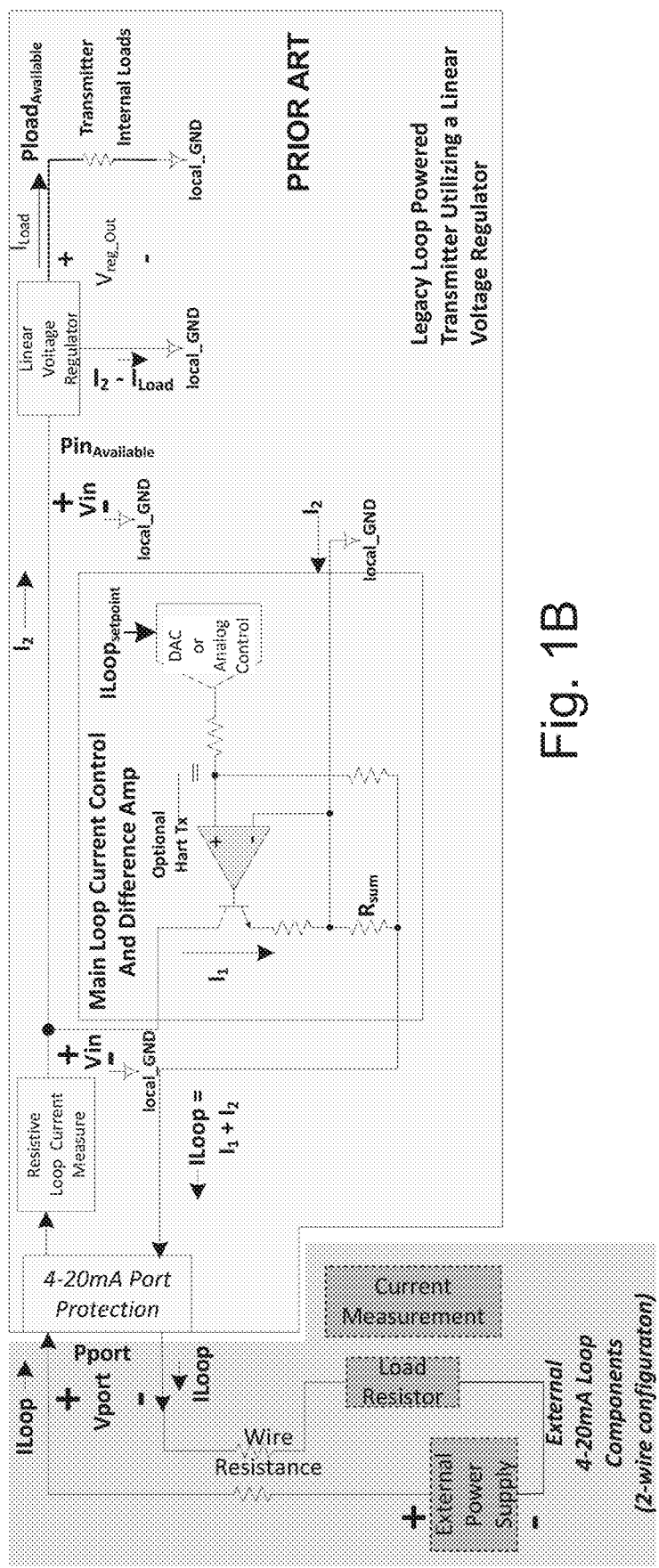
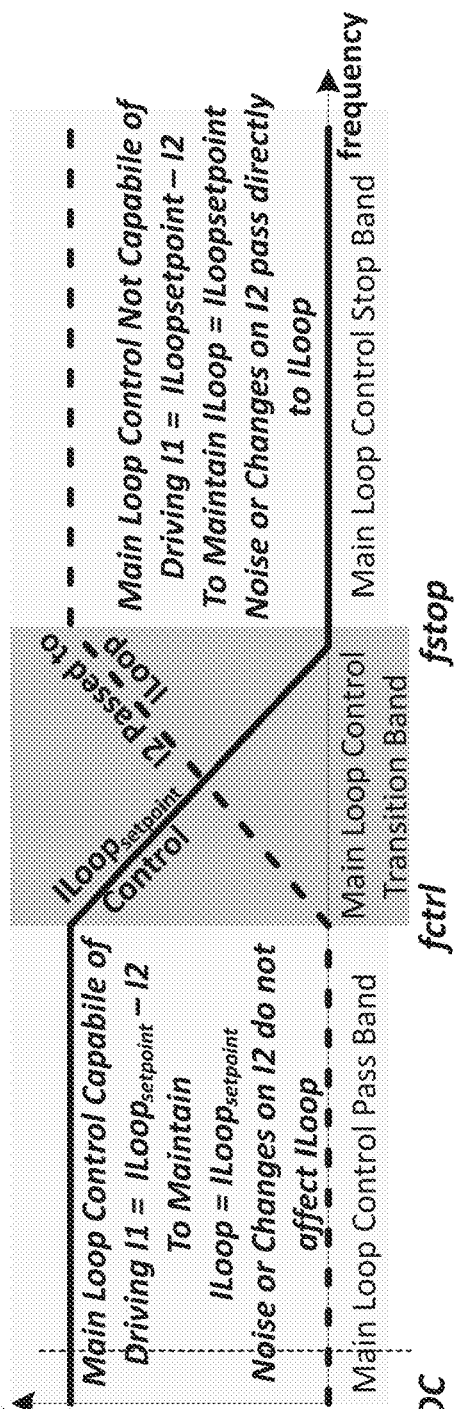
Fig. 1B
Fig. 1C $$\nabla \times \mathbf{B} = \mu_0 \left( \mathbf{J} + \varepsilon_0 \frac{\partial \mathbf{E}}{\partial t} \right)$$

(Refactor Ampere's Law in Terms of H and D)

$$\mathbf{B} = \mu_0 \vec{H}, \quad \frac{\partial \vec{D}}{\partial t} = \varepsilon_0 \frac{\partial \mathbf{E}}{\partial t}$$

$$\nabla \times \vec{H} = \vec{J} + \frac{\partial \vec{D}}{\partial t} \quad \text{("Ampere's Law")}$$

$$\nabla \cdot \nabla \times \vec{H} = \nabla \cdot \left( \vec{J} + \frac{\partial \vec{D}}{\partial t} \right)$$

$$0 = \nabla \cdot \vec{J} + \nabla \cdot \frac{\partial \vec{D}}{\partial t}$$

$$\nabla \cdot \vec{J} = -\frac{\partial \rho}{\partial t} \quad \text{("Continuity Equation")}$$

$$\iiint \nabla \cdot \vec{J} \, dv = -\iiint \frac{\partial \rho}{\partial t} \, dv$$

$$\oiint \vec{J} \cdot d\vec{s} = -\iiint \frac{\partial \rho}{\partial t} \, dv$$

$$\oiint \vec{J} \cdot d\vec{s} = -\frac{\partial Q}{\partial t}$$

$$\sum_s I = -\frac{\partial Q}{\partial t}$$

(Sum of Currents Entering and Leaving Closed Surface = Negative Time Rate of Accumulated Charge Inside Surface $$\sum_s I = 0 \quad \text{("Kirchoff's Current Law")}$$

(Sum of Currents Entering and Leaving Closed Surface go to zero when Time Rate of Accumulated Charge Inside Surface is Negligible

Model Equations for Estimation and Control of Power Parameters

A) (Vport Available from External Loop Components as function of Iport)

$\text{VportAv}[\text{Iport\_, Vext\_, RLoop\_}] = \text{Vext} - \text{Iport} * \text{RLoop}$

*(Note: Vext = External Loop Power Supply Voltage*
*Rloop = sum of all resistance (including wire resistance) connected to the external loop*
*Iport = ILoop setpoint command,*
*IPrimaryCmd = Current Controller 2 (CC2) setpoint,*
*Gcs = Current Controller 2 Current Gain,*
*Vfdiode = Forward Diode Voltage Drops of Diodes in the Model.*
*IBiasPrimaryMin is fixed component of Isteer and Iloss and allocation of ILoop to I1.*
*IBiasPrimary = ILoop − I2 == I1 + Iloss + Isteer = ILoop − IBiasPrimaryMin )*

B) (IBiasPrimary as function of Loop and CC2 setpoint cmds):

```
IBiasPrimary[Iport_,IPrimaryCmd_] =
    If Iport <= IBiasPrimaryMin
        IBiasPrimaryMin
    Elseif IPrimaryCmd == "Max"
        IBiasPrimaryMin+ (Iport-IBiasPrimaryMin)/Gcs,
    Elseif IPrimaryCmd <= Iport -(IBiasPrimaryMin+ (Iport-IBiasPrimaryMin)/
                Gcs),IBiasPrimaryMin + IPrimaryCmd/Gcs
        IBiasPrimaryMin+ (Iport-IBiasPrimaryMin)/Gcs;
    End
```

C) (Max Steady State IPrimary (I2 is steady state IPrimary) as function of Loop (Iport) and CC2 setpoint cmds (IPrimaryCmd)):

```
IPrimaryMax[Iport_,IPrimaryCmd_] =
    If IPrimaryCmd == "Max" and Iport - IBiasPrimary[Iport,"Max"] >=0
        Iport - IBiasPrimary[Iport,IPrimaryCmd];
    Elseif IPrimaryCmd<= Iport - IBiasPrimary[Iport,IPrimaryCmd]
        IPrimaryCmd;
    Else
        0 (results in Iprimary == minimum startup current driven by IREF)
    End
```

*(Note: ISecTarget is Current Controller 3 (CC3) Setpoint (for embodiments with CC3) or otherwise the Mean Secondary Load Current, eta = Power Converter Efficiency )*

D) (Power Converter Primary Voltage Required to Support a Target ISecondary Load)

$\text{VPrimaryReq}[\text{IPrimary\_, ISecTarget\_, eta\_}] = \text{Vsecondary} \cdot \text{ISecTarget}/(\text{IPrimary}*\text{eta})$;

E) (Minimum Primary Voltage Required for Power Converter to Run and Support a Target ISecondary Load)

```
VPrimaryReqMin[Iport_,IPrimaryCmd_,ISecTarget_,eta_,VPrimSMPSMin_] =
    If[VPrimSMPSMin >VPrimaryReq[IPrimaryMax[Iport,IPrimaryCmd],ISecTarget,eta]
        VPrimSMPSMin;
    Else
        VPrimaryReq[IPrimaryMax[Iport,IPrimaryCmd],ISecTarget,eta];
    End
```

*(Note: VPrimSMPSMin is the Power Converter Minimum Operational Primary Voltage)*

F) (Max Primary Voltage Available from Vport Given Iloop, CC2 and ISecTarget Current)

```
VPrimaryMaxAv[Vport_,Iport_,IPrimaryCmd_,ISecTarget_,eta_,VPrimSMPSMin_,Vclamp_margin] =
    Vport - (2 Vfdiode + Iport *(Rmeasure +RDAC) + Vclamp_margin +
    IPrimaryReqMin[Iport,IPrimaryCmd,ISecTarget,eta,VPrimSMPSMin]*(Rsense + RDSon));
```

*(Note: RDSon is the PFET channel resistance of the current controller 2 pass transistor;*
*Vclamp_margin is an optional voltage margin when using a voltage limiting clamp at the output of current controller 2)*

G) (Minimum Primary Current Required from ILoop (via I2) given Vprimary >= VprimaryReqMin and IPrimary <= IPrimaryMax)

```
IPrimaryReqMin[Iport_,IPrimaryCmd_,ISecTarget_,eta_,VPrimSMPSMin_] =
    If[Vsecondary*ISecTarget/(VprimaryReqMin[Iport,IPrimaryCmd,ISecTarget,eta,VPrimSMPSMin]*eta) <
            IPrimaryMax[Iport,IPrimaryCmd]
        Vsecondary*ISecTarget/(VprimaryReqMin[Iport,IPrimaryCmd,ISecTarget,eta,VPrimSMPSMin]*eta)
    Else
        IPrimaryMax[Iport,IPrimaryCmd];
    End
```

H) (Vport Required Given ILoop and CC2 Setpoint Cmds, Isec Load Target and Power Converter Primary Voltage Requirement)

```
VportReq[Iport_,IPrimaryCmd_,ISecTarget_,eta_,VPrimSMPSMin_,Vclamp_margin] =
    2 Vfdiode + Iport (Rmeasure +RDAC) + Vclamp_margin + IPrimary[Iport,IPrimaryCmd,ISecTarget, eta,VPrimSMPSMin]*(Rsense +
    RDSon) + Vsecondary*ISecTarget/(IPrimaryReqMin[Iport,IPrimaryCmd,ISecTarget,eta,VPrimSMPSMin]*eta);
```

I) (Vport Estimation from Vinput and Iport (loop current) Measurements)

$\text{Vport}[\text{Vinput\_, Iportmeas\_}] = \text{Vinput} + \text{Iportmeas}*(\text{Rmeasure} + \text{RDAC}) + \text{Vfdiode}$;

*where Vfdiode if forward diode drop of D1*

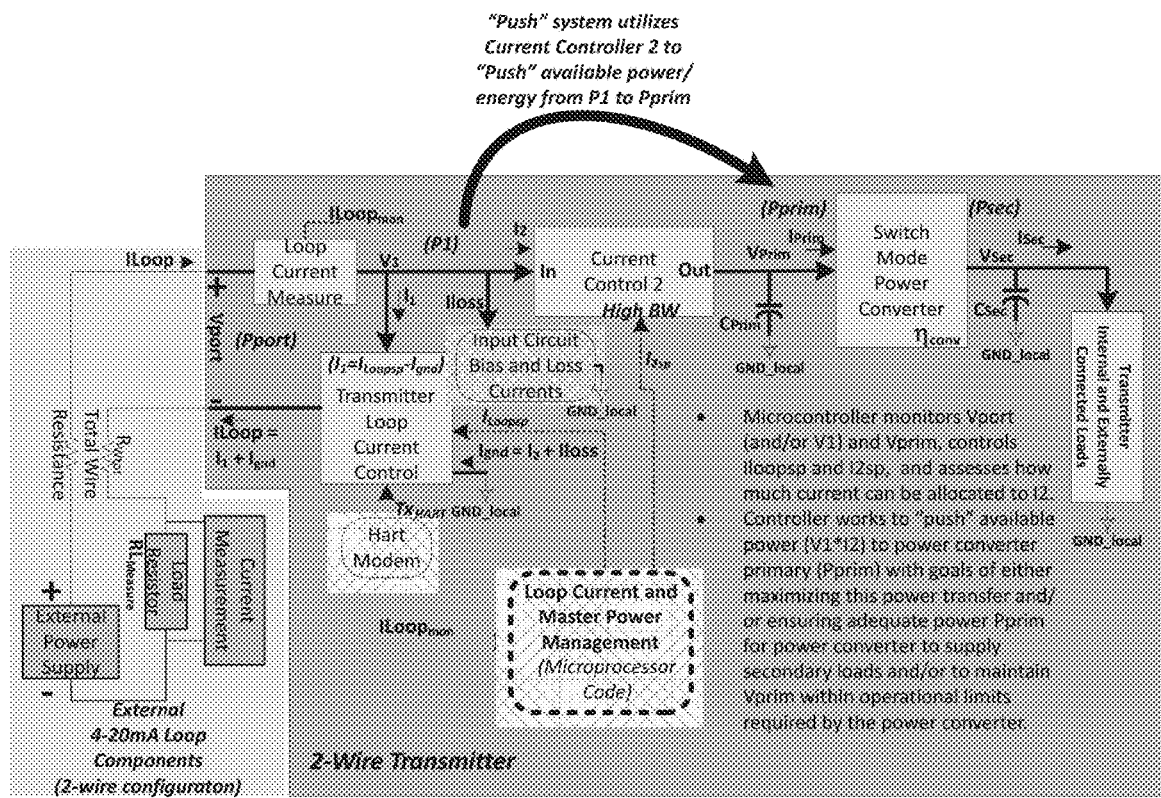

Fig. 13

- Microcontroller either estimates available power at power converter input or determines available converter input power by measuring or controlling Vprim and Iprim.
- Controller works to "pull" available power from Pprim to power converter secondary Psec using Current Controller 3 to increase the secondary current Isec while the power converter operates to maintain Vsec to maximize or optimize transfer of power across the power converter.
- The "pull" topology enables capture and storage of available power from Pprim (that would otherwise be wastefully dissipated on the primary side of the power converter) to secondary storage for use to power transient loads that can exceed the instantaneous power available at Pprim

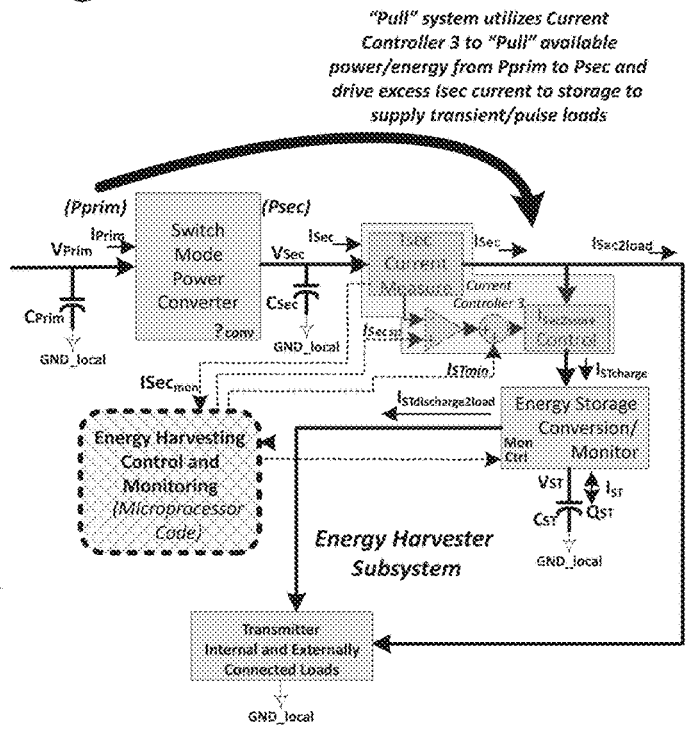

Fig. 14

Fig. 16B
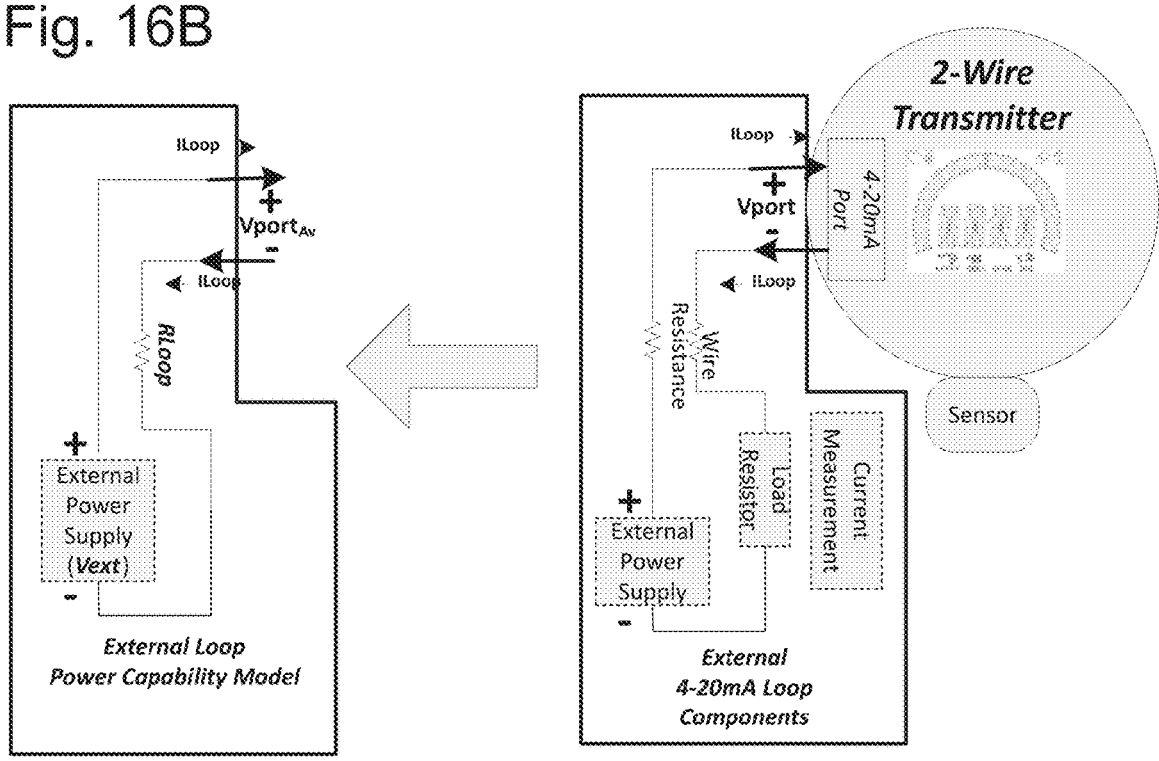
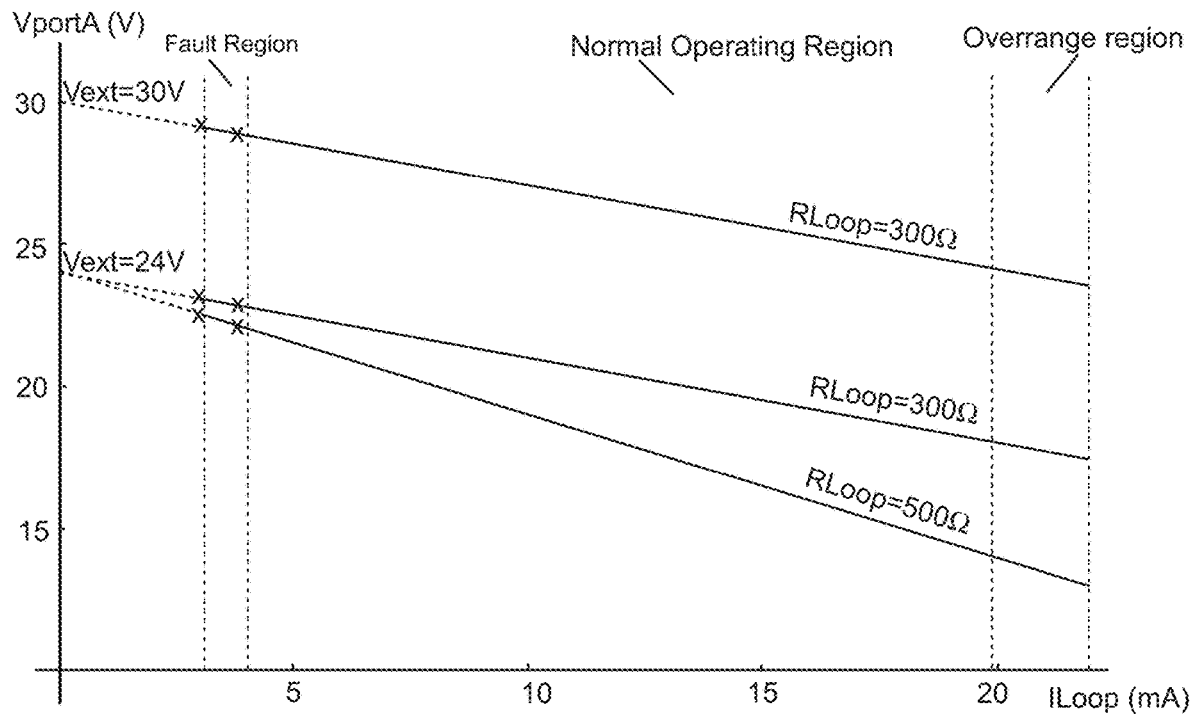
Fig. 16C

Fig. 22E

Table 2

| Iport (mA) | Vport Req (V) | SMPS | IPrimCmd (mA) | IPrim (mA) | IPrim Max (mA) | VPrim Req (V) | VPrim Min (V) | VLoopExt (V) | RLoop Meas (Ohms) | Loop AWG | Loop Length (ft) |
|---|---|---|---|---|---|---|---|---|---|---|---|
| 3.5 | 11.62 | Exist Buck | Max | 2.039 | 2.357 | 9.5 | 9.5 | - | - | - | - |
| 22 | 12.55 | Exist Buck | Max | 2.039 | 19.8 | 9.5 | 9.5 | 24 | 250 | 22 | 8381 |
| 3.5 | 10.35 | New Buck | Max | 2.357 | 2.357 | 8.2197 | 8.2197 | - | - | - | - |
| 22 | 10.56 | New Buck | Max | 2.583 | 19.8 | 7.5 | 7.5 | 24 | 250 | 22 | 11183 |
| 3.5 | 11.99 | SEPIC | Max | 2.357 | 2.357 | 9.8636 | 9.8636 | - | - | - | - |
| 22 | 5.685 | SEPIC | Max | 9.3 | 19.8 | 2.5 | 2.5 | 24 | 250 | 22 | 18045 |
| 3.5 | 11.62 | Exist Buck | Max | 2.039 | 2.357 | 9.5 | 9.5 | - | - | - | - |
| 22 | 12.55 | Exist Buck | Max | 2.039 | 19.8 | 9.5 | 9.5 | 24 | 250 | 18 | 21185 |
| 3.5 | 10.35 | New Buck | Max | 2.357 | 2.357 | 8.2197 | 8.2197 | - | - | - | - |
| 22 | 10.56 | New Buck | Max | 2.583 | 19.8 | 7.5 | 7.5 | 24 | 250 | 18 | 28267 |
| 3.5 | 11.99 | SEPIC | Max | 2.357 | 2.357 | 9.8636 | 9.8636 | - | - | - | - |
| 22 | 5.685 | SEPIC | Max | 9.3 | 19.8 | 2.5 | 2.5 | 24 | 250 | 18 | 45615 |

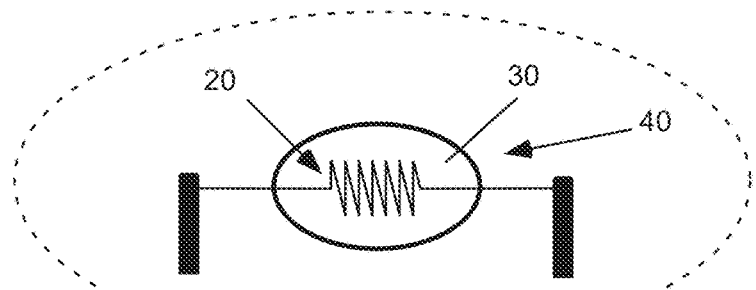
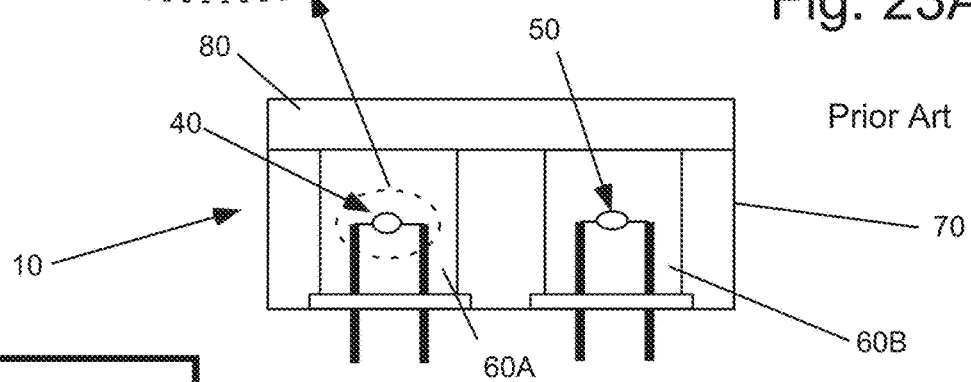
Fig. 23A
Prior Art
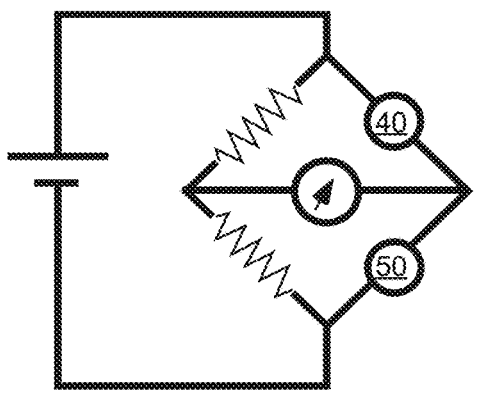
Fig. 23B
Prior Art
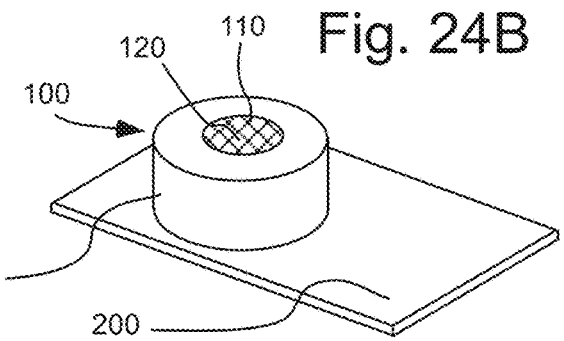
Fig. 24B
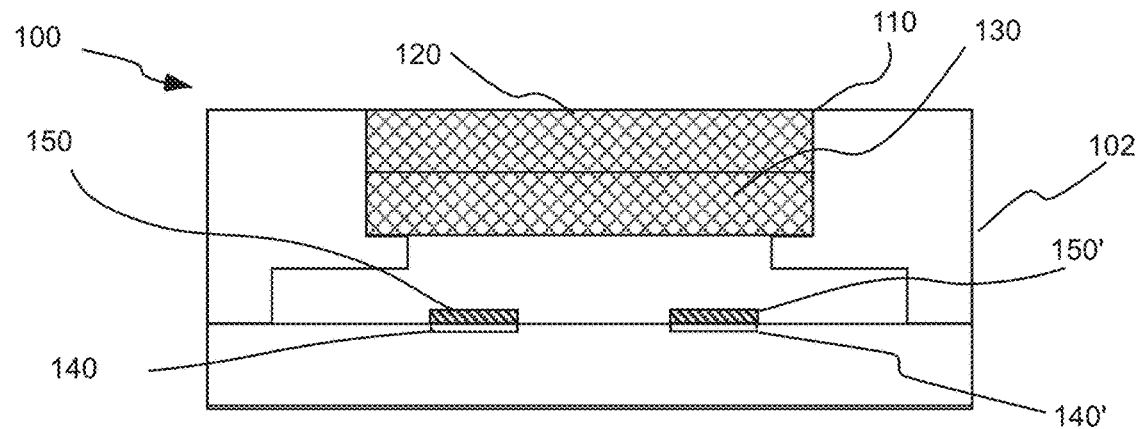
Fig. 24A Table 4

| On Time | Off Time | Operating Voltage | Operating Current (A) | Operating Power (mW) | Average Power (mW) | Gas Value (%LEL) | 4-20 mA Output | Power (mW@10V) | Maximum On-Time |
|---|---|---|---|---|---|---|---|---|---|
| 0.100 | 0.900 | 3.000 | 0.040 | 120 | 12 | 0% | 4.0 | 40 | 33% |
| 0.250 | 0.750 | 3.000 | 0.040 | 120 | 30 | 10% | 5.6 | 56 | 47% |
| 0.500 | 0.500 | 3.000 | 0.040 | 120 | 60 | 20% | 7.2 | 72 | 60% |
| 0.750 | 0.250 | 3.000 | 0.040 | 120 | 90 | 30% | 8.8 | 88 | 73% |
| 1.000 | 0.000 | 3.000 | 0.040 | 120 | 120 | 40% | 10.4 | 104 | 87% |
|  |  |  |  |  |  | 50% | 12.0 | 120 | 100% |
|  |  |  |  |  |  | 60% | 13.6 | 136 |  |
|  |  |  |  |  |  | 80% | 16.8 | 168 |  |
|  |  |  |  |  |  | 100% | 20.0 | 200 |  |

Fig. 26

Table 5

| On Time | Off Time | Operating Voltage | Operating Current (A) | Operating Power (mW) | Average Power (mW) | Gas Value (%LEL) | 4-20 mA Output | Power (mW@10V) | Maximum On-Time |
|---|---|---|---|---|---|---|---|---|---|
| 0.100 | 0.900 | 1.600 | 0.045 | 72 | 7.2 | 0% | 4.0 | 40 | 56% |
| 0.250 | 0.750 | 1.600 | 0.045 | 72 | 18 | 10% | 5.6 | 56 | 78% |
| 0.500 | 0.500 | 1.600 | 0.045 | 72 | 36 | 20% | 7.2 | 72 | 100% |
| 0.750 | 0.250 | 1.600 | 0.045 | 72 | 54 | 30% | 8.8 | 88 |  |
| 1.000 | 0.000 | 1.600 | 0.045 | 72 | 72 | 40% | 10.4 | 104 |  |
|  |  |  |  |  |  | 50% | 12.0 | 120 |  |
|  |  |  |  |  |  | 60% | 13.6 | 136 |  |
|  |  |  |  |  |  | 80% | 16.8 | 168 |  |
|  |  |  |  |  |  | 100% | 20.0 | 200 |  |

Fig. 27

ENERGY HARVESTING FROM CURRENT LOOPS

CROSS-REFERENCE TO RELATED APPLICATIONS

This application claims benefit of U.S. Provisional Patent Application Ser. No. 62/702,012, filed Jul. 23, 2018, the disclosure of which is incorporated herein by reference.

BACKGROUND

The following information is provided to assist the reader in understanding technologies disclosed below and the environment in which such technologies may typically be used. The terms used herein are not intended to be limited to any particular narrow interpretation unless clearly stated otherwise in this document. References set forth herein may facilitate understanding of the technologies or the background thereof. The disclosure of all references cited herein are incorporated by reference.

Current loops have been used to transmit data for process monitoring and control since the 1950s. As a result of low implementation cost, inherent resistance to noise, and ability to carry signals long distances, current loops have proven particularly well-suited for industrial environments.

Current loops include four common components: a current controller or transmitter that modulates the current in the loop to communicate information or control; a receiver that measures the loop current and interprets the information represented by the current; a power supply that provides the voltage required to drive the required range of current around the loop and a wire that connects the transmitter and receiver (and sometimes the power supply) in series to create a confined conductive path for the current flow. Current loops are classified by the manner in which these components are connected. In all instances, the transmitter, receiver and connecting wire carrying the current being modulated by the transmitter are in series. As illustrated in FIG. 1A, current loops are classified by the manner in which the power supply is connected to the system. In 3- and 4-wire transmitter embodiments, the power available to the transmitter is not affected directly by the loop current because of the independent connections to the supply. In the 2-wire transmitter system, the transmitter, receiver load, loop wire resistance and power supply are all in series with the current loop. Because of the external voltage supply placement in series with the current loop, the power available to the 2-wire transmitter is impacted not only by the external supply voltage but also by the loop current and the voltage drops of series loads (such as the receiver and wire resistances) in the loop, which are also dependent on the loop current. The magnitude and range of the loop current within which the transmitter is required to communicate, the external power supply and line losses around the loop thus represent important considerations impacting the power available to the 2-wire transmitter.

The dominant standard for current loop communications is the 4 to 20 milliamp (mA) protocol. In that protocol, information is passed between transmitter and receiver as a fraction of a predefined full scale range of current, wherein 4 mA represents the minimum value and 20 mA represents the maximum value. A total of 16 mA represents the full scale range. Loop currents below 4 mA are commonly employed to signal fault conditions detected at the transmitter. Currents above 20 mA are commonly used to indicate other abnormal conditions such as overrange. In typical applications, the required working current range may include a continuum of magnitudes at or less than 3 mA and extending as high as 22 mA.

Referring to FIG. 1B, the 2-wire transmitter must acquire power to both regulate the loop current and supply circuits within or connected to the transmitter from the power (Pport) available at the 4-20 mA port. Sometimes, all elements connected to the 4-20 mA port (other than the external loop components), including the loop control circuit and any components/loads connected thereto are referred to herein collectively as the transmitter. Pport is limited by the magnitude of ILoop and the port voltage (Vport) remaining from the external power supply less voltage losses incurred by the wire, receiver resistance (Rrec) and other loads connected to the line. Expressed simply: Pport=Vport*ILoop where Vport=Vsupply−ILoop*(Rwire+Rrec) any other loop losses. While the magnitude and range of ILoop is defined by the 4-20 mA communications protocol, Vport, (and hence, Pport) are influenced and limited by the external loop components. In practice, these external loop components are often part of a preexisting installation and commonly assume standard values adopted by industry. For example, the loop supply voltage (Vsupply), which determines the maximum voltage available to Vport, is typically fixed at a standard voltage (most frequently 24 volts). While it is desirable to minimize the receiver resistance Rrec to limit the voltage drop at the receiver, this resistance is often selected so that the voltage drop at ILoop=20 mA rises to 10 volts (Rrec=500 ohms) or 5 volts (Rrec=250 ohms). Alternatively, that resistance is selected to convert the resolution of ILoop into a voltage steps resolvable by the receiver. The 2-wire transmitter is used most frequently in remote applications with preexisting wiring or in new installations where the cost of purchasing and installing a $3^{rd}$ or $4^{th}$ wire over long distances is prohibitive. To minimize expense and complexity, long continuous lengths of wire are typically preferred to employing repeaters. Furthermore, minimal gauge wire, with higher resistivity, is often selected to save cost. As a result, the loop wire resistance (Rwire) often represents the largest resistive load in the loop. To accommodate the broadest range of loop component combinations, it is desirable that the transmitter be capable of adapting to the broadest range of available port power delivered by the external loop in acquiring power needed for internal operation and attached peripherals. To allocate a maximum margin for voltage losses of Rwire and other external loads (to facilitate the longest wire loop lengths possible), it is advantageous that the 2-wire transmitter be capable of acquiring sufficient power at the lowest possible Vport voltages across the required range of ILoop.

In practice, the power available to supply internal transmitter circuits is less than the available port power defined by Vport and ILoop. Some of the common mechanisms accounting for this reduced internal power availability are depicted in the block diagram of a typical legacy transmitter in FIG. 1B. ILoop is typically routed through lossy circuits such as protection devices at the port and resistive loop current measurement circuits, resulting in voltage losses reducing Vport to Vin along this path. While it is possible to connect ILoop in series with the internal transmitter loads, it is a more common practice to split it into two constituents: a current directed to the transmitter internal circuits (I2) and a shunt current (I1) that is modulated by a current controller to maintain ILoop=I1+I2 at a setpoint prescribed by an analog circuit or digital-to-analog converter (DAC) representing a process measurement or control scaled to 4-20 mA. In such a configuration, the maximum available internal power $Pin_{Available}$ is approximately defined by the product of I2 and Vin. To maximize $Pin_{Available}$, it is generally preferable to allocate as much of ILoop as possible to I2 by limiting I1. However, the maximum allocation to I2 ($I2_{max}$) must be restricted to ensure adequate overhead for I1 to sink current to regulate ILoop and to support implementation of digital signaling protocols such as wired HART™ which is most conveniently implemented through modulation of I1. Depending on the source of feedback for the closed loop control driving I1, I2 is either recombined with I1 at the port terminal (in the case where feedback for ILoop control is obtained directly from the loop current measurement circuit) or recombined with I1 at a summing resistor with I1 controlled such that I1=$ILoop_{setpoint}$–I2, where $ILoop_{setpoint}$ is the target control setpoint for ILoop. In the summing resistor arrangement, an additional voltage loss occurs as ILoop passes through Rsum effectively raising the transmitter local ground (local_GND) voltage above the Vport negative terminal and further increasing the voltage loss from Vport to Vin.

Because Vin varies with Vport and ILoop, it is not well suited as a direct supply for transmitter loads requiring a fixed voltage. Transmitters thus typically employ a linear voltage controller to regulate the variable Vin to an output voltage (Vreg_Out) suitable for supplying such loads. Because this regulator requires overhead ($V_{dropout}$) to maintain the fixed output voltage, Vreg_Out is restricted to a prescribed minimum Vin voltage ($Vin_{min}$) so that the maximum Vreg_Out is limited to $Vreg\_Out_{max} \leq Vin_{min} - V_{dropout}$. The power available to the regulated transmitter loads is thus restricted to $Pload_{Available}$=ILoad*Vreg_Out. The residual difference in power $Pin_{Available}$–$Pload_{Available}$ is dissipated as heat in the regulator. $Vin_{min}$ further establishes a fundamental minimum limit that Vport must meet or exceed at the highest value for ILoop, impacting the transmitter capability to accommodate the high loop resistances (most notably limiting the loop length as a result of the cumulative wire resistance with increased loop distance).

While the 2-wire transmitter must acquire power from the loop, its primary purpose is to modulate and control ILoop to communicate information or control. The number of discrete steps or resolution for this current loop communication is quantized by the division of the 16 mA range between 4 and 20 mA. In early applications, loop current resolution often did not exceed 100 steps, with 500 steps considered to be high. More recent sensing and control applications can demand resolution of 1000 steps or more (requiring 16 microamps (uA) or less per step). Effectively communicating information at these resolutions levies increased requirements upon the capability of the transmitter to regulate and constrain current noise on the loop to peak-to-peak tolerances well below the resolution current, typically less than ½ the resolution current (as an example: ≤8 uA for 1000 step resolution). Additionally, digital communications protocols, such as HART™ which superimposes frequency shift keying sinusoids at 1200 and 2200 Hz at an amplitude of 1 mA peak-to-peak AC current on the standard loop current, levy further demands on the bandwidth and stability capabilities of the transmitter loop current control.

The functionality and internal power requirements for 2-wire transmitters have evolved over the years. Early transmitters supported simple peripherals and circuits capable of operating within the load power restrictions imposed by the legacy transmitter power distribution topology described above. Additionally, the continuous operation nature of these early transmitter circuits inherently limited the bandwidth of noise and transients drawn on I2 to at or below a cutoff frequency (fctrl) of the main loop control circuit such that these components did not interfere with the transmitters ability to achieve the ILoop resolutions demanded at that time. Successive generations of transmitters sought to utilize advances in low power components such as microprocessors, display technologies, circuit components and sensors to increase functionality and features while retaining the power budgets and frequency component constraints on I2 of earlier products permitting continued use of linear regulators to satisfy both power and loop current noise requirements.

The recent proliferation of wireless communications in process and monitoring environments and advances in low-power electronics and sensors have driven interest in incorporating these technologies to expand the capabilities and features of 2-wire transmitter connected devices. Rather than operate in a continuously low power mode, many of these new technologies operate in burst or pulse modes in which the device alternates between longer intervals of low power demand and shorter intervals of high power demand to achieve a net low average power demand over an operational time period or cycle. In contrast to the pulse loads demanded from such devices, the 2-wire transmitter is fundamentally limited in both peak magnitude and response time to deliver power to internal loads. Such limitations arise from the limited power availability presented from the external loop to the 4-20 mA port, the transmitter's internal circuit losses, response time limitations in transferring available port power to the load, and the need to constrain transients from the transmitter's internal power circuits from imposing noise and disturbances on ILoop beyond the deviation limits required for communicating high resolution information on the loop. To successfully supply components and systems with fast transient or pulse mode power demands requires the transmitter's internal power system be capable of acquiring sufficient power available from the loop in a manner compliant with the signal and resolution requirements for loop communication. Moreover, the system must further be capable of transferring, transforming and distributing this acquired power to meet the individual demands of each active load and the combined load of all circuits supplied by the transmitter.

Previously available systems have inadequately addressed the requirements and concerns outlined above. In one such system, a current limiter was used in parallel connection with a main loop controller to limit the maximum current I2 that can be drawn by loads supplied by the transmitter from the loop current. The set current limit was further adjustable by a connected microcontroller. While such an approach can limit the maximum peak current that may be dynamically drawn by transmitter loads, it does not limit transient load demands with peak current below the set current limit. Load transients having magnitudes under the current limit setpoint can have bandwidth and magnitude that exceed the main loop controllers bandwidth and the ability thereof to suppress the transients from being transferred as noise onto ILoop.

In another system, an adjustable linear voltage regulator was placed in series with a switching power regulator which were together placed in parallel with the main loop controller. An indicated function of the linear voltage regulator was to prevent noise generated by the switching regulator from propagating to ILoop. However, use of a linear voltage regulator in this role cannot effectively control current or current noise drawn through the regulator (I2).

SUMMARY

In one aspect, a system includes a two-conductor loop in electrical connection with a power source and with a loop current controller. The loop current controller includes a first port having a first terminal and a second terminal to connect to respective conductors of the two-conductor loop and a second port in operative connection with a sensor. The loop current controller controls a current in the two-conductor loop to be equal to a current signal to transmit the current signal to a receiver connected to the two-conductor loop. The current in the two-conductor loop or current signal is controlled by the loop current controller to be proportional to a signal output from the sensor. The system further includes energy harvesting circuitry in electrical connection with the two-conductor loop. The energy harvesting circuitry includes a second current controller in parallel electrical connection with the loop current controller and a power converter in electrical connection with the second current controller. The second current controller controls a portion of current drawn from the two-conductor loop and delivered to the power converter from an output port of the second current controller. The portion of the current drawn from the two-conductor loop is less than the current signal into an input port thereof. The power converter converts the primary current and a primary voltage to a secondary current and a predetermined secondary voltage to be supplied to at least one load device. The portion of the current drawn from the two-conductor loop is returned to the loop current controller from the energy harvesting circuit. Noise in the portion of the current drawn from the two-conductor loop by the second current controller is controlled by the second current controller to be below a predetermined threshold so that the loop current controller controls noise in the current in the two-conductor loop to be less than a current corresponding to the resolution of the sensor. In a number of embodiments, noise in the portion of the current drawn from the two-conductor loop to the secondary current controller is controlled so that the loop current controller controls noise in the current in the two-conductor loop to be less than a current corresponding to one half the resolution of the sensor.

In a number of embodiments, the second current controller has a secondary bandwidth and the loop current controller has a first bandwidth, and the secondary bandwidth is greater than the first bandwidth. The secondary bandwidth may, for example, be sufficient to resist variation in the portion of current drawn from the two-conductor loop in response to variation in the primary current and the primary voltage arising in the energy harvesting circuit. The second current controller may, for example, reject noise in the current drawn by the energy harvesting circuit from the two-conductor loop such that the first bandwidth of the loop current controller is sufficient to restrict noise in the current signal to be within a desired or predetermined range (for example, within one half of the resolution of the sensor). In a number of embodiments, the second current controller rejects noise in the current drawn by the energy harvesting circuit from the two-conductor loop such that the first bandwidth of the loop current controller is sufficient to restrict noise in the loop current signal to be 8 µA or less. The two-conductor loop may, for example, have a measurement range in the current signal of 4-20 mA.

In a number of embodiments, the system further includes a processor system in operative connection with the sensor to receive an analog signal from the sensor. The processor system converts the analog signal to a digital signal to be delivered to the loop current controller to establish a first setpoint equivalent to the current signal. The processor system may, for example, be in operative connection with the second current controller to set a second setpoint equal the portion of the current drawn from the two-conductor loop by the second current controller. The second setpoint may, for example, be set based upon data feedback to the processor system indicating a status of power conversion.

In a number of embodiments, the loop current controller draws a current I1 from the two-conductor loop such that I1 plus the returned portion of the current drawn from the two-conductor loop by the second current controller is equal to the first setpoint, wherein the second setpoint is always less than the first setpoint. The second setpoint may, for example, be controlled by the processor system to be constant or to vary in a determined manner within the first bandwidth.

In a number of embodiments, the primary current is controlled to maintain the power input to the power converter in a predetermined manner based upon data feedback to the processor system indicating a status of power conversion.

The portion of current drawn from the two-conductor loop by the second current controller is further constrained by a current required to operate the loop current controller and a current requirement of any component other than the energy harvesting circuitry drawing current from the two-conductor loop. The second setpoint further determines the amount of current allocated to the loop current controller to control the current signal via drawing current I1 from the two-conductor loop.

The portion of the current drawn from the two-conductor loop may, for example, be determined by the processor system on the basis of the first setpoint and a voltage across the first port. The portion of the current drawn from the two-conductor loop may, for example, be determined by the processor system further on the basis of a power requirement of the at least one load device and an efficiency of the power converter.

In a number of embodiments, the energy harvesting system further includes a third current controller having an input port in electrical connection with an output of the power converter. The third current controller determines the secondary current drawn through the power converter. The energy harvesting system may further include at least one energy storage component which is in electrical connection with the output of the power converter and with the at least one load. The energy storage system may, for example, be in electrical connection with an output of the third current controller and in electrical connection with the at least one load device.

The at least one energy storage component may, for example, include at least one high-capacity capacitor. Energy may, for example, be transferred to the at least one load device from the at least one high-capacity capacitor if an instantaneous power requirement of the at least one load device exceeds an instantaneous power available from the power converter. Energy may, for example, be transferred to the at least one high-capacity capacitor if the instantaneous power required by the at least one load device is less than the instantaneous power energy available from the power converter. In a number of embodiments, energy may be transferred to the at least one load device from the at least one high-capacity capacitor if the primary voltage is below a predetermined threshold.

In a number of embodiments, the processor system is in operative connection with the third current controller, determines a third setpoint equivalent to the secondary current to be drawn through the power converter and transmits the third setpoint to the third current controller. In a number of embodiments, the processor system further controls energy transfer from the at least one high-capacity capacitor.

The third setpoint may, for example, be determined by the processor system on the basis of at least one of a power available to the power converter and a predetermined operating range of the primary current and the primary voltage. The second setpoint and the third setpoint may, for example, be determined to maintain each of the primary current and the primary voltage in a predetermined range. The second setpoint and the third setpoint may, for example, be determined to control the operation of the power converter so that primary current noise generated by the converter remains within the combined bandwidth of the second controller and the converter input capacitance so that the primary current noise does not appear on I2.

In a number of embodiments, a capacity of the at least one high-capacity capacitor is determined based upon a predicted load profile of the at least one load device.

In a number of embodiments, the at least one load device is a combustible gas sensor. The combustible gas sensor may further be the sensor from which the signal is output.

The combustible gas sensor may, for example, include a first element, the first element including a first electric heating element, a first support structure on the first electric heating element and a first catalyst supported on the first support structure. The combustible gas sensor may further include electronic circuitry in electrical connection with the energy harvesting system and with the first element. The electronic circuitry provides energy to the first element to heat the first element to at least a first temperature at which the first catalyst catalyzed combustion of an analyte gas. The electronic circuitry may, for example, apply energy to the first element in a pulsed manner. The first element has a thermal time constant less than 8 seconds, less than 6 seconds, less than 1 second, less than 0.5 seconds or less than 0.250 seconds.

The system may, for example, include a plurality of load devices including a combustible gas sensor in operative connection with the power conversion system. A capacity of the at least one high-capacity capacitor may, for example, be determined based upon a predicted load profile of the plurality of load devices.

The processor system may, for example, control application of power to at least one of the plurality of load devices based upon a predetermined rule set.

In a number of embodiments, the power converter includes a DC-DC switched-mode power supply to provide a predetermined secondary voltage. In a number of embodiments, the power converter includes a buck converter, a single-ended primary-inductor converter (SEPIC converter) or a switched capacitor converter to provide a predetermined secondary voltage.

In a number of embodiments, the primary current and the secondary current are controlled to reduce or eliminate the need for large capacitance required at an input of the power converter.

As described above, in a number of embodiments (whether the system includes the third current controller or not), the energy harvesting system further includes at least one energy storage component in electrical connection with an output of the power converter and in electrical connection with the at least one load device. The at least one energy storage component may, for example, include at least one high-capacity capacitor. In a number of embodiments, energy is transferred to the at least one load device from the at least one high-capacity capacitor if an instantaneous power requirement of the at least one load device exceeds an instantaneous power available from the power converter.

In a number of embodiments, an impedance looking into the output of the second current controller is greater than an impedance looking into a bypass capacitance in electrical connection of the output of the second current controller and with the input of the power converter. The impedance looking into the output of the second current controller may, for example, be sufficiently greater than the impedance of the input looking into the bypass capacitance (at frequencies at or above the bandwidth of the second controller) so that harmonics above the bandwidth of the second controller are drawn from the bypass capacitance.

In another aspect, a method of harvesting energy from a two-conductor loop in electrical connection with a power source and with a loop current controller is provided. The loop current controller includes a first port having a first terminal and a second terminal to connect to respective conductors of the two-conductor loop and a second port in operative connection with a sensor. The loop current controller controls a current in the two-conductor loop to be equal to a current signal to transmit the current signal to a receiver connected to the two-conductor loop. The current in the two-conductor loop (current signal) is controlled by the loop current controller to be proportional to a signal output from the sensor. The method includes electrically connecting an energy harvesting circuit to the two-conductor loop, wherein the energy harvesting circuit includes a second current controller connected in parallel electrical connection with the loop current controller and a power converter in electrical connection with an output of the second current controller. The second current controller controls a portion of current drawn from the two-conductor loop and delivered to the power converter from an output port of the second current controller. The portion of the current drawn from the two-conductor loop is less than the current signal into an input port thereof. The method further includes converting a primary current and a primary voltage to a secondary current and a predetermined secondary voltage to be supplied to at least one load device via the power converter, and returning the portion of the current drawn from the two-conductor loop to the loop current controller from the energy harvesting circuit. The noise in the portion of the current drawn from the two-conductor loop by the second current controller is controlled by the second current controller to be below a predetermined threshold so that the loop current controller controls noise in the current in the two-conductor loop to be less than a current corresponding to the resolution of the sensor.

As described above, in a number of embodiments, the second current controller has a secondary bandwidth and the loop current controller has a first bandwidth, and the secondary bandwidth is greater than the first bandwidth. The secondary bandwidth may, for example, be sufficient to resist variation in the portion of current drawn from the two-conductor loop in response to variation in the primary current and the primary voltage arising in the energy harvesting circuit. The second current controller may, for example, reject noise in the current drawn by the energy harvesting circuit from the two-conductor loop such that the first bandwidth of the loop current controller is sufficient to restrict noise in the current signal to be within a desired or predetermined range (for example, within one half of the resolution of the sensor). In a number of embodiments, the second current controller rejects noise in the current drawn by the energy harvesting circuit from the two-conductor loop such that the first bandwidth of the loop current controller is sufficient to restrict noise in the loop current signal to be 8 µA or less. The two-conductor loop may, for example, have a measurement range in the current signal of 4-20 mA.

In a number of embodiments, the method further includes providing a processor system in operative connection with the sensor to receive an analog signal from the sensor. The processor system converts the analog signal to a digital signal to be delivered to the loop current controller to establish a first setpoint equivalent to the current signal. The processor system may, for example, be in operative connection with the second current controller to set a second setpoint equal to the portion of the current drawn from the two-conductor loop by the second current controller. The second setpoint may, for example, be set based upon data feedback to the processor system indicating a status of power conversion.

In a number of embodiments, the loop current controller draws a current I1 from the two-conductor loop such that I1 plus the returned portion of the current drawn from the two-conductor loop by the second current controller is equal to the first setpoint, wherein the second setpoint is always less than the first setpoint. The second setpoint may, for example, be controlled by the processor system to be constant or to vary in a determined manner within the first bandwidth.

In a number of embodiments, the primary current is controlled to maintain the power input to the power converter in a predetermined manner based upon data feedback to the processor system indicating a status of power conversion.

The portion of current drawn from the two-conductor loop by the second current controller is further constrained by a current required to operate the loop current controller and a current requirement of any component other than the energy harvesting circuitry drawing current from the two-conductor loop. The second setpoint further determines the amount of current allocated to the loop current controller to control the current signal via drawing current I1 from the two-conductor loop.

The portion of the current drawn from the two-conductor loop may, for example, be determined by the processor system on the basis of the first setpoint and a voltage across the first port. The portion of the current drawn from the two-conductor loop may, for example, be determined by the processor system further on the basis of a power requirement of the at least one load device and an efficiency of the power converter.

In a number of embodiments, the energy harvesting system further includes a third current controller having an input port in electrical connection with an output of the power converter. The third current controller determines the secondary current drawn through the power converter. The energy harvesting system may further include at least one energy storage component which is in electrical connection with the at least one load. The energy storage system may, for example, be in electrical connection with an output of the third current controller and in electrical connection with the at least one load device.

The at least one energy storage component may, for example, include at least one high-capacity capacitor. Energy may, for example, be transferred to the at least one load device from the at least one high-capacity capacitor if an instantaneous power requirement of the at least one load device exceeds an instantaneous power available from the power converter. Energy may, for example, be transferred to the at least one high-capacity capacitor if the instantaneous power required by the at least one load device is less than the instantaneous power energy available from the power converter. In a number of embodiments, energy may be transferred to the at least one load device from the at least one high-capacity capacitor if the primary voltage is below a predetermined threshold.

In a number of embodiments, the processor system is in operative connection with the third current controller, determines a third setpoint equivalent to the secondary current to be drawn through the power converter and transmits the third setpoint to the third current controller. In a number of embodiments, the processor system further controls energy transfer from the at least one high-capacity capacitor.

The third setpoint may, for example, be determined by the processor system on the basis of at least one of a power available to the power converter and a predetermined operating range of the primary current and the primary voltage. The second setpoint and the third setpoint may, for example, be determined to maintain each of the primary current and the primary voltage in a predetermined range. The second setpoint and the third setpoint may, for example, be determined to control the operation of the power converter so that primary current noise generated by the converter remains within the combined bandwidth of the second controller and the converter input capacitance so that the primary current noise does not appear on I2.

In a number of embodiments, a capacity of the at least one high-capacity capacitor is determined based upon a predicted load profile of the at least one load device.

In a number of embodiments, the at least one load device is a combustible gas sensor. The combustible gas sensor may further be the sensor from which the signal is output.

The combustible gas sensor may, for example, include a first element, which includes a first electric heating element, a first support structure on the first electric heating element and a first catalyst supported on the first support structure. The combustible gas sensor may further include electronic circuitry in electrical connection with the energy harvesting system and with the first element. The electronic circuitry provides energy to the first element to heat the first element to at least a first temperature at which the first catalyst catalyzed combustion of an analyte gas. The electronic circuitry may, for example, apply energy to the first element in a pulsed manner. The first element may, for example, have a thermal time constant less than 8 seconds, less than 6 seconds, less than 1 second, less than 0.5 seconds or less than 0.250 seconds.

The system may, for example, include a plurality of load devices including a combustible gas sensor in operative connection with the power conversion system. A capacity of the at least one high-capacity capacitor may, for example, be determined based upon a predicted load profile of the plurality of load devices.

The processor system may, for example, control application of power to at least one of the plurality of load devices based upon a predetermined rule set.

In a number of embodiments, the power converter includes a DC-DC switched-mode power supply to provide a predetermined secondary voltage. In a number of embodiments, the power converter includes a buck converter, a SEPIC converter or a switched capacitor converter to provide a predetermined secondary voltage.

In a number of embodiments, the primary current and the secondary current are controlled to reduce or eliminate the need for large capacitance required at an input of the power converter.

As described above, in a number of embodiments (whether a third current controller is provided or not), the energy harvesting system may further include at least one energy storage component in electrical connection with an output of the power converter and in electrical connection with the at least one load device. The at least one energy storage component may, for example, include at least one high-capacity capacitor. In a number of embodiments, energy is transferred to the at least one load device from the at least one high-capacity capacitor if an instantaneous power requirement of the at least one load device exceeds an instantaneous power available from the power converter.

As also described above, in a number of embodiments, an impedance looking into the output of the second current controller is greater than an impedance looking into a bypass capacitance in electrical connection of the output of the second current controller and with the input of the power converter. The impedance looking into the output of the second current controller may, for example, be sufficiently greater than the impedance of the input looking into the bypass capacitance (at frequencies at or above the bandwidth of the second controller) so that harmonics above the bandwidth of the second controller are drawn from the bypass capacitance.

In a further aspect, a system includes a two-conductor loop in electrical connection with a power source and with a loop current controller. The loop current controller includes a first port having a first terminal and a second terminal to connect to respective conductors of the two-conductor loop and a second port in operative connection with a combustible gas sensor. The loop current controller controls a current in the two-conductor loop to be equal to a current signal to transmit the current signal to a receiver connected to the two-conductor loop. The current in the two-conductor current loop is controlled by the loop current controller to be proportional to a signal output from the combustible gas sensor. The system further includes an energy harvesting circuitry in electrical connection with the two-conductor loop. The energy harvesting circuitry includes a second current controller in parallel electrical connection with the loop current controller and a power converter in electrical connection with the second current controller. The second current controller controls a portion of current drawn from the two-conductor loop and delivered to the power converter from an output port of the second current controller. The portion of the current drawn from the two-conductor loop is less than the current signal into an input port thereof. The power converter converts a primary current and a primary voltage to a secondary current and a predetermined secondary voltage to be supplied to at least one load device. The portion of the current drawn from the two-conductor loop is returned to the loop current controller from the energy harvesting circuit. The noise in the portion of the current drawn from the two-conductor loop by the second current controller is controlled by the second current controller to be below a predetermined threshold so that the loop current controller controls noise in the current in the two-conductor loop to be less than a current corresponding to the resolution of the combustible gas sensor. The system may, for example, be otherwise characterized as described above.

The present devices, systems, and methods, along with the attributes and attendant advantages thereof, will best be appreciated and understood in view of the following detailed description taken in conjunction with the accompanying drawings.

BRIEF DESCRIPTION OF THE DRAWINGS

FIG. 1B illustrates a representative embodiment of a currently available 2-wire current loop system.

FIG. 1C illustrates operation and limitations of the current control circuit or current controller of a transmitter in restricting sources of variability or noise in the current on the loop.

FIG. 3A sets forth as subset of Maxwell's equations and the derivation of Kirchoff's law from Ampere's law.

FIG. 6A (in combination with FIGS. 6B through 6E) illustrates the operation of the first and second current controllers to manage the power converter primary voltage during ILoop transients and the combined action of the third current controller and load switching to increase and decrease the demand on Iprimary (through Isecondary) to both capture excess energy and return it to the loads to make optimal use of available power at the power converter primary and sustain secondary power needs when Pprimary falls below PprimaryReq, wherein FIG. 6A illustrates such functionality of with varying power from the port.

FIG. 11A (in combination with FIGS. 11B and 11C) illustrates a model for estimation of parameters available and required power for an embodiment of model-based control, wherein FIG. 11A illustrates an embodiment of the circuit.

FIG. 12 illustrates equations for estimation and control of power parameters.

FIG. 13 illustrates an embodiment of a system hereof, sometimes referred to as a "push system" wherein the second current controller "pushes" available power/energy from P1 to Pprim.

FIG. 14 illustrates an embodiment of a system hereof, sometimes referred to as a "pull system" wherein the third current controller "pulls" available power/energy from the primary Pprim to the secondary Psec and drives excess secondary current Isec to storage.

FIG. 16B illustrates a steady-state external loop model to assess and estimate power available to the transmitter port.

FIG. 16C illustrates available port voltage VportAv vs ILoop for three different loops, wherein interrogation setpoints are marked by "X".

FIG. 22E illustrates Table 2 which sets forth tabulated requirements and capability of a transmitter including the magnet input interface of FIG. 22A.

FIG. 23A illustrates an embodiment of a conventional combustible gas sensor.

FIG. 23B illustrates an enlarged view of a Wheatstone bridge circuit incorporating the sensing element and the compensating element of the combustible gas sensor of FIG. 23A.

FIG. 24A illustrates an embodiment of a MEMS pellistor for use in the systems hereof.

FIG. 24B illustrates a MEMS sensor mounted on a printed circuit board.

FIG. 26 illustrates Table 4 which sets forth methane operating conditions and response data for a microhotplate or MEMS device.

FIG. 27 illustrates Table 5 which sets forth methane operating conditions and response data for another sensor.

DETAILED DESCRIPTION

Figure 1A:
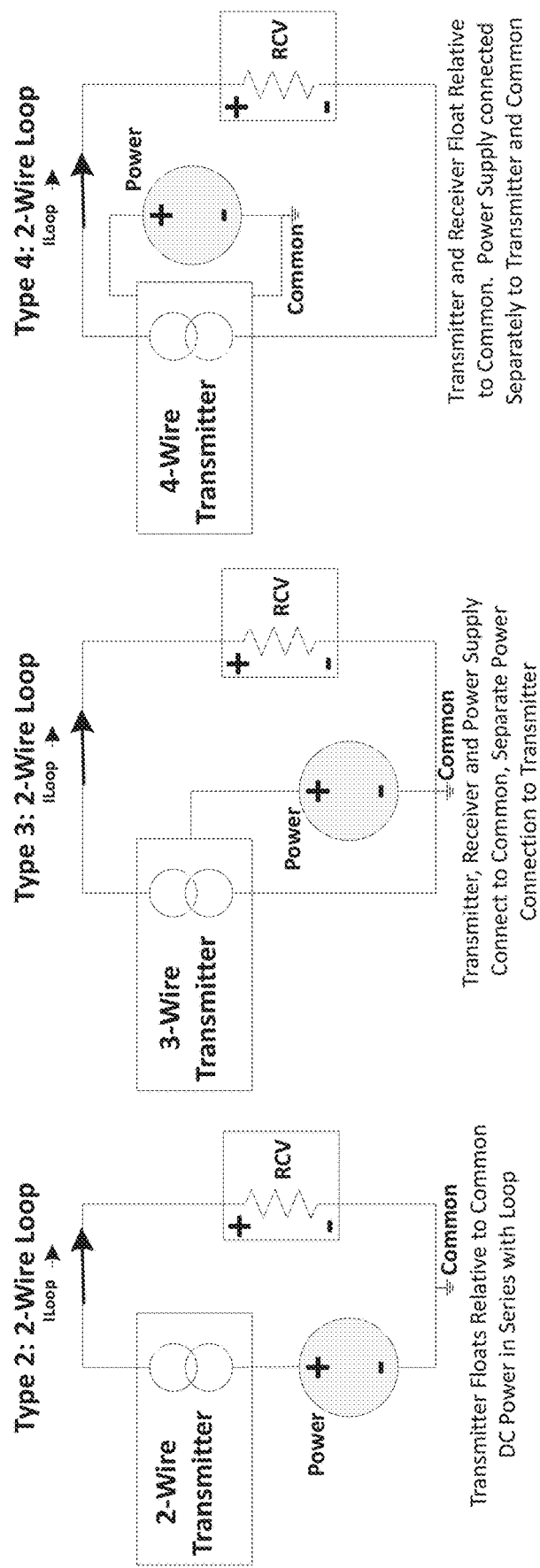
FIG. 1A illustrates embodiment of currently available 2-wire 3-wire and 4-wire current loops.

It will be readily understood that the components of the embodiments, as generally described and illustrated in the figures herein, may be arranged and designed in a wide variety of different configurations in addition to the described representative embodiments. Thus, the following more detailed description of the representative embodiments, as illustrated in the figures, is not intended to limit the scope of the embodiments, as claimed, but is merely illustrative of representative embodiments.

Reference throughout this specification to "one embodiment" or "an embodiment" (or the like) means that a particular feature, structure, or characteristic described in connection with the embodiment is included in at least one embodiment. Thus, the appearance of the phrases "in one embodiment" or "in an embodiment" or the like in various places throughout this specification are not necessarily all referring to the same embodiment.

Furthermore, described features, structures, or characteristics may be combined in any suitable manner in one or more embodiments. In the following description, numerous specific details are provided to give a thorough understanding of embodiments. One skilled in the relevant art will recognize, however, that the various embodiments can be practiced without one or more of the specific details, or with other methods, components, materials, et cetera. In other instances, well known structures, materials, or operations are not shown or described in detail to avoid obfuscation.

As used herein and in the appended claims, the singular forms "a," "an", and "the" include plural references unless the context clearly dictates otherwise. Thus, for example, reference to "a load" includes a plurality of such loads and equivalents thereof known to those skilled in the art, and so forth, and reference to "the load" is a reference to one or more such loads and equivalents thereof known to those skilled in the art, and so forth. Recitation of ranges of values herein are merely intended to serve as a shorthand method of referring individually to each separate value falling within the range. Unless otherwise indicated herein, and each separate value, as well as intermediate ranges, are incorporated into the specification as if individually recited herein. All methods described herein can be performed in any suitable order unless otherwise indicated herein or otherwise clearly contraindicated by the text.

The terms "electronic circuitry", "circuitry" or "circuit," as used herein include, but is not limited to, hardware, firmware, software or combinations of each to perform a function(s) or an action(s). For example, based on a desired feature or need. a circuit may include a software controlled microprocessor, discrete logic such as an application specific integrated circuit (ASIC), or other programmed logic device. A circuit may also be fully embodied as software. As used herein, "circuit" is considered synonymous with "logic." The term "logic", as used herein includes, but is not limited to, hardware, firmware, software or combinations of each to perform a function(s) or an action(s), or to cause a function or action from another component. For example, based on a desired application or need, logic may include a software controlled microprocessor, discrete logic such as an application specific integrated circuit (ASIC), or other programmed logic device. Logic may also be fully embodied as software.

The term "processor," as used herein includes, but is not limited to, one or more of virtually any number of processor systems or stand-alone processors, such as microprocessors, microcontrollers, central processing units (CPUs), and digital signal processors (DSPs), in any combination. The processor may be associated with various other circuits that support operation of the processor, such as random access memory (RAM), read-only memory (ROM), programmable read-only memory (PROM), erasable programmable read only memory (EPROM), clocks, decoders, memory controllers, or interrupt controllers, etc. These support circuits may be internal or external to the processor or its associated electronic packaging. The support circuits are in operative communication with the processor. The support circuits are not necessarily shown separate from the processor in block diagrams or other drawings.

The term "controller," as used herein includes, but is not limited to, any circuit or device that coordinates and controls the operation of one or more input and/or output devices. A controller may, for example, include a device having one or more processors, microprocessors, or central processing units capable of being programmed to perform functions.

The term "logic," as used herein includes, but is not limited to. hardware, firmware, software or combinations thereof to perform a function(s) or an action(s), or to cause a function or action from another element or component. Based on a certain application or need, logic may, for example, include a software controlled microprocess, discrete logic such as an application specific integrated circuit (ASIC), or other programmed logic device. Logic may also be fully embodied as software. As used herein, the term "logic" is considered synonymous with the term "circuit."

The term "software," as used herein includes, but is not limited to, one or more computer readable or executable instructions that cause a computer or other electronic device to perform functions, actions, or behave in a desired manner. The instructions may be embodied in various forms such as routines, algorithms, modules or programs including separate applications or code from dynamically linked libraries. Software may also be implemented in various forms such as a stand-alone program, a function call, a servlet, an applet, instructions stored in a memory, part of an operating system or other type of executable instructions. It will be appreciated by one of ordinary skill in the art that the form of software is dependent on, for example, requirements of a desired application, the environment it runs on, or the desires of a designer/programmer or the like.

The term "power converter" as used herein refers to system such as an electronic circuit or electromechanical device that converts a source of direct current or DC from one voltage level to another. The term "current controller" as used herein refers to an electronic circuit or electromechanical device that draws from a source a predetermined current in response to a supplied setpoint.

In a number of embodiments, devices, systems and methods hereof enable a 2-wire transmitter to supply, for example, transients or intermittent high pulse power loads via a power converter from power acquired from the external loop while retaining the capability to communicate high resolution information on the loop. Use of a power converter in the systems hereof provides a number of advantages as compared to the use of a linear power regulator in previous systems. In the use of a linear power regulator, the sustainable power available across the operating range of loop current is limited and defined by the product of the minimum loop current (which is coincident with the highest port voltage) and the minimum regulator input voltage which must be strictly greater than the output voltage and strictly less than the minimum voltage available from the loop (which is coincident with the lowest loop current). The power available from input voltage in excess of the minimum is dissipated as heat in the regulator. However, use of power conversion in the devices, systems and methods hereof, the input power is defined by the product of the available input current and input voltage (above the minimum voltage required by the converter) to the converter. That input power, which is lost as heat in the linear regulator, may be converted to additional sustainable secondary power to supply loads across the operational range of loop current in the case of a power converter. Although power converters are inherently noisy in operation, the use of a second current controller in the devices, systems and methods hereof enables use of a power converter while retaining the capability to communicate high resolution information on the loop.

Figure 1D:
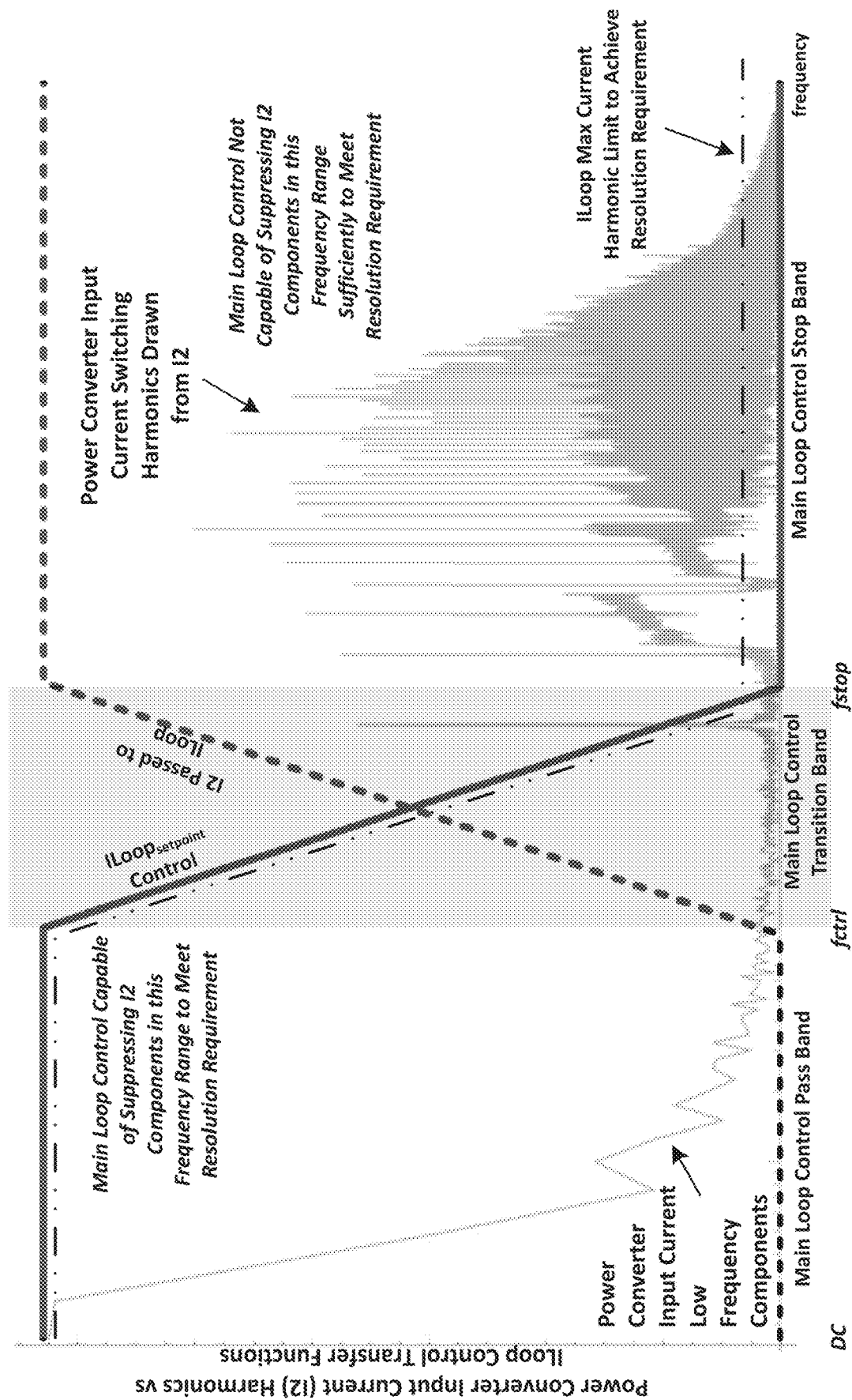
FIG. 1D illustrates an overlay of power converter (for example, a switched mode power supply or SMPS) input current harmonics on the first (or main loop) current controller rejection capabilities.

FIG. 1C illustrates the role and limitation of the transmitter's main loop current control circuit in restricting sources of variability on ILoop, most notably from the transmitter's internal power supply and circuits powered from I2, to achieve the required resolution and compliance of ILoop to $ILoop_{setpoint}$. The aspects of the noise and transients associated with providing adequate power for transmitter circuits from I2 while achieving compliance of ILoop to $ILoop_{setpoint}$ within the variability defined by the required resolution share a codependence. This codependence is best understood by considering the capabilities and limitations of the transmitter's loop current controller (referenced in FIG. 1C as the main loop controller). FIG. 1C illustrates three regions associated with the main loop controller bandwidth. Within the pass band region bounded by DC (0 Hz) and cutoff frequency fctrl, the transmitter or main loop controller is capable of modulating I1 to hold ILoop=$ILoop_{setpoint}$ while adequately rejecting noise and transients drawn by the internal transmitter components and power supply on I2. In practice, fctrl must be kept sufficiently low to avoid instability over the broadest range of impedance presented by the external components on the loop, yet high enough to support the fastest required loop transients such as those demanded by digital communications protocols such as HART™. In the transition band above fctrl, the loop controller becomes less capable of holding ILoop to $ILoop_{setpoint}$ and begins to allow components of I2 over the frequencies in this band to be passed to ILoop until, at and above the stop band frequency fstop, the controller is no longer capable of driving I1 to hold ILoop compliant to $ILoop_{setpoint}$, and components of I2 pass fully to ILoop. FIG. 1D illustrates an overlay of power converter (for example, a switched mode power supply or SMPS) input current harmonics on the first (or main loop) current controller rejection capabilities.

As described above, a first current controller (sometimes referred to herein and/or in the figures as a main loop controller, loop current controller or current controller 1) in a transmitter is used to control the current in a current loop of a two-wire system. As also described above, the first or loop current controller must have a narrow bandwidth to ensure stability in controlling the loop current while accommodating a broad range of reactance/impedance presented by external components in electrical connection with the loop (the, receiver etc.). Broadening the bandwidth of the first current controller sufficiently to counteract fast current transients drawn by pulse loads or a power converter would extend beyond the maximum bandwidth to reliably avoid oscillation on ILoop as a result of the reactance/impedance of the external loop components.

In the present devices systems and methods, a second current source or current controller (sometimes referred to herein and/or in the figures as current controller 2) is used to provide current to a power converter such as a switch mode power supply. To leverage the capabilities of the first current controller to achieve the resolution required of the current loop requires that the amplitude of components of I2 be restricted in accordance with the frequency dependent I2 rejection capabilities of the first current controller. In a number of embodiments hereof, the second current controller is a high bandwidth current controller, having a bandwidth greater than the (and typically significantly greater than) the first current controller.

Figure 2A:
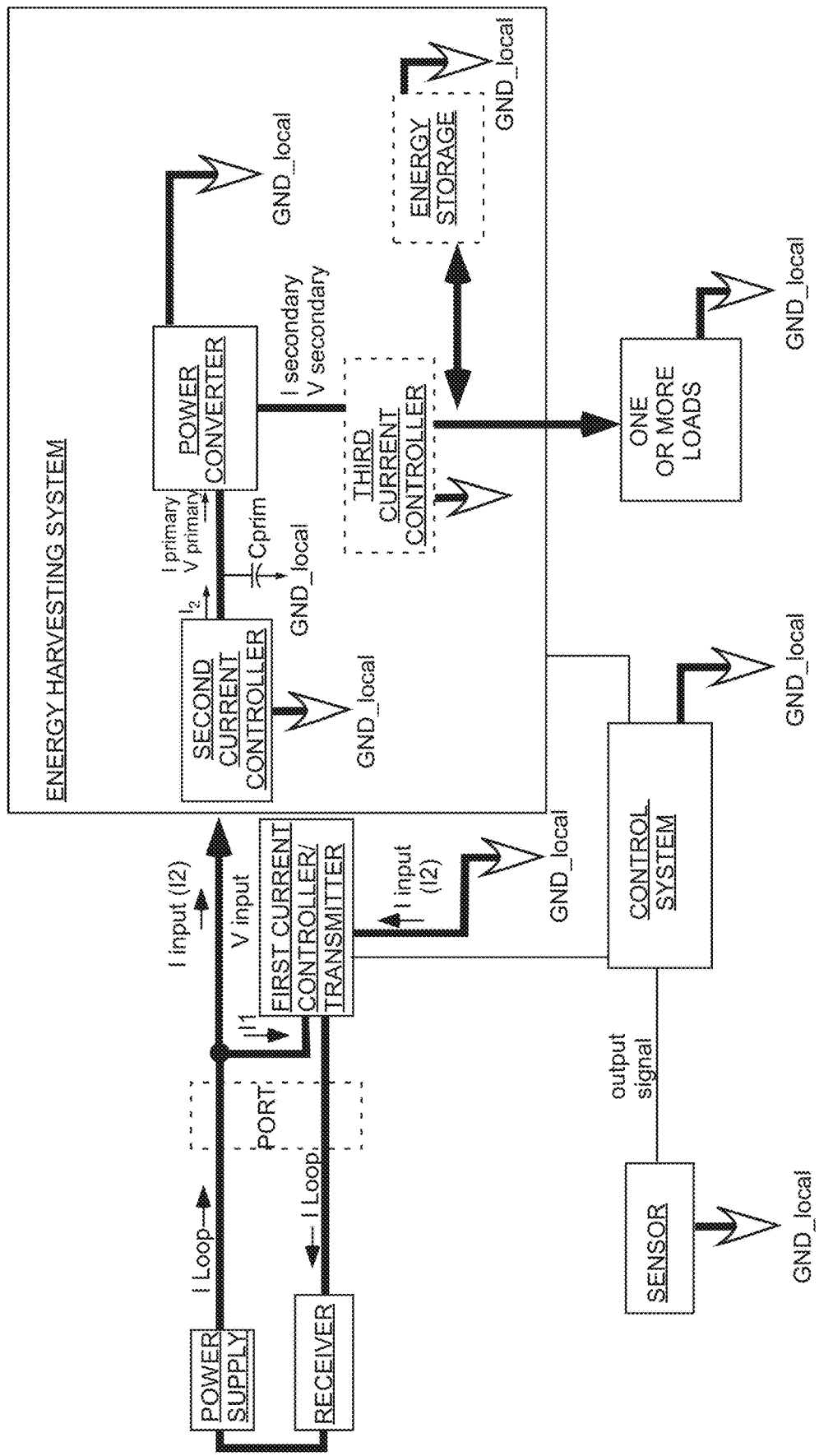
FIG. 2A illustrates a high-level block diagram of a representative embodiment of a 2-wire current loop hereof including an energy harvesting system in which sources of variability or noise in the current on the loop are restricted.
Figure 2B:
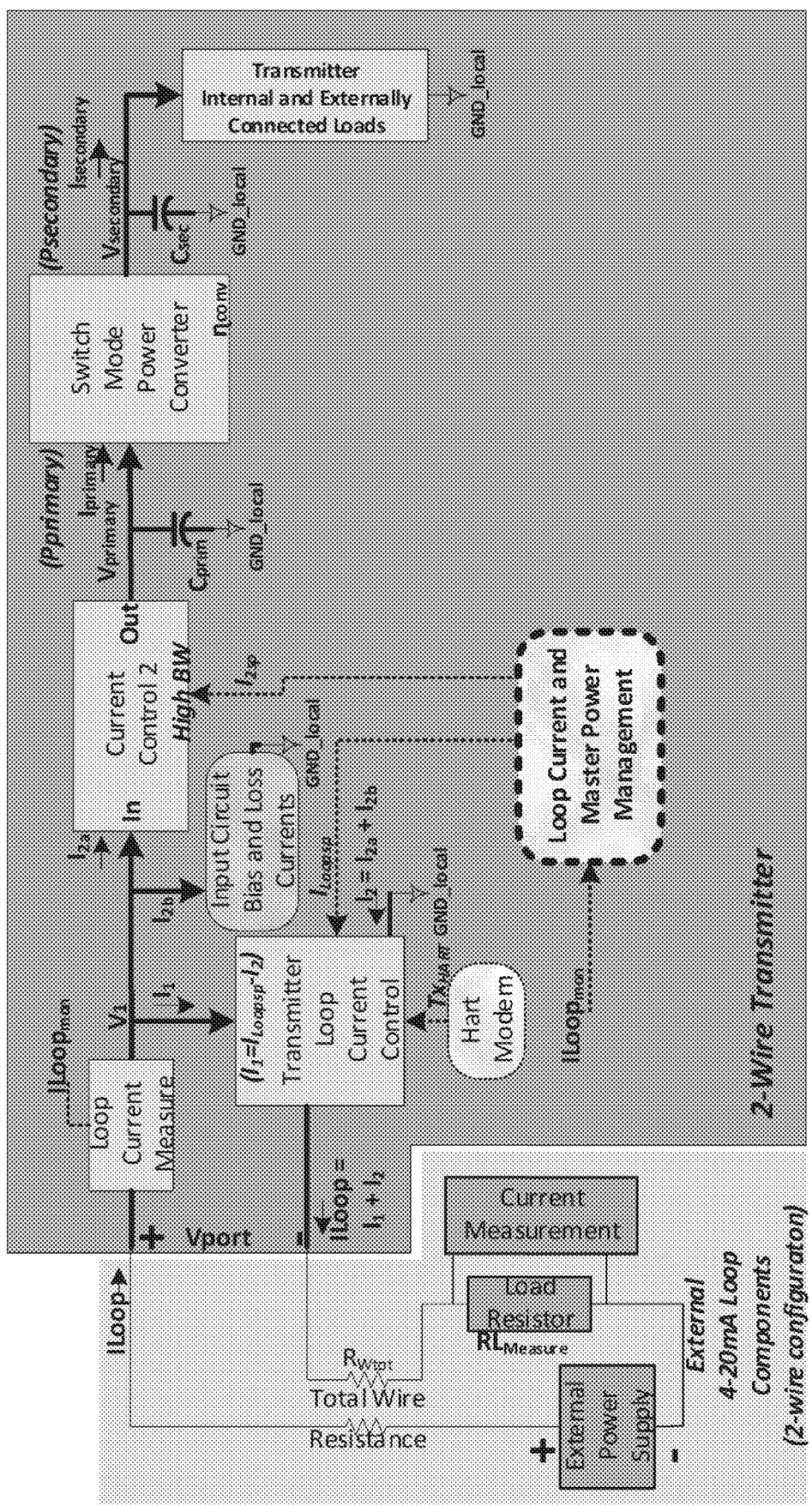
FIG. 2B illustrates a more detailed block diagram of a representative embodiment of a 2-wire current loop hereof including a second current controller in parallel electrical connection with a first current controller (that is, the main loop current controller of a current loop transmitter) and with a power converter in which sources of variability or noise in the current on the loop are restricted.
Figure 2C:
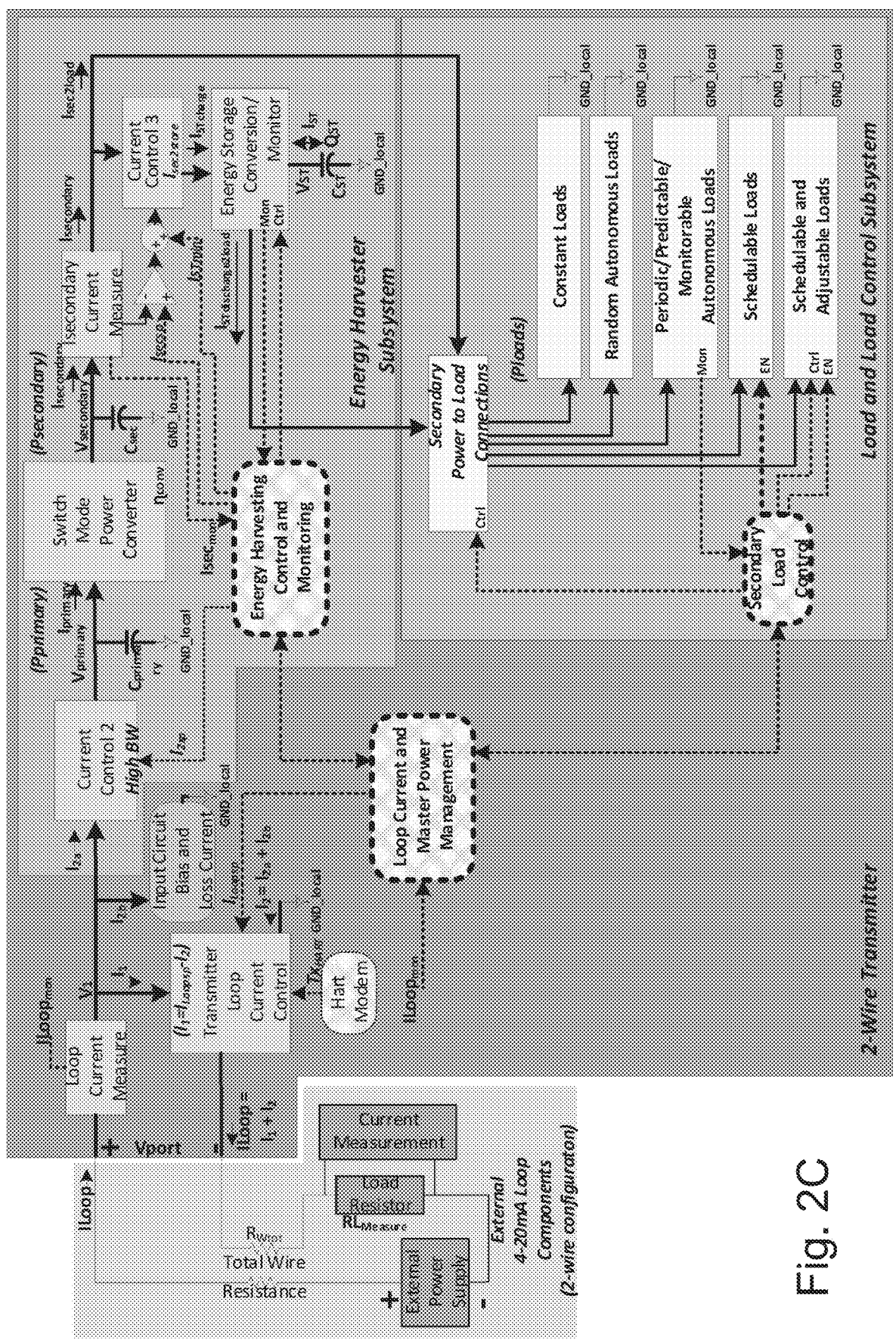
FIG. 2C illustrates a more detailed block diagram of a representative embodiment of a 2-wire current loop hereof including an energy harvesting system further including an energy storage system and a third current controller to control Isecondary in which sources of variability or noise in the current on the loop are restricted.

The second current controller, which, as illustrated in FIGS. 2A through 2C, is in parallel electrical connection with the first current controller and effectively takes control of the loop current. The second current controller provides or allocates the remainder of the loop current to other circuit elements. The second current controller cannot be in series with the first current controller as the current therethrough would be same. Further, it is not possible to vary bandwidth with devices in series because the combination thereof will have the bandwidth of the lower bandwidth device (that is, the bandwidth of the first current controller in this case).

The second current controller exerts control in driving I2 such that the noise in the current I2 returned to the first current controller is within the bandwidth of the first current controller. The first current controller can thus adequately control I1 in a manner to satisfy the resolution constraints of the current loop. In a number of representative embodiments discussed herein, the second current (or main/loop) controller is discussed as a circuit component separate from the power converter. However, one skilled in the art will appreciate that the second current controller may be integrated into the power converter.

In operation of the devices, systems and methods hereof, the second current controller draws a determined portion of the signal or loop current. Because the second current controller has high bandwidth, it can fundamentally control the portion of the current transmitted to power converter and allocate the remainder to the first current controller and losses in current loop. The second controller does not function as a current limiter to restrict varying currents drawn by any circuit or load connected to its output to a maximum limit. To the contrary, the second controller actively drives I2 current in accordance with the setpoint sent by the processor system/controller to arbitrate the portion of ILoop pushed to the energy harvesting circuitry and allocate the portion of ILoop reserved for the first controller, providing sufficient margin for the first controller to control ILoop.

Unlike the first current controller, which must employ limited bandwidth to guarantee stability, the second current controller need only close upon its own fixed internal feedback. The second current controller can thus have a very wide bandwidth, which provides very stringent and precise control over the current drawn from the loop (I2). Through substitution and manipulation of Maxwell's fourth equation (also known as Ampere's law—see FIG. 3A), one may derive an expression of Kirchoff's current law that mandates that the sum of all currents entering and leaving a closed surface are equal to the time rate of charge accumulated inside that surface. In the operation of devices, systems and methods hereof, the time rate of accumulated charge (−dQ/dt) of circuits supplied by the second current controller is negligible. Thus, as expressed by Kirchoff's current law, the sum of the current I2 and the current returned to local circuit ground (GND_local in the illustrated embodiments) by all circuits supplied by the second current controller must be zero. Therefore, the current returned on the local circuit ground to the main loop controller from circuits supplied by the second current controller must equal I2. This concept is illustrated schematically in FIG. 3B by the I2 current entering the closed surface drawn around all circuits (indicated by the dashed line) supplied by the second current controller (including the power converter and all circuits supplied by the power converter) is the same I2 current that is returned on GND_local. Stated simply, the current I2, which is drawn through second current controller from the current loop, is returned to the first current controller via the local ground. In other words, the sum of all currents returned to the first current controller from circuits supplied by the second current controller must sum to I2 under Kirchoff's current law and more generally under Maxwell's law. Because of the high bandwidth and control capability of the second current controller, the I2 current supplied to the power converter primary is very low noise. By the relationship imposed by Kirchoff's current law, the current returned to the first current controller is thus also very low noise. In a number of embodiments, the high bandwidth, second current controller is capable of modulating a pass transistor (MFet_I2 in FIG. 3B) over the bandwidth of the second current controller to deliver a low noise I2 to a power converter despite the harmonics drawn by a power converter. The second current controller thereby prevents the noise that would otherwise be associated with power conversion from being returned to the first current controller/current loop. Once again, any noise returned is at a level suitable to retain the resolution required of the two-wire current loop. The bandwidth of second current controller extends to frequencies significantly higher than the first current controller, that is, to frequencies wherein the noise from the power converter occurs. The second current controller modulates its circuitry to maintain low noise current I2 at the commanded setpoint so that the current returned to the first current controller from the power converter and other elements beyond the second current controller is also low noise and does not contain the noise from the power converter and other elements beyond the second current controller. As described above, the first control controller ceases to be able to control the loop current when the return current includes noise beyond its limited bandwidth.

In a number of embodiments, the noise in ILoop, which is a combination of noise in I2 and I1, is less than the resolution to retain the capability to communicate high resolution information on the loop. In a number of embodiments, the devices, systems and methods hereof restrict noise (or maintain noise sufficiently low) in I2 such that noise in ILoop is less than a predetermined threshold (for example, the resolution of the sensor or ½ the resolution of the sensor).

Figure 3B:
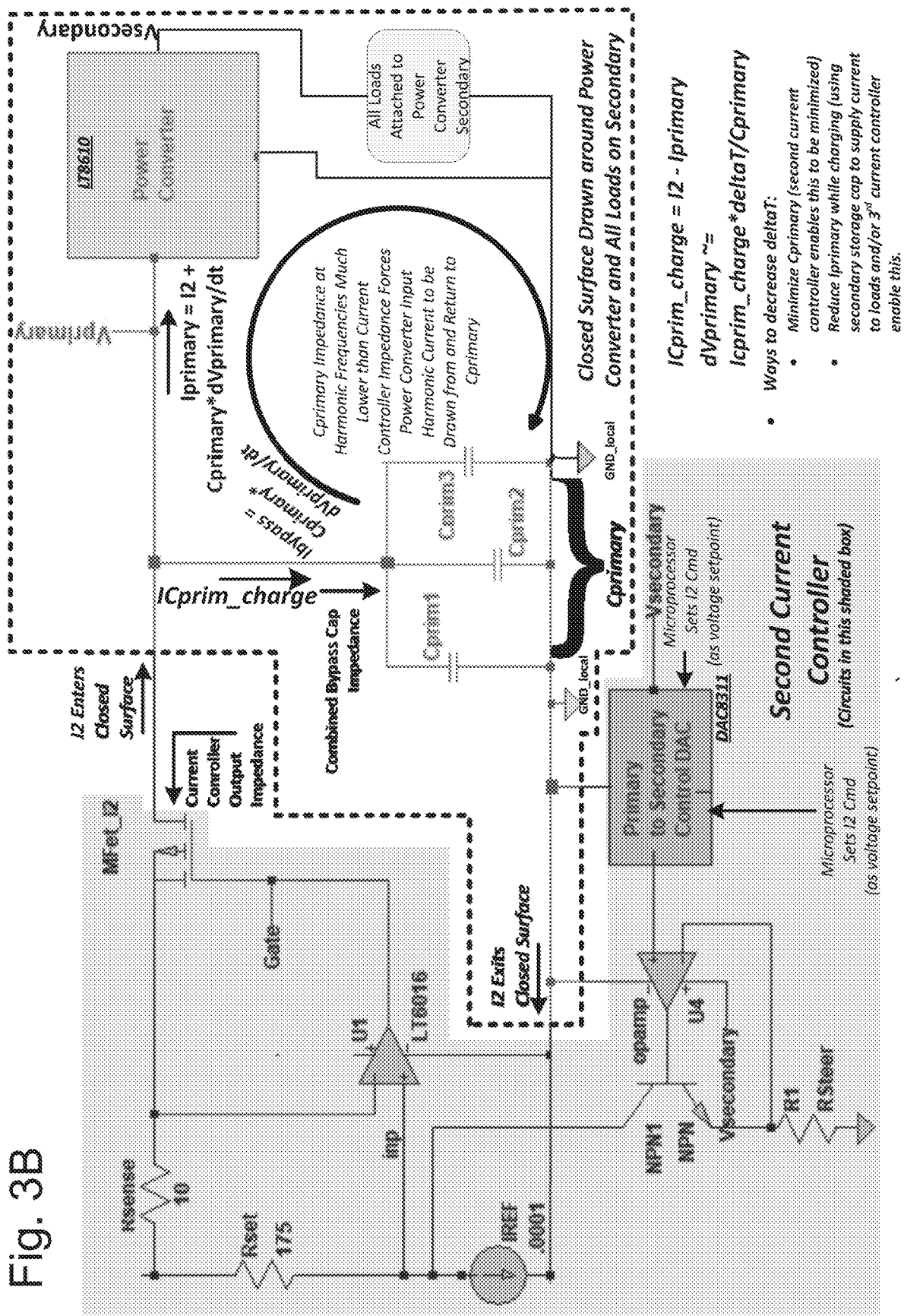
FIG. 3B illustrates an embodiment of a second current controller and a power converter hereof, identifying currents and impedances referenced in FIG. 3C, and identifies impacts of the second and third current controllers on capacitor size (capacity) and transient charging of the power converter primary capacitors.
Figure 3C:
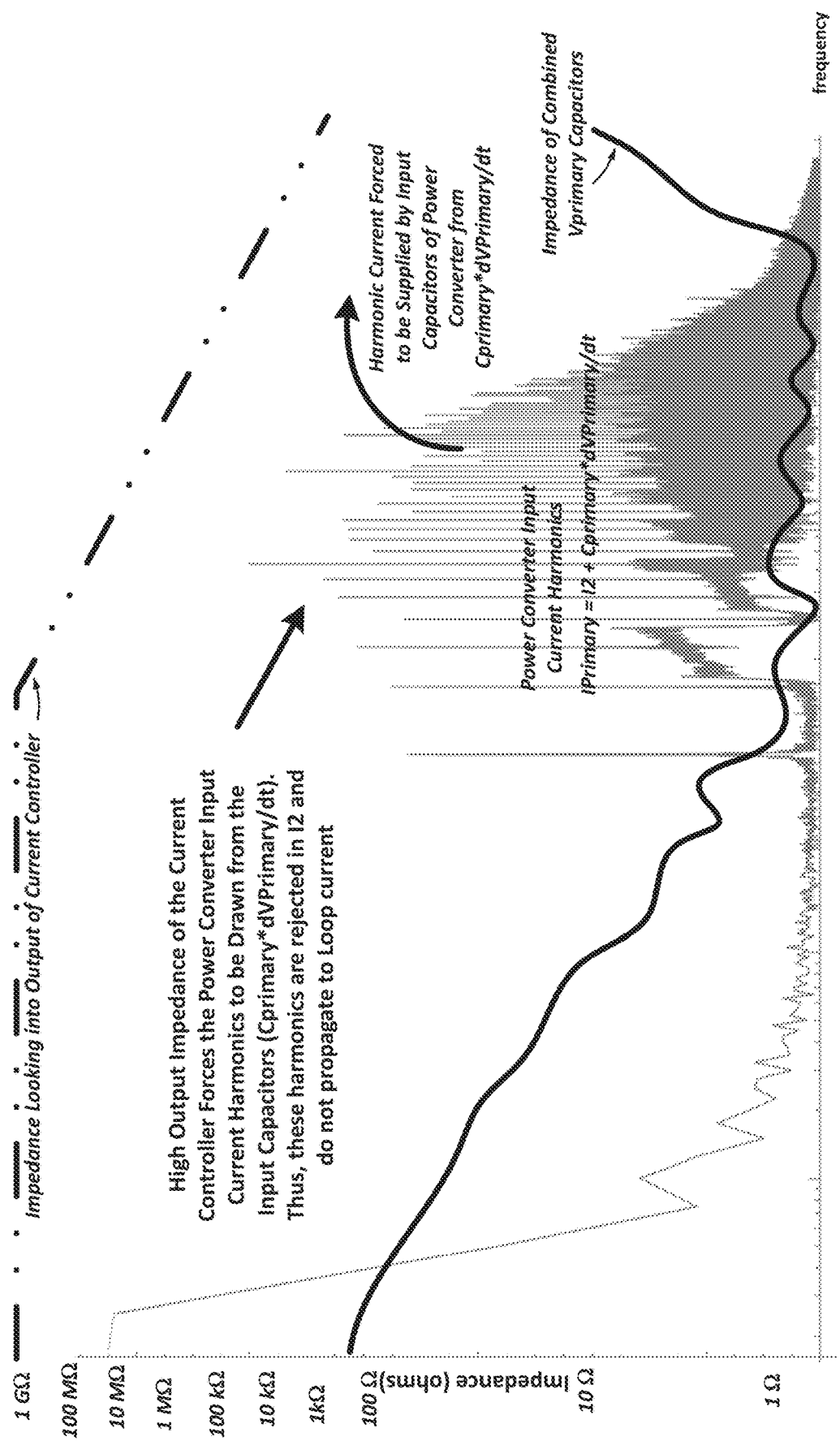
FIG. 3C illustrates the role of the high bandwidth second current controller with high output impedance in forcing the harmonic current drawn by the power converter primary to be drawn from the primary bypass capacitors, thereby attenuating and rejecting such harmonics from being returned to the low bandwidth first controller (loop controller).

The current I2 drawn from the current loop by the second controller may, for example, be set to maintain the input requirements of the power converter input current and voltage, Iprimary and Vprimary, respectively (wherein, Vprimary is controlled via control of Iprimary). A setpoint (for example, 2 milliamp DC) for I2 to be drawn from the current loop by the second current controller can be maintained regardless of disturbances that extend to a high frequency. The high bandwidth of the second current controller may be combined with a high output impedance thereof in maintaining low noise in current I2 regardless of the noise in current being drawn therefrom by the power converter. In representative embodiments, the first current controller may, for example, have a first bandwidth of ten kilohertz, while the second current controller may, for example, have a second bandwidth of ten megahertz or higher. The second current controller forces input current harmonics drawn by the power converter that reside in the frequency band (bounded on the lower end by the maximum frequency generated by the step size and rate of setpoint changes applied to the controller and at the upper end by the maximum bandwidth of the controller) to be drawn from the input bypass capacitance of the power converter. For harmonics above the maximum bandwidth of the second current controller, the input bypass for the power converter may be designed so that the impedance of the bypass appears sufficiently low compared to the impedance looking into the output of the second current controller such that harmonics in this band are drawn from the input bypass and are suppressed sufficiently through the second current controller (such that the residual current noise passed back to the first current controller falls is sufficiently low to meet required resolution of the loop current). The alignment of second controller output impedance and input bypass capacitance with power converter input current harmonics for a representative embodiment hereof are illustrated in FIG. 3B. The effect of the high bandwidth and high impedance output of the second controller and the complimentary role of the low impedance bypass in the isolation and circulation of harmonic current drawn from and returned to the power converter input bypass capacitance (Cprimary*dVPrimary/dt) is illustrated in FIG. 3C. In a number of embodiments, the impedance looking into the output of second current controller is significantly greater than the impedance of the input bypass capacitance (for example, 5, 10, 100, or 1000 times greater). As illustrated in FIG. 3C, the impedance looking into the output of second current controller may, for example, be greater than 1 kΩ and range to 1 GΩ over the frequency range of operation.

As an added benefit, the current noise suppression bandwidth of the second current controller relaxes the lower frequency impedance requirement that would otherwise be imposed on the composite passive bypass components connected to the input of the power converter. This provides opportunity to eliminate or reduce the size of these bypass components, which tend to be physically larger at lower frequencies than at the higher frequencies beyond the bandwidth of the second current controller. The capability afforded by the second current controller to reduce capacitance at the input to the power converter enables significant improvement in maintaining optimal operating voltage at the power converter primary as the control setpoint for I2 is varied to remain at the minimum required margin below Iloop as Iloop is varied. The capability to reduce the power converter input capacitance is most significant when Iloop changes from a higher current with lower voltage across the 2-wire port terminals to a lower current with higher voltage across the 2-wire port terminals. Prior to the change in Iloop, the voltage Vprimary at the power converter input must be at a lower value (less than Vport at the 2-wire terminals). As Iloop is decreased and Vport rises, the Vprimary voltage at the input to the power converter must be charged (increased) to transfer available power to the input of the converter. However, since I2 is constrained to be less than Iloop, the I2 current charging the power converter input capacitance is limited. Referring to FIG. 3B, the time (deltaT) required to raise the voltage by an incremental amount (deltaVprimary) at the input to the power converter is proportional to deltaT (deltaT≈deltaVprimary*Cprimary/(I2−Iprimary). Cprimary is the total combined parallel capacitance at the input to the power converter and Iprimary is the average current drawn into the power converter over interval deltaT. Thus, the opportunity afforded by the second current controller to reduce Cprimary provides significant benefit in improving the Cprimary charging time (deltaT) and enabling faster recovery and utilization of available power by the power converter when Iloop modulates from high to low current.

Figure 4:
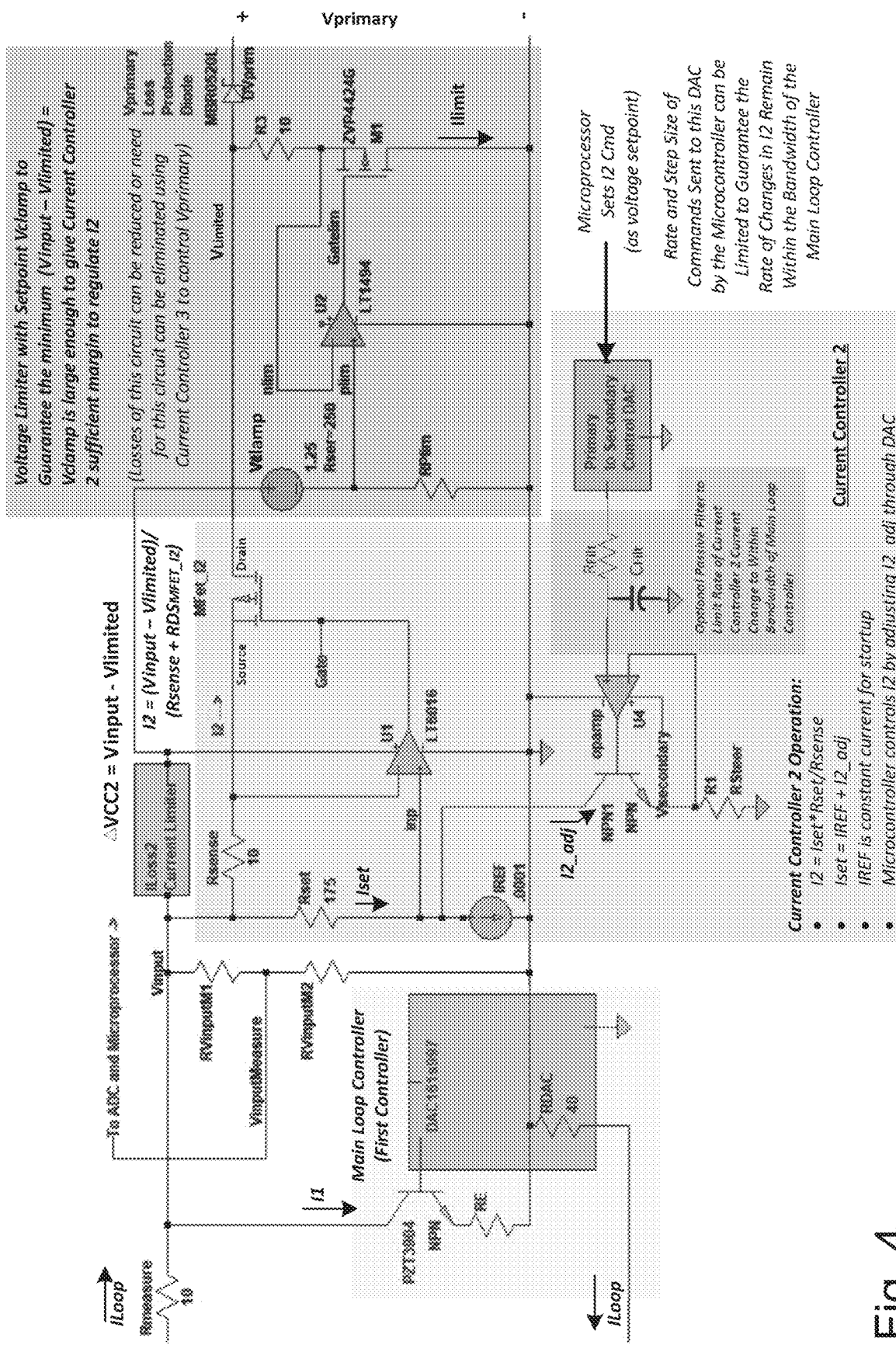
FIG. 4 illustrates an embodiment of a system here of where the setpoint control of the second current controller uses an analog filter to restrict the rate of change of the setpoint to within the bandwidth capabilities of the first controller.

In a number of embodiments, the control system hereof (for example, including one or more processors and one or more associated memory systems in communicative connection therewith) sets a setpoint for the current to be drawn from the two-wire current loop by the second current controller. The setpoint for the second current controller may, for example, be fixed or slowly varying. Because the second controller has much higher bandwidth than the first controller, the second controller is capable of making changes to I2 (in response to changes in second controller setpoint) faster than the first controller can react to and compensate to maintain the ILoop setpoint. In a number of embodiments, the processor system limits the rate and magnitude of adjustments to the second controller setpoint so that the rate of change in second controller setpoint falls within the rate of response capability of the first controller to adjust I1 to maintain ILoop within the noise limit goal for ILoop. The setpoint of the second controller may, for example, be controlled in concert with changes made to the first controller setpoint when modifying ILoop such that the rate and magnitude of changes in I2 in response to changes in the second controller setpoint result in a targeted allocation tolerance for the range and rate of I1 drawn by the first controller to reach and maintain the ILoop setpoint. In a number of embodiments, the rate and magnitude of changes to the setpoint for the second current controller is limited so that the rate and magnitude of corresponding changes in I2 remain within the bandwidth capabilities of the first controller. In a number of embodiments, the setpoint control of the second current controller uses an analog filter to restrict the rate of change of the setpoint to within the bandwidth capabilities of the first controller as illustrated in FIG. 4.

In general, it is necessary to maintain a minimum allocation of ILoop current to I1 to allow for things like digital communications modulation and variances in leakage currents prior to the second controller that are returned to the local ground. In a number of embodiments, when maintaining a minimum allocation, the sequencing of ILoop setpoints and the second controller setpoints may be important. For example, when the ILoop setpoint decreases, the setpoint of the second controller may be reduced prior to reducing the ILoop setpoint. For rising changes in ILoop, the ILoop setpoint change may precede any increase in the second current controller setpoint.

The bandwidth and output impedance requirements of the second current controller relate back to or are determined by the bandwidth of input transients generated by the power converter device. In that regard, there is a fundamental frequency of the power converter. Moreover, harmonics arise based on switching frequency and primary current pulse shape and duration. The bandwidth of these harmonics is based on rise time, pulse width and pulse shape. Once again, the bandwidth and output impedance of the second current controller are suitable to resist the noise in the current drawn by the power converter. As described further below, the system hereof may provide control the operational regions of the power converter to maintain the noise created thereby within predetermined or known bounds. In that regard, the systems hereof may control the operation of the power converter (for example, via control of the input or primary current and voltage as well as the output or secondary current) so that noise created by the power converter stays within bounds.

The first current controller regulates the current in the loop (to be equal to the signal current) by drawings or pulling current I1. The control system establishes an internal set point for the signal current based on the sensor signal for the first current controller. The control system also establishes a second set point (I2sp) for the second current controller. The control system determines the current setpoint of the second controller based upon the current loop set point in addition to either budgeted or measured current losses occurring between the 4-20 mA terminals and the second current controller (Iloss). The second set point establishes the current I2 drawn from the current loop and returned to the first current controller. The second current controller allocates what is left of the loop set point (that is, the 4-20 mA setpoint) to the first current controller and Iloss. The control system sets the second set point as a determined amount of the first or loop current set point. The difference between the first set point and the second set point and Iloss is the amount of current that is allocated to the first current controller to control the loop or signal current. The current I1 must be greater than 0 and, in a number of representative embodiments, greater than approximately 0.5 milliamp because of overhead (for example, a Hart modem). To meet this constraint, the second controller setpoint for I2 must not exceed the limit (I2setpoint<=Iloopsetpoint−I1min−Ilossmax, where I1min is the minimum current allocated to I1 and Ilossmax is the maximum measured or allocated current for Iloss.

The second current controller thus may be considered to be a primary or principal current control component. The second current controller pulls or draws in a set amount of available current. Because of the higher bandwidth of the second current controller and the manner in which the system is configured, the second current controller controls the amount of current that can be used in the first current controller. The first current controller sets I1, but the second current controller sets 12.

In a number of embodiments, the devices, systems and methods hereof enable operation of high bandwidth and high pulse mode loads in connection with a current loop, while restricting or limiting noise on the current loop to achieve a desired resolution. High transient power demands and high resolution current control are achieved at the same time.

In a number of embodiments of systems hereof, excess energy (that is, energy in excess of that required by the one or more loads to be powered from energy harvested from the current loop) from the power converter is stored in an energy storage system which may, for example, include one or more high capacity capacitors (sometimes referred to as supercapacitors, supercaps, or ultracapacitors). As known in the electrical arts, supercapacitors may, for example, use electrostatic double-layer capacitance and electrochemical pseudocapacitance. Energy storage is, for example, very useful in cases when the energy/power requirements of the load(s) in electrical connection with the secondary side of the power converter exceed the energy output of the power converter. For example, the instantaneous power requirements of a pulse-operated and/or other device may exceed the instantaneous power available from the power converter. Energy harvesting and storage provides a strategy for dealing with circumstances in which the instantaneous power required by the load(s) exceeds what is available from the power converter. In cases wherein secondary energy exceeds that required by the load, energy may be transferred to the energy storage system.

Figure 5:
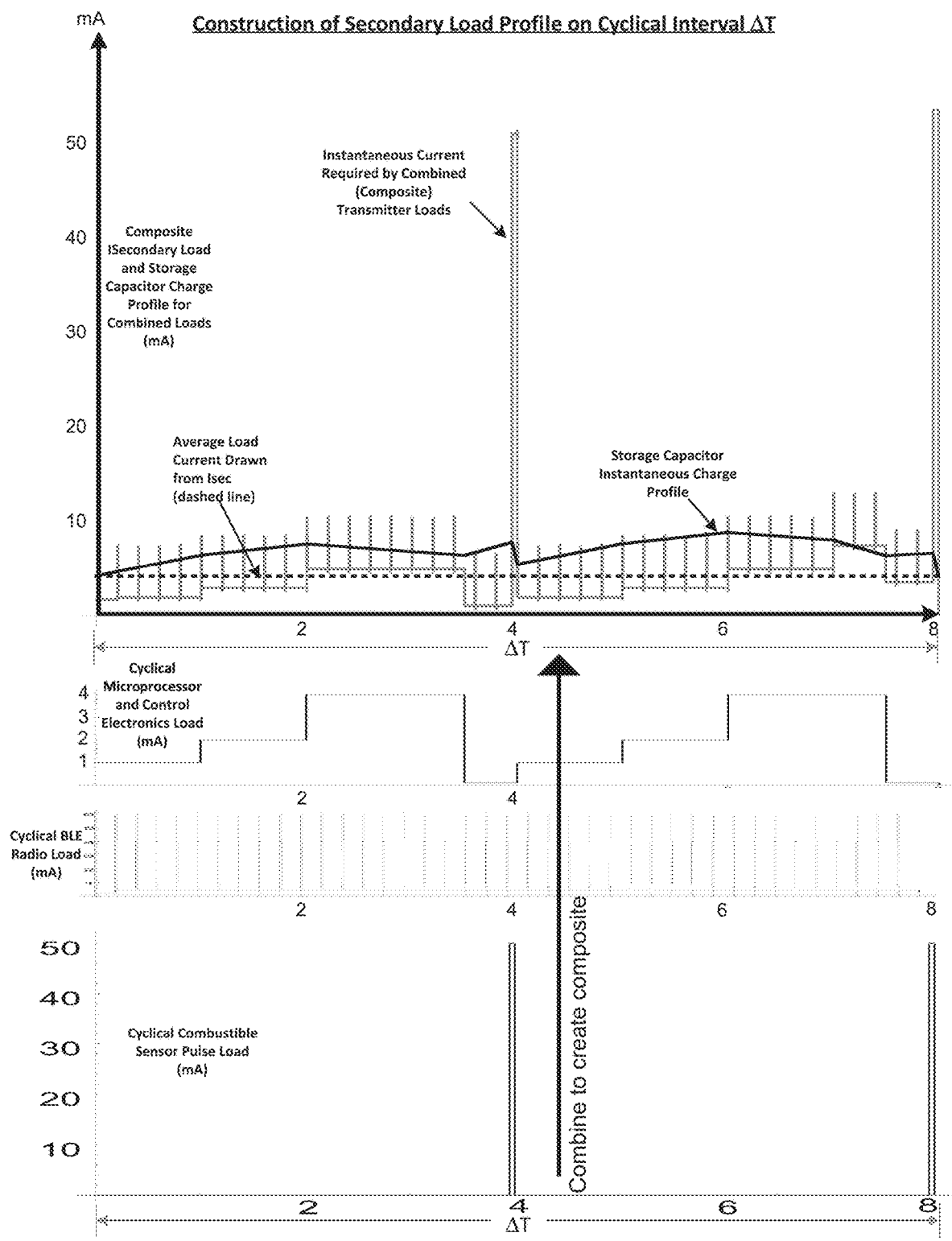
FIG. 5 illustrates load profiles which are combined into a composite secondary load profile to determine an overall energy use profile.

Given, for example, parameters such as predicted range of power available from the current loop port, the efficiency of the power converter and predicted load requirements, one may determine energy storage requirements for a given load schedule. In general, one may design all circuits/loads to use as little power as possible. Each load device has a predeterminable energy usage profile. Cycles and sequences of loads for a composite energy usage profile may be determined. As illustrated in FIG. 5 (in which load profiles for a microprocesser and control electronics, a BLUETOOTH lower energy communication device and a combustible gas sensor are combined into a composite secondary load profile), one may, for example, compile such cycles and sequences of loads to determine an overall energy use profile. Different profiles may be constructed to enact distinct functions or modes of operation. For example, separate load sequencing profiles may be constructed for power-up, to enact user commands or separate profiles may be constructed to perform the same group of tasks with tradeoffs to improve or reduce performance at higher or lower required secondary current. Through load scheduling, one may, for example, attempt to make required power remain constant or vary slowly, which reduces the noise that would otherwise be transferred to the power converter primary via sudden changes in converter operation in response to fast transient loads at the converter secondary. Thus, in a number of embodiments of systems hereof, the load system is determined at the time of manufacture of the system. Various modes of operation with various elements/loads drawing power may be predetermined. Power is defined as the rate of producing or consuming energy. Thus, power is energy per unit of time. Power requirements may be determined in time intervals defined by such modes of operation. One may also look at the instantaneous profile, that is look at instantaneous power requirement. The system should be designed to ensure that required power is available. When the instantaneous power usage requirement is, for example, lower than average power available/power converter output, the system may store the excess. When the power requirement exceeds the available power, stored energy may be accessed.

Operating one or more processors of the control system to frequently or constantly monitor energy usage/storage requires significant energy. In developing a strategy to achieve suitable power availability as described above, it is desirable to reduce or minimize the requirement of monitoring by the control system (for example, including one or more microprocessors). Using established principles in the electrical arts, energy storage goals, circuit designs, load scheduling etc. may be used to reduce, minimize or prevent the requirement of monitoring. One may, for example, set targets or set points for different modes of operation, allocating power to storage and/or to load. In a representative mode of operation, energy storage setpoints may, for example, be chosen to achieve a certain level of storage and to not drop below that level.

As described above, the second current controller may, for example, be controlled to draw constant current or to draw current in a slowly varying manner (thereby maintaining low noise). The setpoint of the second current controller establishes primary current available to the power converter and affects the charge current (that is, the second current controller output current and power converter primary input current) supplying the input capacitance of the power converter which, in turn, determines the magnitude and rate of change of the converter input voltage. In general, power converters are designed to regulate a set secondary voltage by pulling and converting power available at the converter input into the secondary current required to maintain the secondary voltage setpoint. In a number of embodiments of systems hereof, the secondary current pulled from the power converter secondary may be controlled via a third current controller in electrical connection with the secondary side of the power converter. Without the third current controller, the current pulled from the secondary of the power converter is determined by demands of the load(s). One may, for example, determine a setpoint or target for the secondary current depending upon, for example, the efficiency of power converter and/or the converter primary voltage and primary current being supplied by the second current controller. As described above, a portion of the drawn current may be directed to the load(s) and a portion of the drawn current may be directed to storage. The difference between the amount of current pulled through the power converter and that being used by the load(s) may be sent to storage. Without control of the secondary current pulled through the power converter, the power converter may pull more power than is available at a given time at its input. It is possible that the instantaneous load demand on the converter secondary may not align with the instantaneous power available at its input in such a manner as to cause the converter to shut down (in the case too much current is drawn from the primary, resulting in the input voltage falling below the converter minimum requirement) or failing to capture needed excess power available at the converter input. Sufficient current must be pulled through the power converter to operate the system and loads thereon. One may save power by pulling less than maximum possible. As loading profiles may be known or determined a priori, one may provide model-based control for developing one or more setpoints for pulling through the secondary current.

As illustrated by the storage capacitor charge profile in FIG. 5, predetermined loading schedules or profiles may, for example, be used to determine the amount of energy storage required. The size of the energy storage system should not be determined in an arbitrarily fashion. If the energy storage system is too large, it may take too long to charge the energy system to an operating point. It is desirable to choose the one or more elements of the energy storage system (for example, supercapacitors) to be of a sufficient size such that the energy system may be charged over reasonable time and all the load requirements may be covered. In general, one may design the energy storage system to cover the worst-case scenario for an energy storage to load requirement. One must provide sufficient capacity to operate the load(s) on the system and sufficient storage to meet instantaneous load requirement. As illustrated in FIG. 3B, supplying secondary loads during transitions of ILoop may be an important consideration in planning the charge capacity and charge/discharge profile for the storage capacitor. The amount of energy directed to storage may be changed for specific load requirements. In general, the system may be designed to deliver sufficient power to whatever load(s) will be attached to the system and to include sufficient storage to, for example, meet short-term, high loads.

Figure 6A:
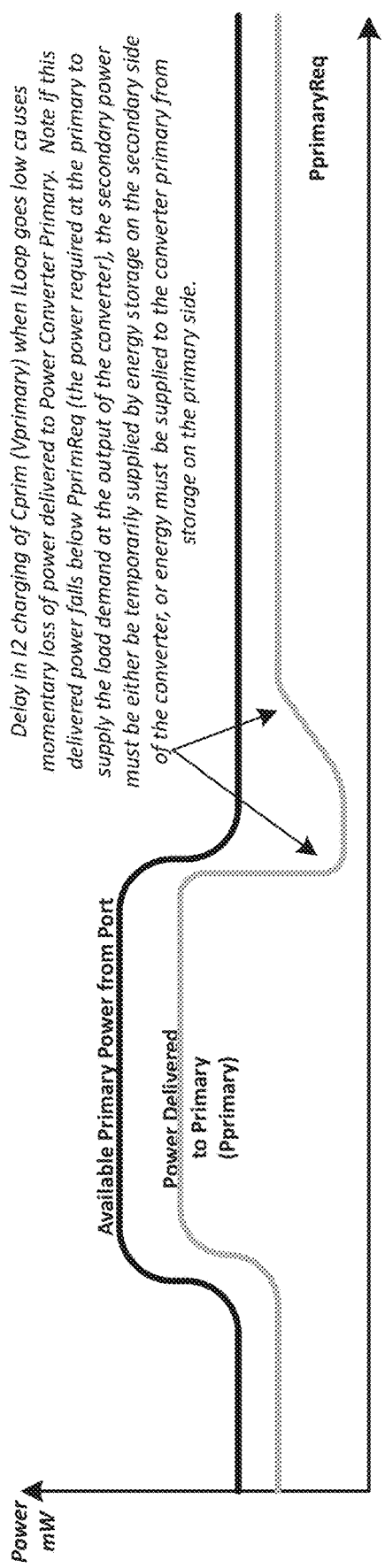
Figure 6B:
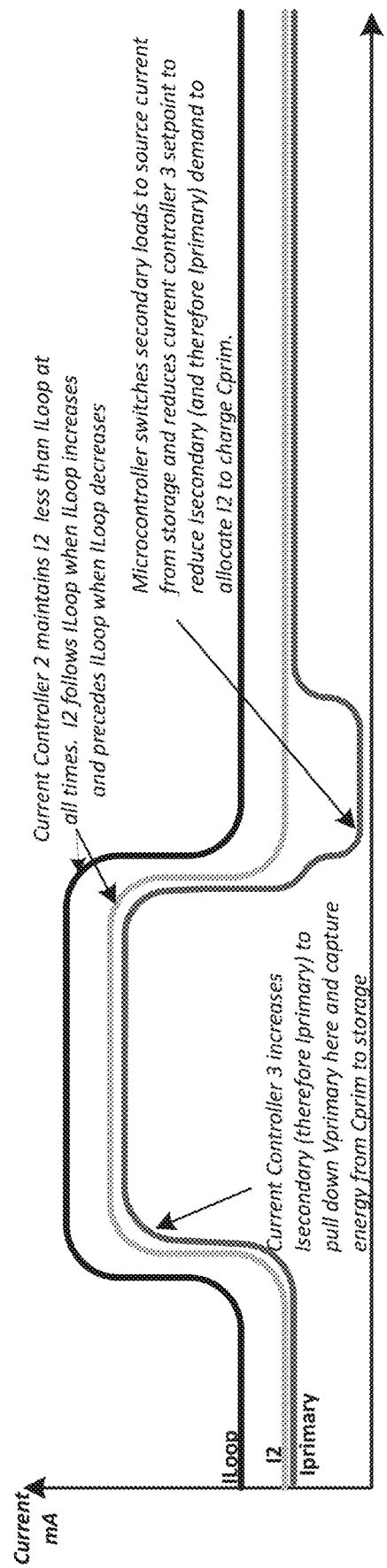
FIG. 6B illustrates the functionality described in connection with FIG. 6A wherein variation in stored charge is shown.
Figure 6C:
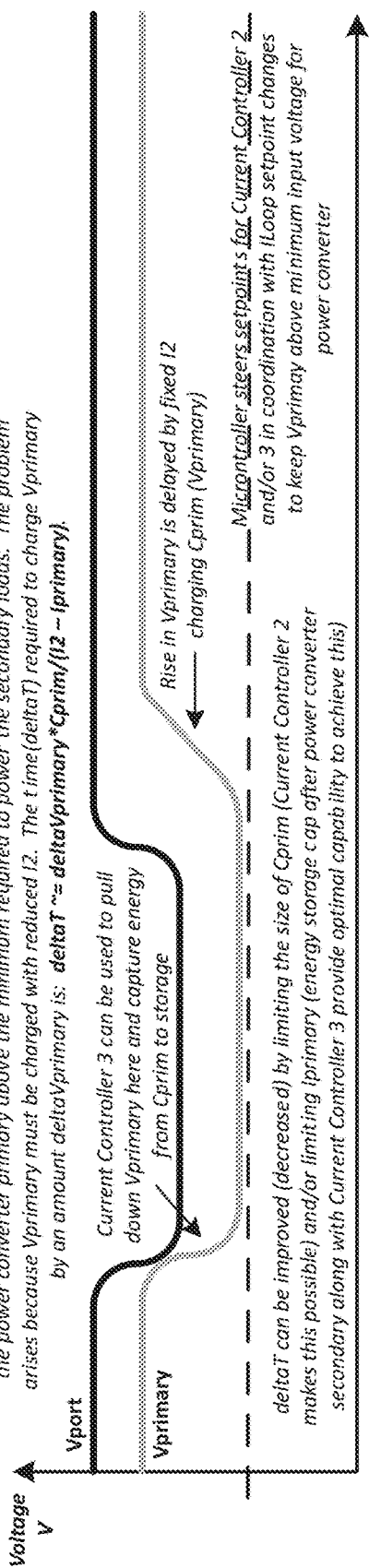
FIG. 6C illustrates the functionality of the third current controller and load switching to increase and decrease the demand on Iprimary (through Isecondary) to both capture excess energy and return it to the loads to make optimal use of available power.
Figure 6D:
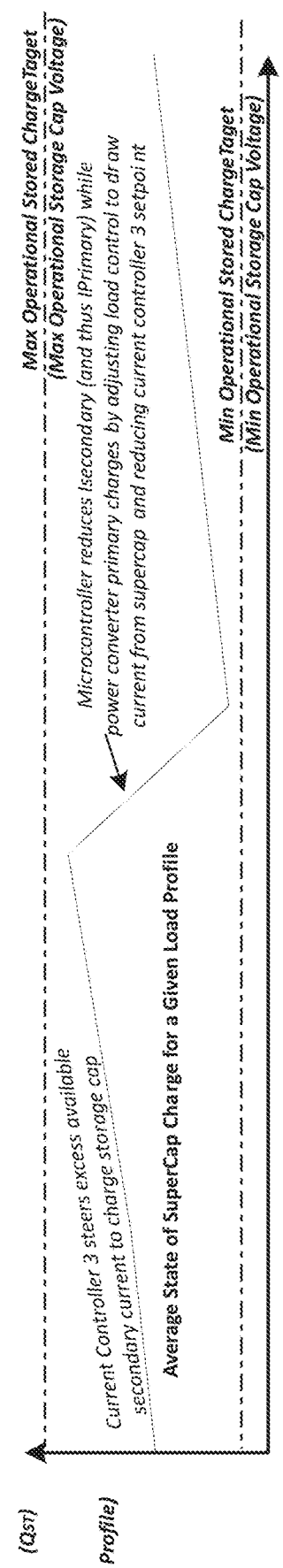
FIG. 6D illustrate the functionality described in connection with FIG. 6A wherein variation in current is shown.
Figure 6E:
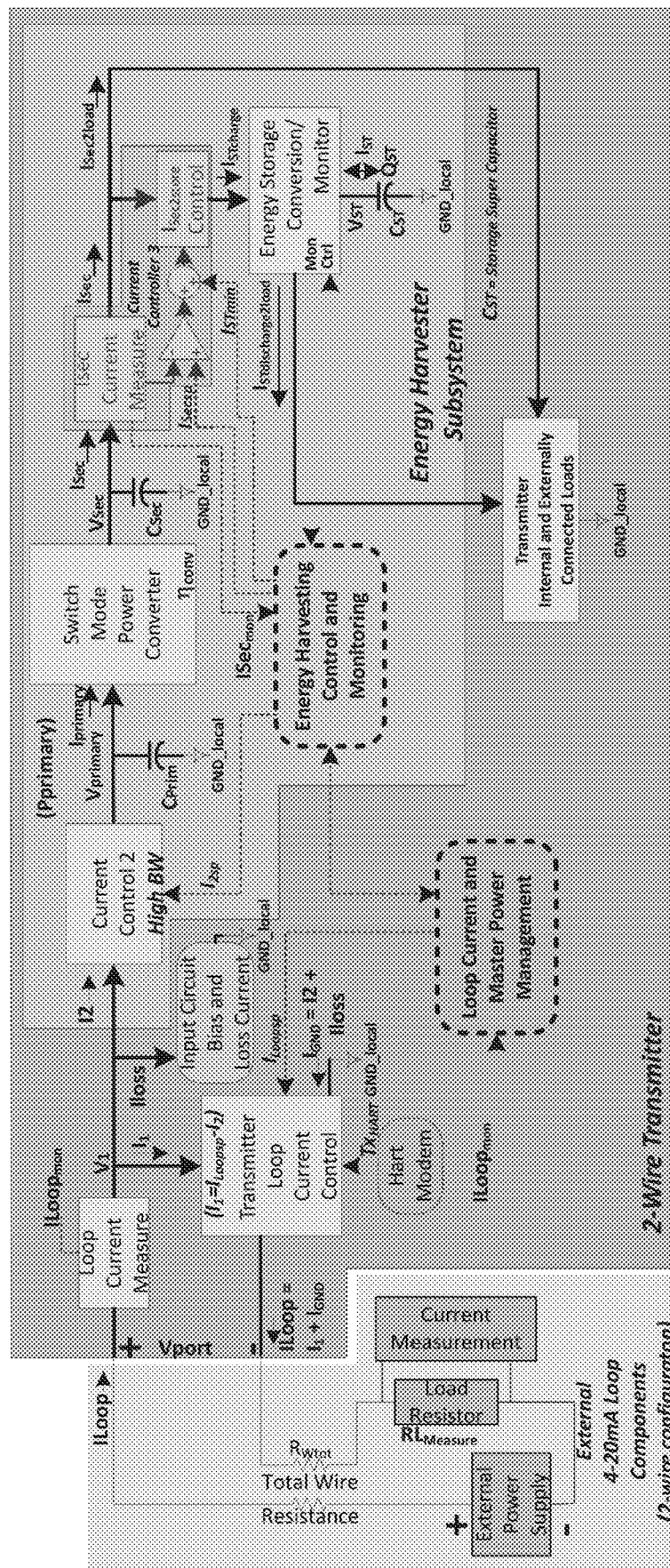
FIG. 6E illustrates a block diagram of the energy harvester in identifying features and variables associated with FIGS. 6A through 6D.

Problematic situations may arise as the loop current ILoop changes with the output of the sensor (see FIGS. 6B and 6C). As described above, loss currents (Iloss) and the current I2 are drawn from the current loop and are returned to the first current controller from all system components via local ground designated GND_local. The loop current may be controlled as a difference or by measuring ILoop. In the case of control as a difference, I1=ILoop setpoint−IGND_local where IGND_local=(I2+Iloss). In the case of using direct measurement of Iloop, Iloop_measured−Iloop setpoint=I1 where Iloop_measured is the measured ILoop which includes I1, I2 and Iloss. The second current controller controls the margin for I1 in either case. In the case of a fixed external voltage supply, when loop current is high, port voltage is low. When current is high on the current loop, and the voltage is low at the port, one will typically have sufficient power at the power converter. However, when the current changes to a low current at the loop port (for example, in a 3 mA fault situation), there is little available current to charge capacitors at the input of the power converter to achieve a suitable operational voltage at the power converter input (see FIG. 6A). This problem may be addressed in several manners.

Figure 7:
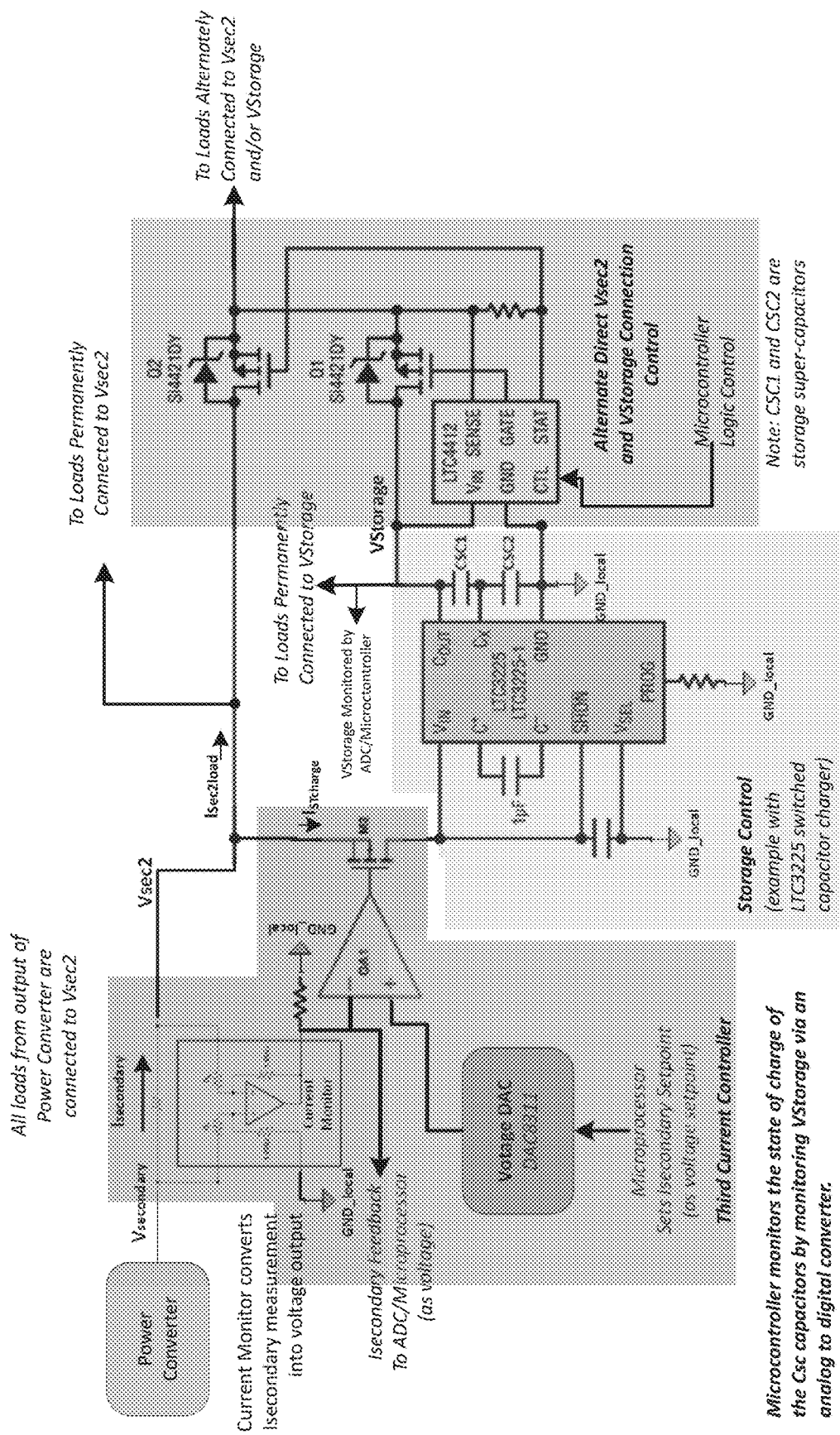
FIG. 7 illustrates an embodiment of a system herein wherein the output of the third current controller is connected to a charge pump that charges storage capacitors.
Figure 8:
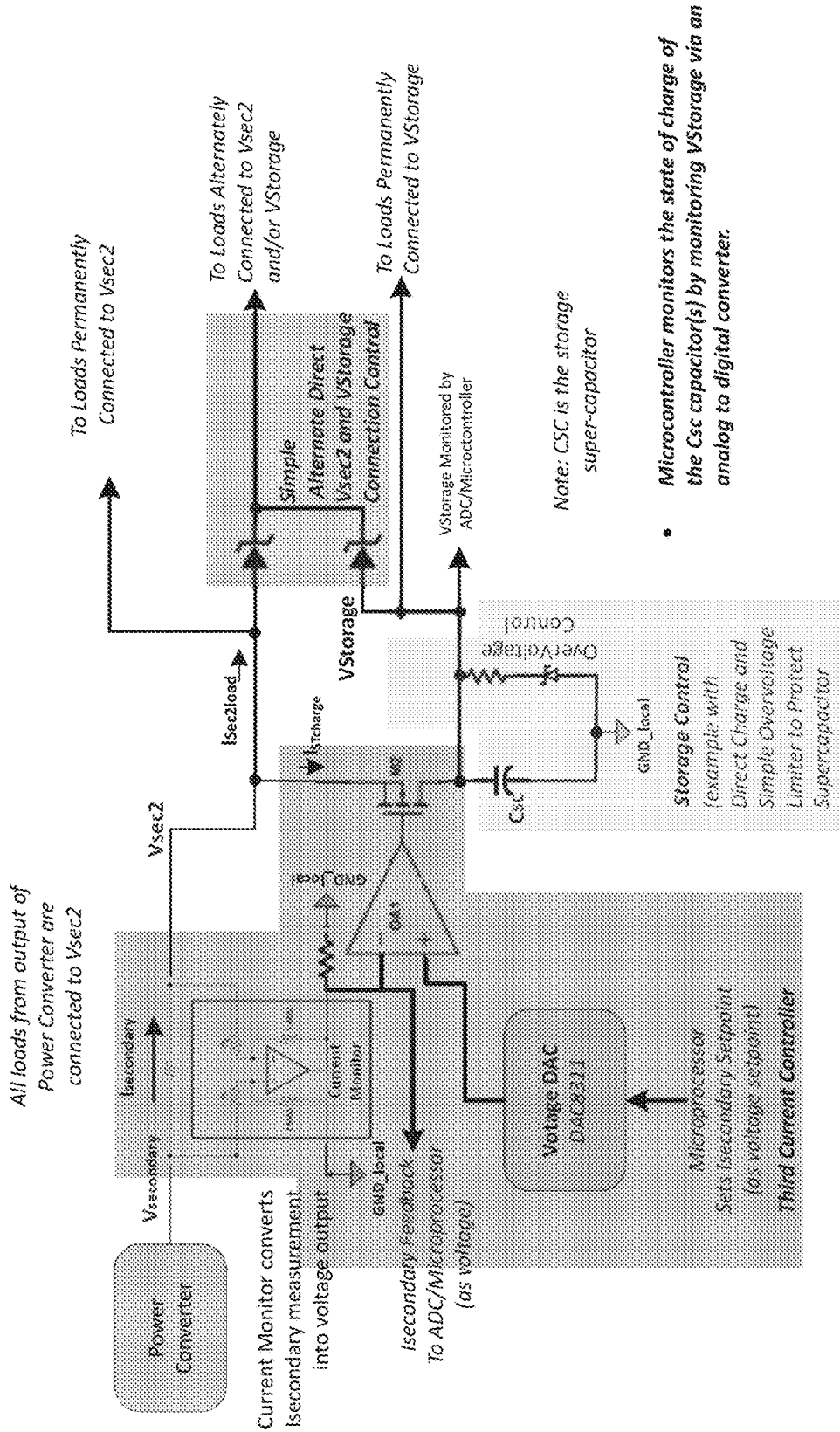
FIG. 8 illustrates an embodiment of a system hereof wherein the output of the third current controller is connected directly to the storage capacitor(s).

In general, the voltage Vprimary at the primary side of the power converter is constrained to be less than port voltage. When the loop current changes from high current to low current, the system must establish a suitable Vprimary, but there is little current available to do so (see FIG. 6C). As described above, there is little current to supply to one or more capacitors at the primary sided of the power converter. Energy storage may be used to alleviate such situations. The system may store energy in the higher loop current modes. Stored energy may be used to power one or more loads connected to the system during lower current modes to provide an opportunity to recharge capacitors at the primary side of the converter. In that regard, the amount of power pulled through the power converter may be decreased, while using the energy storage system on the secondary side of the power converter to (at least partially) power the loads, thereby allowing capacitors on the primary side to charge on the available current. In a number of embodiments, extra power may be pulled through the power converter during high loop current modes to charge the energy storage system connected at the power converter secondary. In a number of embodiments, a third current controller (sometimes referred to herein and/or in the figures as current controller 3) is used to create a load at the power converter secondary to pull the additional power from the power converter primary to charge the energy storage system connected at the power converter secondary. In a number of embodiments, the output of the third current controller is connected to a charge pump that charges storage capacitors as illustrated in FIG. 7). In a number of embodiments, the output of the third current controller may be connected directly to the storage capacitor(s) as illustrated in FIG. 8. One skilled in the art will recognize that the switched mode converter and/or switches in the embodiment of FIG. 8 may be substituted with commercially available integrated circuit super capacitor chargers, monitors and/or supervisors that receive microcontroller instructions to control charging, connection to loads and monitor the state of charge of the super capacitors. In low loop current modes, more power may be discharged from the energy storage system as described above to provide a better power conversion mode for the power converter, reducing Iprimary drawn into the power converter and allocating more I2 current to charge the capacitors (Cprim) at the power converter input to attain a target Vprimary (see FIGS. 6A through 6E). FIGS. 6A through 6E identify impacts of the second and third current controllers on capacitor size (capacity) and transient charging of the power converter primary capacitors. Those figures further illustrate the operation of the first and second current controllers to manage the power converter primary voltage during ILoop transients and the combined action of the third current controller and load switching to increase and decrease the demand on Iprimary (through Isecondary) to both capture excess energy and return it to the loads to make optimal use of available power at the power converter primary and sustain secondary power needs when Pprimary falls below PprimaryReq.

Figure 9:
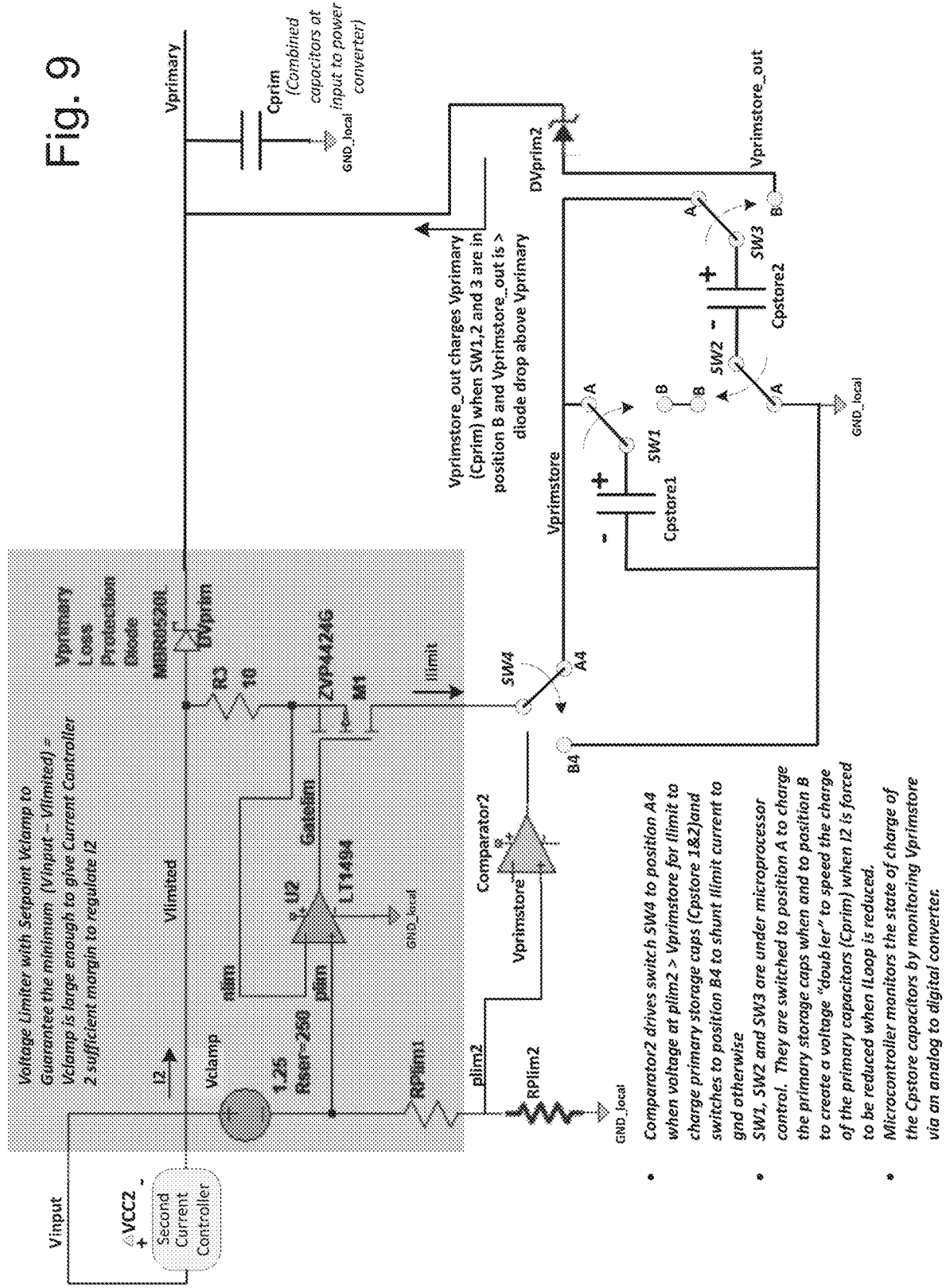
FIG. 9 illustrates an embodiment of a system hereof in which energy storage is provided on the primary side of the power converter (such that the system may direct a portion of the current from the secondary current controller to one or more additional capacitors in parallel with the one or more capacitors at the primary side of the power converter) wherein, while Vprimary is discharging to below Vlimited and I2 is shunted to Ilimit and stored in capacitors Cpstore1 and 2.
Figure 10:
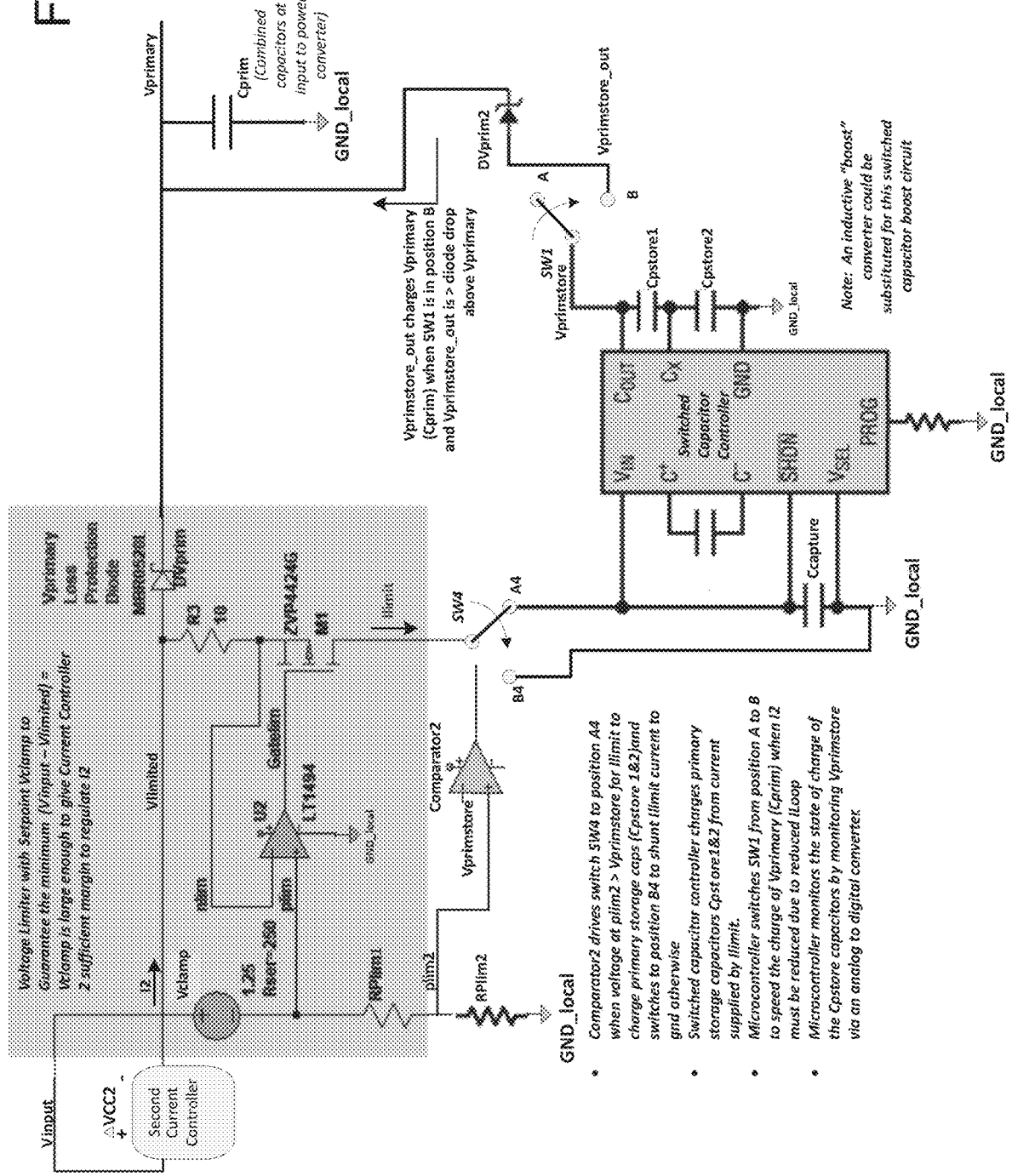
FIG. 10 illustrates an embodiment of a system wherein current is transferred via a boost converter from Ccapture to Cpstore1 and 2.

In a number of embodiments, energy storage may be provided on the primary side of the power converter. While loop current is high, the system may direct a portion of the current from the secondary current controller to one or more additional capacitors in parallel with the one or more capacitors at the primary side of the power converter. In low loop current modes, the additional capacitor(s) may be switched to series connection, and stored current may be drawn therefrom. Two such embodiments that capture the limiting current (Ilimit) of a voltage limiter placed at the output of current controller 2 (to guarantee a minimum required voltage drop $\Delta VCC2$ across the current controller) are illustrated in FIGS. 9 and 10. The voltage limiter sinks current Ilimit when $\Delta VCC2$ approaches or falls below the voltage limiter setpoint (Vclamp). This happens most notably when ILoop transitions from low to high (and the I2 setpoint is correspondingly transitioned from low to high) resulting in a period in which Vlimited is near or below a diode voltage drop below Vprimary. During this transition, while Vprimary is discharging to below Vlimited, I2 is shunted to Ilimit and stored in Cpstore1 and 2 for the embodiment depicted in FIG. 9 and transferred via the boost converter from Ccapture to Cpstore1 and 2 for the embodiment of FIG. 10. The charge stored in Cpstore1 and 2 can be used to provide additional charge current to Cprim to more rapidly raise Vprimay when Iloop transitions from low to high. It may also be possible to feedback current from secondary side of the power converter. However, such feedback would require an inverse converter to push it back to the correct voltage on the primary side of the power converter.

Figure 11A:
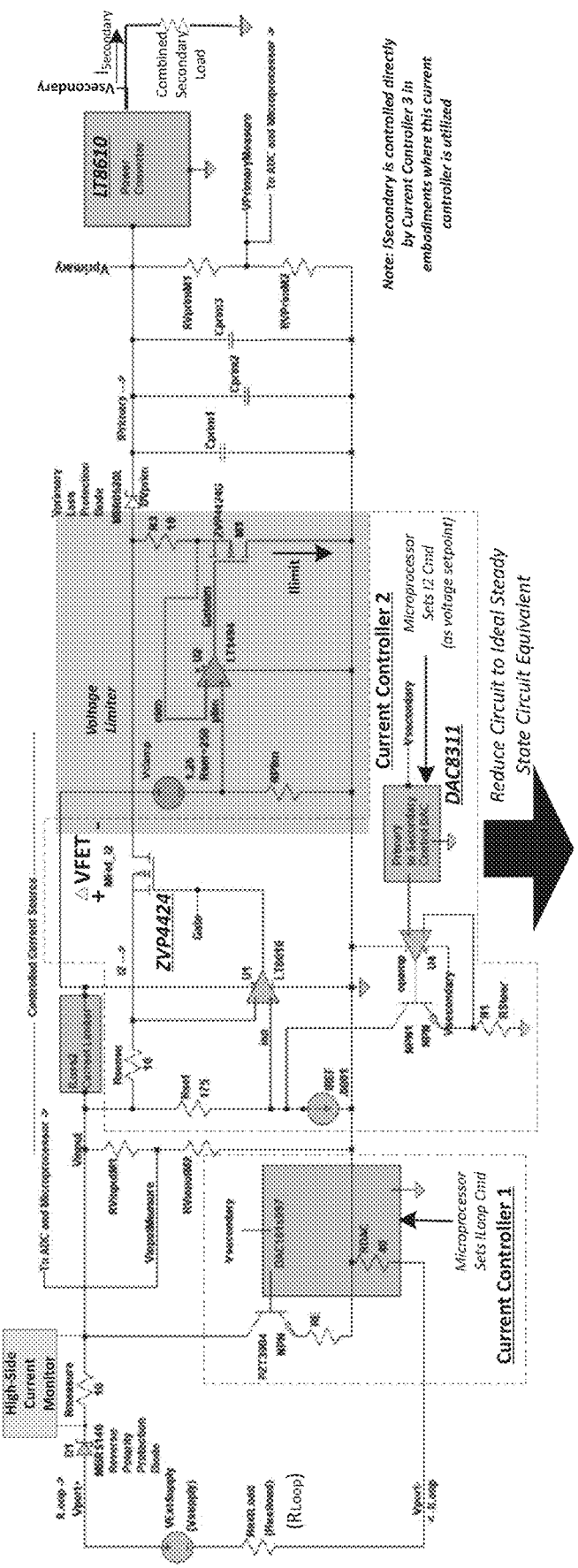
Figure 11B:
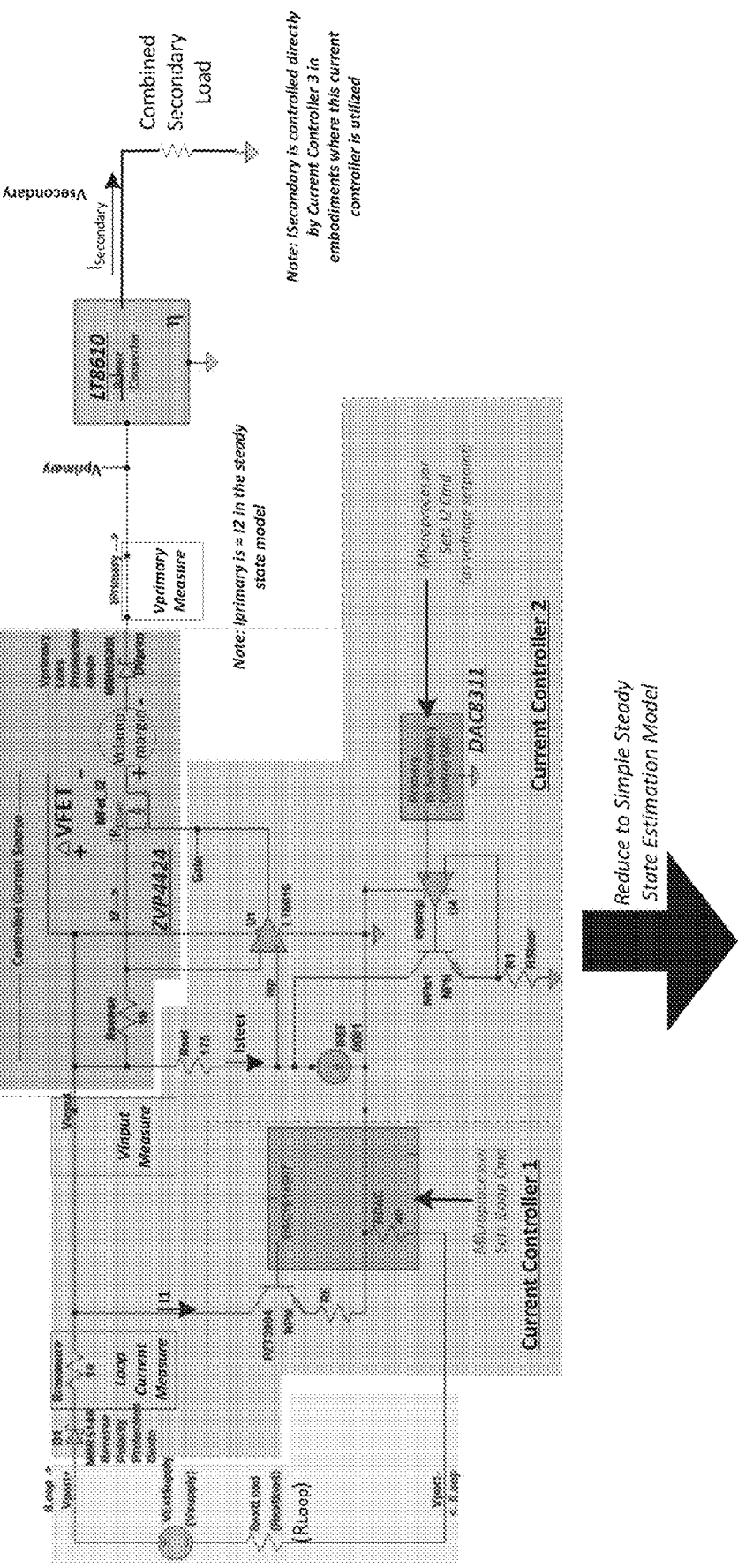
FIG. 11B illustrates an ideal steady state port, primary and power converter circuit model.
Figure 11C:
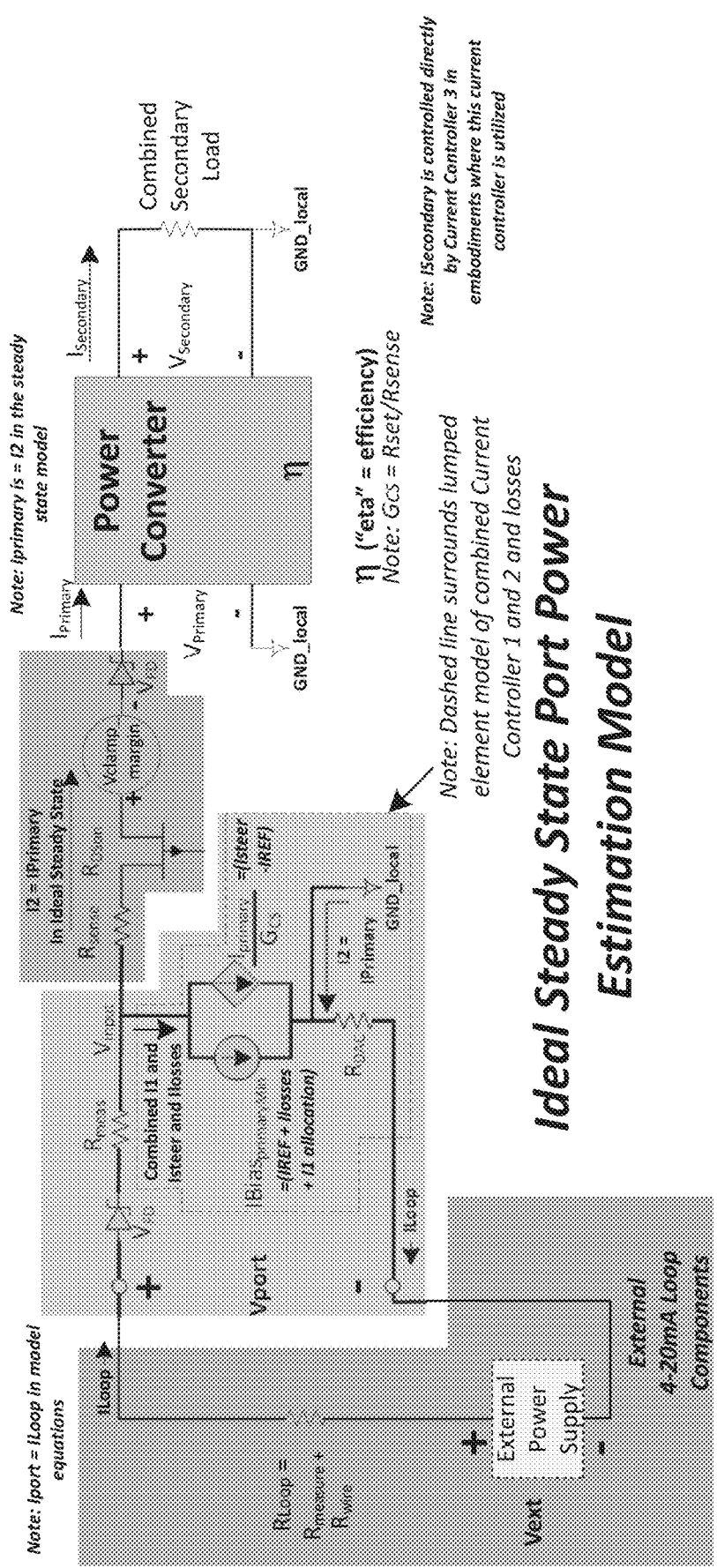
FIG. 11C illustrates an ideal steady port power estimation model.

As indicated previously, Isecondary loading profiles may be known or determined a priori and/or estimated dynamically from measurements made of associated voltage and/or currents to establish a target Isecondary (ISecTarget) for estimating power required from the external 2-wire loop and the required setpoint targets for the second and/or third current controllers. In a number of embodiments hereof, one may provide model-based control for developing one or more setpoints for pulling through the secondary current. One such embodiment of a model derived from a steady state representation of circuit elements and useful for developing model based control and estimation equations is represented in FIGS. 11A through 11C. For the illustrated model, a steady-state operational state is assumed (circuit states in which important circuit parameters such as Vport, Iport, Vprimary, Iprimary, and Isecondary are not changing)

so that transient elements (like the voltage limiter and capacitors) in the circuit of FIG. 11A are removed and/or replaced with steady state operational assumptions in the steady state model of FIG. 11B. For example, the voltage limiter in FIG. 11A may be replaced by a fixed voltage source in FIG. 11B representing a specified margin Vclamp_margin that would be required to keep the limiter from sinking current Ilimit. The steady-state circuit model of FIG. 11B may be reduced further into a simplified model adequate for estimation of important steady-state parameters such as the Vport and Vprimary available from the external loop and the Vport and Vprimary that is required to supply a prescribed steady state secondary load current (Isecondary). In this steady state model, all the I2 current from current controller 2 flows into the power converter primary (Iprimay=I2). Additionally, elements of the first and second current controllers (sometime referred to as current controllers 1 and 2 in the Figures) and current losses prior to the second current controller are condensed and lumped into model parameters of FIG. 11C. The estimation model accommodates variation of power converter efficiency (eta) as part of important parameter estimation.

An example of embodiments of parameter estimation equations derived from the steady state model of FIG. 11C are enumerated in FIG. 12. These model equations are expressed as functions of dependent variable parameters (identified in the square brackets and appended with an underscore as used in the functional notation convention used in FIG. 12). Other variables identified in these equations are presumed to be constants taken from the model. One skilled in the art will recognize that these equations may be algebraically rearranged to solve for the dependent variables in terms of the independent function variable and other dependent variables as expressed in FIG. 12. Together, these equations are useful for estimating limits and targets for setpoints for the second and/or third current controllers and estimating optimal or obtainable targets for monitored and controlled parameters such as Vport, Vinput and Vprimary.

In a number of embodiments hereof, a predetermined secondary load operation (profile) is selected and the associated average secondary current target (ISecTarget) for that profile is retrieved from memory by the microcontroller and/or calculated from composite profile information from memory and/or measured parameters (voltages and/or currents) that monitor secondary power (load) usage. The model equations of FIG. 12 can be used to determine the minimum I2 setpoint (IPrimaryReqMin equation G) and minimum Vprimary requirement (VPrimaryMinReq, equation E) given a selected ILoop setpoint (for current controller 1) and power supply parameters that must be maintained or exceeded to support ISecTarget. Additionally, equations H (and I if Vport measured at Vinput) can be used to determine the voltage required at the 2-wire port (VportReq). To meet the minimum steady state requirements determined from these equations, the I2 current (IPrimaryMax) available from ILoop at the given setpoint for the second controller (IPrimaryCmd; see equation C) must meet or exceed IPrimaryReqMin and the available VPrimary (equation F) and Vport (equation A) must meet or exceed the minimum requirements VPrimaryMinReq (equation E) and VportReq (equation H). The setpoint for the second current controller (I2sp) is constrained at every ILoop setpoint for the first current controller (identified as Iport in equation C) by I2sp<=IPrimaryMax[ILoop setpoint,"Max"] where "Max" indicates that the maximum available current to I2 from ILoop is requested.

In a number of embodiments, using the combined set of equations set forth above, estimates of the required VportReq at the maximum ISecTarget load current ISecTargetMax (where ISecTargetMax is the largest single or combined ISecTarget of load profiles (that concurrently draw Isecondary current) can be estimated using equation H as VportReqMaxLoad=VportReq[ILoop,"Max",ISecTargetMax,eta_min,VPrimSMPSMin, Vclamp_margin] for ILoop swept across the full range of setpoints (ILoopMin to ILoopMax). In a number of embodiments, the microprocessor can determine if the external loop will support the prescribed ISecTargetMax across the full range of ILoop by assessing that VportAv[ILoop,Vext,RLoop] (equation A)>=VportReqMaxLoad for all ILoop between ILoopMin and ILoopMax. By rearranging terms, equation H can be arranged to solve for the maximum steady state secondary current (ISecTargetMax) that ensures VportReq (equation H)<=available port voltage VportAv (equation A) available across the full range of ILoop.

As described previously, a problem with a current-fed power converter/regulator such as a switch mode power supply power converter/regulator is the maintenance of the power converter primary power (that is, voltage and current) to align with minimal operational requirements of the converter (minimum Vprimary) and the power region (Vprimary and Iprimary) where the converter can operate with sufficient (or optimal) efficiency to generate the targeted Isecondary. The minimal required voltage that must be maintained at Vprimary for a given secondary load is related in equation E of FIG. 12. The physical constraint in maintaining the primary conditions is tied to the transient charging the power converter's primary capacitors from the limited current being driven by the second current controller. This constraint is particularly problematic when there is significant voltage loss on the external loop due to high loop component impedances such that the transmitter port voltage changes significantly with changes in ILoop. The relationship is modeled simply as Vport=Vext−ILoop*RLoop (see equation A of FIG. 12) where Vext is the external loop power supply voltage and RLoop is the combined resistances of all lossy components (including, significantly, the wire resistance). This equation is in a classic y−m*x+b form where x is ILoop and the slope m is RLoop, hence Vport changes more for a given change in ILoop for high RLoop. As indicated in the steady state model equations of equation F of FIG. 12, available VPrimary varies directly with Vport, so the change in voltage available at the power converter primary increases with increased RLoop, resulting in larger Vprimary transients when ILoop is varied.

Moreover, as indicated in equation F of FIG. 12, the maximum available Vprimary is constrained to be less than Vport so that the maximum limit for Vprimary is at its lowest when ILoop is high and at its highest when ILoop is at a minimum. Combined with the constraint that I2<ILoop, this means that an operational challenge arises when attempting to charge the converter primary capacitors to increase Vprimary to compensate for the reduction in I2 current to supply Iprimary to maintain the necessary or optimal primary power to produce the targeted secondary current. In short, it is operationally challenging to charge the converter primary voltage when ILoop setpoint is decreased.

As described above, the third current controller may be controlled via its setpoint to pull through excess power available at the power converter primary to charge the energy storage capacitors connected at the power converter secondary. Steady state excess available power exists at the power converter primary when Vprimary*Iprimary*η/

Vsecondary>Isecondary required to sustain the secondary load. In steady state for a given Iprimary, this occurs when Vprimary>VPrimaryReqMin(@Iprimary, @Isecondary) (see equation E of FIG. 12) Additionally, a transient condition frequently exists when ILoop is modulated from a lower to higher current such that Vprimary at the power converter input momentarily exceeds the maximum primary voltage available to the converter from Vport (VPrimaryMaxAv see equation F of FIG. 12). In a number of embodiments that capture excess primary energy in the storage connected to the power converter secondary, this transient excess power is efficiently captured by increasing the setpoint of the third current controller momentarily to pull the charge from the Cprimary capacitors at the power converter primary to reduce Vprimary quickly enough to avoid activating the voltage limiter circuit at the output of the second current controller and to avoid shunting Iprimary to ground via Ilimit (see FIG. 4 and FIG. 6C). Captured and stored energy may then be connected or transferred to the secondary loads, reducing the demand placed on Isecondary being produced by the power converter. As discussed previously, reduction of secondary current demand from the power converter can be utilized to operate the power converter in a mode that draws sufficiently less Iprimary current than current available from I2 to allow the power converter input to be charged to a Vprimary sufficient or optimal to resume delivery of Isecondary at a rate sufficient to continuously sustain the secondary loads (see FIGS. 6B, 6C and 6D). In general, the amount of energy stored and supplied from the energy harvester storage must be sufficient enough to allow the Isecondary demand to be reduced long enough to allow Vprimary to be charged to a target level from I2.

As also described above, another practical approach is to store I2 current (in excess of the Iprimary required for power converter operation to sustain the required Isecondary) in capacitors at the power converter primary. Among the embodiments realizing this concept are those depicted in FIGS. 9 and 10. Using the steady state model equations of FIG. 12, excess I2 current available for primary storage exists, for example, when the I2 setpoint (I2sp) is commanded such that IPrimaryMax[ILoop,I2sp] (see equation C of FIG. 12) exceeds the minimum required IPrimary (IPrimaryReqMin[Iport,I2sp, ISecTarget,eta,VPrimSMPSMin] (see equation G FIG. 12) As described above, primary storage capacitors such as those embodied in FIG. 9 may be switched from parallel (for excess I2 storage) to series with each other to create a voltage greater than the target Vprimary to provide current to charge Vprimary to a target level as I2 is reduced with reduced ILoop setpoint. In other embodiments, the excess I2 current can be collected in a capacitor connected in series with a boost converter or charge pump that charges primary capacitors whose output may connected to charge Vprimary (see FIG. 10).

The second current controller sets the current pushed to the power converter primary in I2 drawn from ILoop and returned to the first current controller. In addition to controlling noise created in the system that is returned to the first controller and ILoop, it is also possible to exert some direct control over the way in which the power converter operates through manipulation of the setpoint for the second current controller by using the processor system/microcontroller to control loop current delivered to Iprimary and Vprimary via I2 for a given average secondary load. With the addition of the third current controller, direct control can also be applied to Isecondary as an additional measure of influence on power converter operation. One may, for example, indirectly control power converter frequency, rise time, duty cycle etc. to effect power conversion while limiting primary side noise by using I2 to manipulate the loop current delivered to Iprimary and the Vprimary voltage and/or using current controller 3 to directly control the Isecondary load demand presented to the power converter. Use of current the second and third current controllers to influence power converter operation through control of converter primary and secondary power components (voltage and current) enables the potential to exert such control on commercially available power converters and control IC's. Such control is difficult and complicated, however. In general, attempting to limit power converter noise through using control of port voltages and currents, or through direct control of power converter parameters such as switch frequency, duty cycle, etc., is significantly more difficult than relying primarily on the use of a high bandwidth, high output impedance, second current controller to contain the primary current noise of a power converter from reaching the current loop.

One may also control the operating parameters of power converter using the second and/or third current controllers as just described to control the input harmonics. Noise generated by frequency, pulse width, rise time may be controlled to a certain degree by the operation of the converter within a predetermined range of operating conditions. In that regard, one may, for example, control Iprimary (and thereby control Vprimary) and control Isecondary in a manner to reduce noise produced by the power converter. Such control of the operating conditions of the power converter may be used in conjunction with the high-bandwidth, high output impedance, second current controller to restrict noise on the current loop. Control of the setpoint of the second current controller (to control 12), in conjunction with control of the setpoint of the third current controller (to control the current pulled through to the secondary side of the power converter) may be used to keep the power converter in a desirable or optimal operating condition. Providing control of the region of operation of the power converter may, for example, be advantageous to restrict noise produced by the power converter to be within a determined bandwidth for the second current controller.

Figure 15:
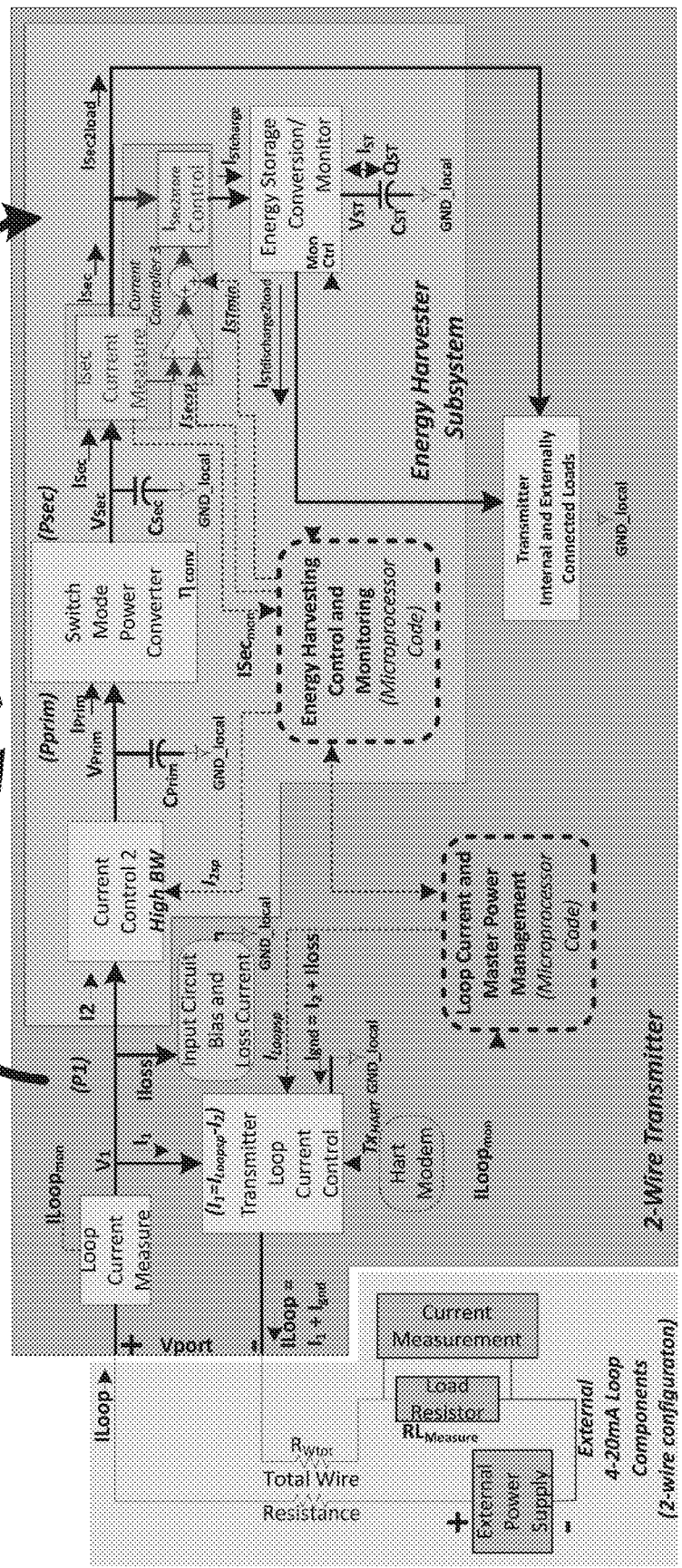
FIG. 15 illustrates an embodiment of a system hereof in which the second and third current controllers are operated as described in FIGS. 13 and 14 in a combined/synchronized operation which may, for example, be referred to as a "push-pull" methodology.

As described above, one can optimize Iprimary (and thereby Vprimary) for operation of the power converter. In embodiments with a second current controller, the second current controller controls Iprimary (and thereby Vprimary at a given secondary load current Isecondary). Use of the setpoint for I2 via the second current controller to control Iprimary may, for example, be referred to as a push methodology (see, for example, FIG. 2B and FIG. 13). In embodiments wherein the third current controller is present, the current pulled through the power converter, Isecondary, is controlled by the third current controller (see, for example, FIG. 2C). Use of the setpoint for the third current controller to control Isecondary may, for example, be referred to as a pull methodology (see for example, FIG. 14). The push control methodology controls Iprimary and Vprimary (for a given Isecondary) only. Incorporation of a pull methodology via the third current controller on the secondary side of the power converter additionally enables one to pull Isecondary to be a certain level or setpoint. Vsecondary is a function of the power converter setting. The operations of the second and third current controllers can be combined/synchronized to simultaneously capture maximum power from the external loop and deliver it to the secondary. Such combined/synchronized operation of the second and third current controllers may, for example, be referred to as the push-pull methodology (see FIG. 15).

In control methodologies hereof, sufficient Vprimary is required so that power converter doesn't shut off. If Vprimary drops below the converter's minimum input voltage threshold, the power converter shuts off. If Vprimary cycles above and below the minimum Vprimary threshold required for operation, the power converter will turn on and off. As described, above, control methodologies (for example, using model-based control) hereof control Iprimary to maintain Vprimary at or above the voltage required to supply Isecondary (see equation E of FIG. 12). With knowledge of the secondary power requirements and power converter efficiency ($\eta$), such models may, for example, control Vprimary and steer it within the bounds VPrimaryReq (see equation E of FIG. 12)<=Vprimary<=VPramaryMaxAv (see equation F of FIG. 12) to be optimized for the amount of current available.

Power control to one or more loads on the secondary side of the power converter may also be utilized. As described above, the energy storage system may be used to maintain a reserve of energy with knowledge of what power requirements will be for one or more given load and/or mode of operation. One may further control one or more of the loads to, for example, decrease the power usage thereof and or to set a time period for the power usage thereof. Devices, systems and methods hereof may, for example, allocate power to one or more loads based on modes of operation. For example, power to one or more loads other than the sensor may be reduced to allocate power to the sensor. Likewise, certain peripherals may be placed in a lower power or zero power state to allocate power to the sensor.

In determining the control of various aspects of the devices, systems and methods hereof, the control system may, for example, monitor various aspects of the system such as the power available at the port, I2, Vinput, Iprimary, Vprimary, Isecondary etc. In a number of embodiments, variables such as the power at the port may be measured and setpoints as described herein may be set based on the measured power etc. In a number of embodiments, one may adjust energy harvesting to harvest all energy that is available for a given port power.

In a number of embodiments, the third current controller determines the setpoint for Isecondary and allocates the portion of Isecondary that is not consumed by loads directly connected to the secondary (loads not drawn from secondary storage) to be sent to the energy harvesting system energy storage subsystem (see FIG. 2C). The setpoint for the third current controller may, for example, be driven in a number of aspects. In a first aspect, the processor system may set a minimum third controller setpoint to guarantee an excess of Isecondary is available to supply the minimum amount of current required to maintain the minimum state of charge of the energy harvester storage system to sustain the secondary operations. In a number of embodiments, where the output of the third current controller is connected to drive current to the storage capacitor(s), this is implemented by setting the third current controller setpoint at or above the average load current that factors in the secondary storage capacitor charge profile in the average load current for the a predefined load profile (see dashed line representing the average profile period current and composite secondary loads that include the storage capacitor charge profile in FIG. 5). In this case, the average load current associated with the profile factors in the secondary loads drawn dynamically directly from the Isecondary and/or from the storage system with the charge current required to restore the state of charge of the storage system to the level required at the start of the profile period $\Delta T$ (see the storage capacitor charge profile in FIG. 5). In a second aspect, Isecondary may be maintained above some minimal level by issuing an Isecondary setpoint that is compared to a dynamic measurement of the portion of Isecondary that is actually being pulled by the combined secondary loads (including by the third current controller to the energy storage system) and increasing the setpoint for the third current controller above the level described in the first aspect described above to be equal to the difference in Isecondary setpoint with the measured Isecondary. In that regard, in a number of embodiments, the third current controller setpoint is set to be equal to: minimum setpoint+ Isecondary setpoint−Isecondary with the constraint that the secondary term is limited to Isecondary setpoint≥Isecondary.

In a number of embodiments, the Isecondary setpoint serves to level Isecondary to limit the extent that that the power converter is required to change operation in response to secondary load transients. Changes in power converter operation can introduce transients on Iprimary. To prevent these Iprimary transients from propagating to ILoop, they should fall within the combined bandwidth of the second current controller and the frequency region where passive components connected between the secondary current controller and the power converter input are capable of supplying or suppressing the transients passed to ILoop below the targeted noise level. Another control aspect providing in setting of the Isecondary setpoint is to maximize the conversion and storage of instantaneous current that is available at the power converter input into secondary current that can be captured and stored for use to supply loads that require short term power in excess of the nominal instantaneous power. In a number of embodiments, setting of the Isecondary setpoint thus serves two important functions: (i) limiting the operation range of the power converter (for example, a switch mode power supply) to keep Iprimary noise to within targeted levels and (ii) to allow maximal or optimal conversion and capture of power available at the power converter input to sustain secondary operations.

Certain design considerations of a system hereof are discussed in connection with representative case studies of 4-20 mA system hereof. Some important parameters and considerations in the design of the 2-wire transmitter 4-20 mA port specification are first discussed. The minimum Vport voltage required to power the instrument when ILoop is at its maximum value. This is commonly referred to as the compliance voltage or sometimes referred to as the lift-off voltage. The instrument compliance voltage imposes constraints on the voltage of the external loop supply, the maximum measurement load and the length of the wire connecting these to the instrument. The compliance voltage is typically selected to accommodate a target wire length (wire resistance) with industry standard loop power supply voltages and measurement load resistor values. Conversely, the compliance voltage may be chosen to provide the required power for selected instrument features with specified constraints for the loop power supply and combined wire and measurement loads. The minimum and maximum ILoop current are also important considerations. The minimum ILoop current is typically specified to some value below 4 mA to indicate a fault condition for the instrument. The maximum ILoop current is typically specified to some value above 20 mA to indicate a measurement over-range or lock-out condition. The maximum 4-20 mA loop current resolution is maximum number of discrete levels between 4 and 20 mA required to represent the minimum measurement interval across the full-scale range. This specification limits the minimum ILoop step change the transmitter must resolve and thus limits the maximum peak-to-peak current noise the transmitter can impose on ILoop. As described above, the peak-to-peak noise may, for example, be less than ½ the required minimum increment of ILoop to avoid unwanted fluctuations (flicker) when the loop current measurement is quantized. As also described above, inclusion of a wired HART modem requires a +/−0.5 mA modulation depth, adding overhead that limits the portion of ILoop that can be used to power the instrument. Additionally, since net wire capacitance is a function of line length, the line impedance limit imposed by the 2.4 kHz max HART FSK (frequency shift keying) signaling frequency limits the maximum loop distance.

The specification of the port capabilities for the transmitter hereof bears consideration of the power that may be expected to be available from the 4-20 mA loops in existing installations. When used as a replacement transmitter, the new transmitter design should ideally be capable of delivering functionality equivalent to or better than the transmitter it is replacing with minimal or no requirement for alteration of the existing loop components. The capabilities of existing transmitters may be used as benchmarks to gauge modifications in port requirements driven by the need to power additional features and higher current loads in the new transmitter designs hereof.

General requirements for a number of embodiments of a 2-wire port and external 4-20 mA loop are outlined below. Requirements that are believed to be known as well as those that must be determined for a particular system are discussed based, for example, upon projection of power estimated for features proposed for the new energy harvesting platform to the transmitter port. An ILoop minimum of 3.5 mA max (that is, a fault condition) may, for example, be specified. It is desirable that ILoop minimum be as high as possible to keep minimal available power at the port as high as possible. In a number of embodiments, ILoop maximum requirement is 22 mA min (that is, an over-range condition). The ILoop resolution requirement is a maximum of 1000 steps across full scale 4 to 20 mA range or 16 uA minimum resolution. The ILoop noise requirement no greater than 8 uA (peak to peak). The maximum Vport is 30 VDC (but that may be increased in certain embodiments).

As described above, the compliance voltage requirement is the minimum Vport at maximum ILoop. The compliance voltage is dependent on the secondary load(s) the instrument must support. Specific requirements for compliance voltage will be discussed further below. The compliance voltage required to support the secondary current load drawn by different types of sensors and various combinations of optional features may vary significantly. Increasing the secondary load requires an increase in the compliance voltage which, in turn, impacts the minimum loop power supply voltage and combined wire length and measurement load resistance that can be supported on a 2-wire loop. As a result, the value of functionality afforded by optional features/loads must be weighed against associated impacts to loop capabilities. Rather than indicating a single compliance voltage, a matrix of compliance voltages corresponding to sensor type and supported optional feature combinations may, for example, be specified.

External loop component constraints must also be considered. A maximum supply voltage should be equal to the maximum Vport specification. The historical maximum voltage for a number 2-wire sensor systems has been 28 VDC or 30 VDC. Higher loop voltages (and Vport maximum voltage capability) may be considered as a means to enable longer loop distances or to accommodate fixed loop sense resistances while supporting higher compliance voltages necessary to supply combined power requirements for features/loads installed on a 2-wire transmitter. A minimum supply voltage will be dependent on the combined power requirement for the features/loads installed on the 2-wire transmitter.

Further considerations include loop wire resistance and measurement load. Loop wiring for a 2-wire installation will often be preexisting. Thus, the design should accommodate typical minimum wire gauges historically used for such applications. In a number of installations, the minimum wire gauges have been 22 AWG (16 mΩ/ft) or 18 AWG (6 mΩ/ft). In a new wire installation, larger wire gauges may be used to support longer loop lengths with standard measurement resistances. For this reason, the 2-wire platform may, for example, accommodate a maximum wire gauge of at least 14 AWG (3 mΩ/ft). While 500Ω measurement loads have been commonly used to achieve a convenient 2 to 10V measurement range across 4 to 20 mA, the added port compliance voltage required to power features on the platform hereof may significantly limit the loop length with a measurement load this large with a standard 24 VDC loop supply. A 250Ω or smaller measurement resistor may be required to accommodate the length and wire gauge of an existing installation with a 24 VDC loop supply.

In the case of replacing an existing transmitter, the transmitters hereof should be able to deliver at least equivalent functionality and gas monitoring capability without modification of existing loop components to serve as a drop-in field replacement. The capabilities of the 4-20 mA port should thus meet or improve on such legacy transmitters. In consideration of supporting new features and capabilities beyond those of legacy transmitters, additional power may be required from the external loop, requiring either an increase in the loop voltage supplied and/or a reduction of the loop measurement resistance. The capability introduced by the replacement of the linear power supplies used in legacy transmitters with a power converter in systems hereof introduces a new paradigm allowing use of elevated port compliance voltage to acquire added power to support new sensors and features. A transmitter port hereof may, for example, be designed to accommodate loop supply voltages beyond the 30 VDC limit supported by a number of legacy systems to facilitate a practical means of using the loop power supply to reconcile existing wire length and measurement loads with the reduced loop voltage margin imposed by elevated compliance voltages.

Figure 2D:
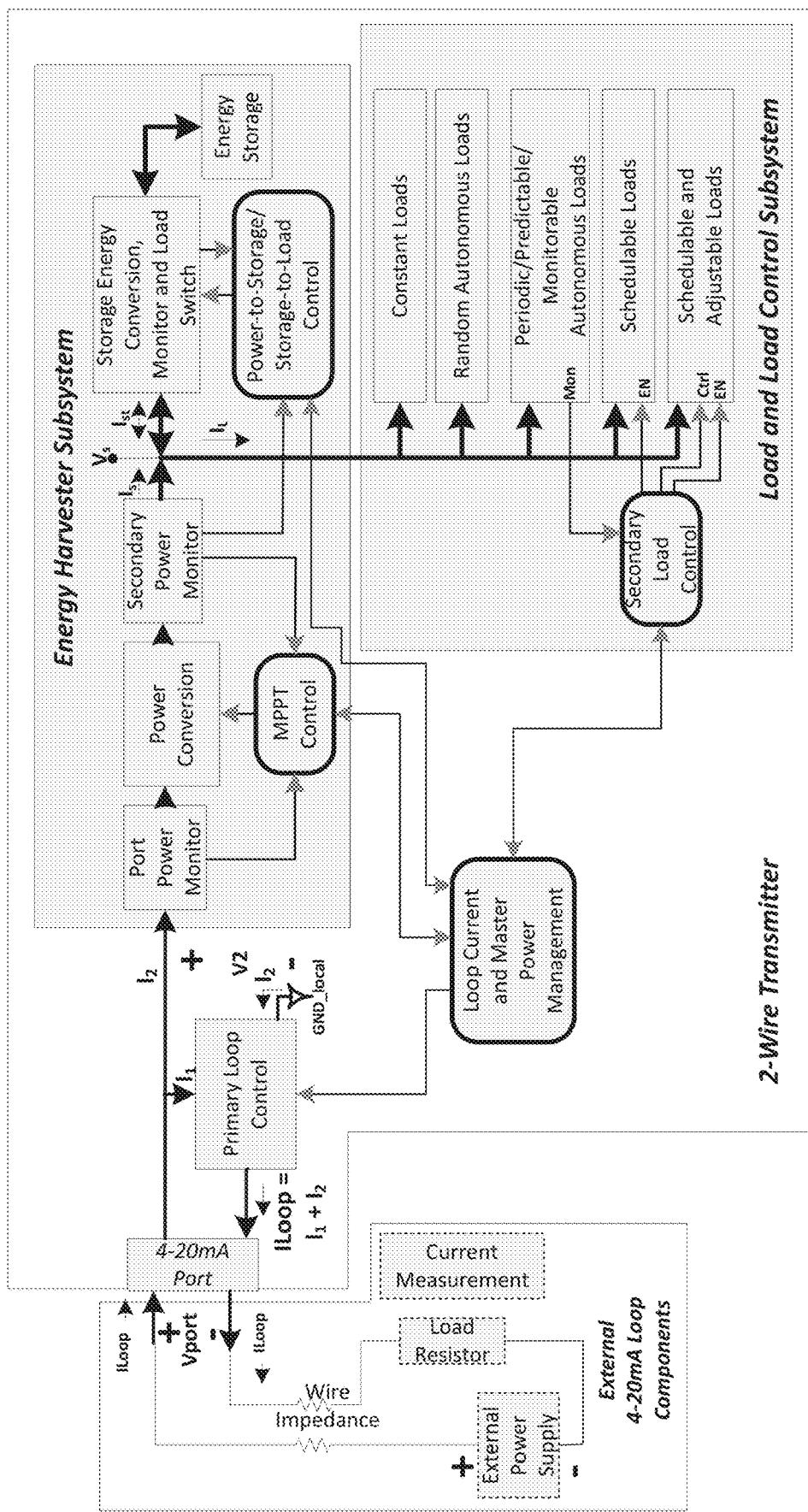
FIG. 2D illustrates another block diagram of a representative embodiment of a 2-wire current loop hereof including an energy harvesting system further including an energy storage system.

Block diagrams illustrating embodiments of a proposed power supply system solution for a 2-wire platform hereof are set forth in FIGS. 2C and 2D. Those figures are partitioned into two major sections, a first, leftmost section representing the 4-20 mA loop components external to the transmitter and a second section, positioned right of the first section in the Figures, setting forth a high-level representation of the transmitter signaling, energy harvesting and load scheduling features. The primary loop control subsystem and the energy harvester system as described above. As described above, the energy harvester subsystem is principally responsible for supplying the average and peak power for the combined transmitter loads from the available P2 power (wherein (P2=V2*I2) and stored energy. The energy harvester subsystem includes the power conversion system and the energy storage/retrieval system. In a number of embodiments, the power conversion system implements a maximum power point tracking MPPT control that maximizes the conversion of available input power (P2=V2*I2) into secondary current Isecondary or Is at a prescribed secondary voltage Vs. In a number of embodiments, the power conversion system implements control to attain and sustain conditions to affect voltage and current parameters of the system to minimize noise returned to the external loop while maintaining adequate secondary supply and storage to sustain the secondary load profiles comprising the current mode of operation. This subsystem is responsible for supplying the average power consumed by the transmitter loads. The energy storage/retrieval system stores the residue of the instantaneous excess secondary power not consumed by the transmitter loads and returns it to supply peak demands in excess of the average secondary power produced by the power conversion system.

Referring primarily to FIG. 2D, a third component of the power control system is a load control subsystem that manages the timing and/or magnitude of peak load demands IL to avoid overwhelming the combined average current supplied by the power conversion system Is and the short term storage current IST drawn from the finite energy storage system. The rectangular boxes set forth in, for example, FIG. 2D, within the load and load control subsystem block, illustrate classes of secondary transmitter loads that are to be accommodated by the power control system. Those classes of loads are described briefly below.

Constant Loads represent the composite static DC quiescent current drawn by all loads connected to the transmitter secondary. Constant loads do not vary appreciably over time and thus do not rely on instantaneous peak power provided from the energy storage system. However, the steady state nature of these loads requires they be allocated directly from the secondary power produced by the conversion system.

Random Autonomous Loads represent peak loads that can occur randomly and cannot be anticipated, monitored or controlled. Accommodating the combined random peak currents of such loads requires a reserve be allocated in the energy storage to service them. Since these loads cannot be anticipated, the control system cannot schedule loads it can directly control to avoid simultaneous peak demands. Energy storage must, therefore, be allocated to accommodate the eventuality of the peak power demands of all random autonomous loads aligning with each other or with schedulable loads. This requirement limits the flexibility of control system to distribute peak power and limits the features/loads that can be supported. In a number of embodiments, random autonomous loads may be avoided—for example, by either modifying the design to render them predictable or controllable or by limiting the peak current of loads that cannot be modified to preserve energy storage margin.

Periodic/Predictable Autonomous Loads represent peak loads that, while not directly controllable, occur in a regular interval that can be monitored and predicted by the control system. This type of load is preferable to random autonomous loads since the timing of peak loads directly enabled by the control system can be scheduled to avoid or limit excessive simultaneous peak demands. While the predictable quality of the peak timing improves the power allocation options of the control system, energy storage reserve must be allocated to accommodate the eventuality of alignment of the maximum peak demands of the combined autonomous loads attached to the transmitter secondary, limiting the available capacity to support additional features/loads.

Schedulable Loads represent peak loads with a fixed or preset peak power timing profile that can be enabled and disabled by the power control system. While the peak power profile is fixed, the ability to schedule the timing of this type of load facilitates controlled avoidance of excessive peak alignment with other loads and increases the flexibility in sharing stored energy to power a broader range of features and functionality.

Adjustable Schedulable Loads represent loads with adjustable power profiles (adjustable peak magnitude and timing) that can be adapted to realize performance vs peak power tradeoffs to enable features to be offered at the best performance level (or at least a minimally acceptable performance level) while accommodating the available power and power sharing demands of other features. Loads with this quality afford the greatest flexibility to the control system to power the broadest range of features. To facilitate the greatest range of features and adaptability to field power availability, all high peak demand loads and optional loads may be designed to accommodate adjustable load scheduling.

The above classifications of loads set forth control access considerations important to successfully managing multiple peak power loads in a system powered by an energy harvesting based power supply system. A detailed system design emphasizing forward planning to facilitate load requirements is important in both assessing feasibility and implementing the design of features with peak load demands.

The power monitoring and load control features of embodiments of the power supply systems facilitate a number of functionalities. For example, the power port monitoring feature, in concert with the primary loop control, may be used to implement an automated assessment of the external loop power supply voltage and port load. This may include measurement of the port voltage with the loop current command set to two distinct values. This functionality may, for example, be used at installation to assess if the power supply and load connected to the transmitter port will support the power needs of the features connected or enabled on the transmitter. The information may be used to adapt the performance level of select features to the highest supported by the power available at the port. Load scheduling and control may also be used to implement operational modalities in which the power requirement and performance level of select features/loads can be modified to prioritize the core functionality of the modality. In other word, this methodology entails modifying the performance level of select features to lower their power demand to make more power available to a feature/load or set of features/loads central to the focus of current transmitter operations. As an example, the advertising rate of BLUETOOTH communications may be reduced to make more power available to a local user interface when a user is interacting with the transmitter through the local user interface.

General operation procedures may be categorized as initialization (initial power-up or perhaps reboot) and general operation procedures, which covers transmitter power-up through transition to normal operation. Some of such procedures may, for example, be initiated and/or adjusted under user control in addition to/or instead of automatic initiation.

In the earliest phase of a transmitter power-up sequence, following a brief in-rush, the transmitter may, for example, initiate with an ILoop current that is less than the normal operational fault current. An object of this operational phase is to power and initialize the microprocessor and other circuits necessary to loop current and power system control. Schedulable and adjustable loads may, for example, be disabled or set to minimum power during this preliminary sequence.

The processor system (including, a microprocessor in the illustrated embodiment) may, for example, initiate an assessment of the available power from the 4-20 mA port by systematically adjusting ILoop to two distinct setpoints and measuring Vport. The ILoop setpoints used for this port interrogation may, for example, reside below the 4 mA operational level. Since Vport=Vext−ILoop*RLoop (see equation A of FIG. 12) where Vext is the external loop power supply and RLoop represents the combined port load of the measurement resistor and wire resistance, both Vext and RLoop can be determined algebraically from two ILoop conditions as two equations with two unknowns. This operation may be carried out automatically at first power-up of the transmitter. If it is preferred that this assessment not be made at every power-up or reboot, this operation could be transferred to a user initiated process thereafter by setting a non-volatile flag denoting the first assessment has been performed.

Depending on power availability assessed at the port, the transmitter may need to institute a secondary storage charging cycle before proceeding. During this cycle, ILoop may be held at a fault level and schedulable and/or controllable secondary loads may be halted or set for minimal power to allocate maximum secondary current to charge the storage device. This initial ILoop may be implanted for example in a number of embodiments by providing a constant steering current source IREF with the set-point for current controllers 1 and 2 set to 0 (see for example, FIG. 11A) Alternatively, the charging cycle could be instituted after assessing the secondary load inventory or performed in the background once normal operation begins with non-critical schedulable loads utilizing storage brought online once storage reaches a predetermined acceptable level.

The microprocessor may also take inventory of the loads connected to the transmitter secondary. Load information may be acquired from constants stored in memory, through interrogation of sensors and circuits and/or by assessment made from measurements drawn from the power monitoring circuits flanking the switch mode power supply. Through this interrogation or stored configuration settings, the microprocessor may categorize the loads into classes organized by priority and schedule or adjustment control capability.

The microprocessor may then perform an assessment to determine if sufficient power can be acquired from the connected 4-20 mA loop to supply the transmitter loads assessed and inventoried in the previous step. One approach to performing this assessment is to project the secondary loads to the port via a port power estimation model (as discussed further below; see FIG. 16A) and compare directly to the available port power determined at power-up. Conversely, the available port power may be projected to the secondary and a comparison performed with secondary current values. Actions taken based on this assessment would depend on the level of sophistication deemed appropriate or valuable for the system. In a simple case, if available port power is less than the power required to run all the secondary loads at a fixed performance level, a fault state may be entered. Otherwise system operation may proceed without entering a fault state. In a more complex system, possessing the ability to adjust the operation of some features to tailor performance to the available secondary current, other outcomes are possible. For example, if the available port power is less than the power required by the sum of all secondary loads required to achieve minimal acceptable transmitter capability with all adjustable features configured for minimum power, a fault state may be entered. If the available port power exceeds this minimum, one may proceed to an operational state using some simple rules. For example, the performance of select adjustable features/loads may be modified to realize acceptable or optimal performance supported by the available power. Another possibility is to enable or disable select non-critical features as an alternative manner of tailoring the secondary load to conform to the available port power. In this case, a warning (non-fault) may be displayed or communicated to indicate features are disabled. Once power assessment is completed and/or the system is adjusted for best performance with the available port power, typical transmitter operations may begin to bring the system to an operational state with the port current (ILoop) transitioned into the normal 4-20 mA range.

During an operational state, and as discussed above, load scheduling and load adjustment may be used to implement operational modalities in which the performance of select features can me modified to prioritize the core function of a specific modality. A principle employable in such cases is to enable/disable or modify the performance of select non-critical features (for example, not critical to the principal gas monitoring task in the case of a gas sensor) to allocate power to features central to a current modality or mode of operation. In other words, this methodology utilizes a redistribution of available power to prioritize features associated with a preferred focus of transmitter operation.

A number of embodiments of automated transmitter capability assessment (determining transmitter operational capability from available port power) discussed above are described in further detail. The discussion below begins with separate treatments of port power availability assessment and requirement assessment and concludes with transmitter operational capability determination, which combines those assessments.

The objective of port power availability assessment is to estimate the steady-state power delivery capability of the external 4-20 mA loop to the transmitter port. More specifically, this involves assessment of the steady-state open loop voltage VportAv range available over the transmitter's full operational ILoop current range. To facilitate estimation of $Vport_A$ at arbitrary values of ILoop, a simple model reducing the external loop to a supply voltage Vext and consolidating the loop measurement resistor Rmeasure and total wire resistance Rwire into a single resistor RLoop is employed as depicted in FIG. 16B. The steady-state, open-loop voltage equation at the port is taken from this model as: $Vport_{Av}$=Vext−ILoop*RLoop (see equation A of FIG. 12). Once again, this equation takes the familiar y=mx+b linear form wherein the slope m in this case is −RLoop and the intercept b is Vext. As described above, the transmitter performs a loop interrogation by setting ILoop to two distinct setpoints (ILoop1 and ILoop2), and measuring $Vport_A$ associated with each setpoint, which produces two equations with two unknowns (Vext and RLoop) having a simple algebraic solution:

$Vport_{Av1}$=Vext−ILoop1*RLoop; and $Vport_{Av2}$=Vext−ILoop2*RLoop.

An advantage of using this approach is that the model equation may be used to calculate the steady-state voltage $Vport_A$ across the entire 4-20 mA operating range of the transmitter based on data collected at only two ILoop setpoints. The setpoints chosen for test may be determined for a particular system but typically should fall below the lower 4 mA bound of the normal loop operating range. There are a number of possibilities to consider regarding how and when such a loop interrogation should be initiated. Such an interrogation may, for example, be initiated automatically at initial power-up (commissioning), at any power-up or main processor reboot, and/or under user control. In general, the transmitter typically minimizes internal loads that may be controlled during the interrogation process. Once Vext and RLoop are estimated, the steady state port voltage may be projected across the transmitter's full control range for ILoop by simply calculating $Vport_A$ vs ILoop as illustrated in FIG. 16C. These projections of VportAv vs ILoop represent load lines that indicate both the range of VportAv and the rate of change in VportAv as ILoop is varied across the full scale range. Since, in steady state, Vprimary is constrained to be less than Vport, the intercepts of VportAv at the minimum and maximum ILoop regions that the system must operate limit the primary voltage Vprimary that is available to supply the secondary loads that must be supplied across the full scale range of ILoop. Additionally, since Vprimary<VportAv (see VPrimaryMaxAv equation F of FIG. 12), the slope of VportAv vs ILoop dictates the steady state change in Vprimary required as ILoop changes. The rate or slope of this change In Vprimary is of importance in the dynamic control design that issues setpoint commands to the second and/or third current controllers as it impacts the rate at which these current controllers must make adjustments to achieve a new Vprimary target as ILoop changes. FIG. 16C depicts the VportAv vs ILoop characteristic for three different external 4-20 mA loops of different Vext and RLoop. Interrogation setpoints are marked by an x in FIG. 16C. Dashed lines separate a normal operating region (center) from regions on left and right representing, respectively, fault and overrange regions. The VportAv vs ILoop values calculated by the fitted model of FIG. 16C represent the max voltage available to the transmitter vs ILoop setpoint. As illustrated in FIG. 16C, the slope of the VportAv line increases (negatively) for higher RLoop and determines the range of change in VportAv (VportAv@ILoopmin–VportAv@ILoopmax) across the ILoop operating range [ILoopmin, ILoopmax] and the external loop power supply Vext determines the offset for VportAv across this range in ILoop.

The objective of port requirement assessment is to estimate the steady-state port power (VportReq vs ILoop) that must be available to the transmitter for operation. This determination involves taking inventory of the secondary loads (loads attached to the output of the power converter) connected to the transmitter, summing those loads to determine the continuous average power demand, and then projecting this demand to the transmitter port to establish the required port power. The process begins with the processor system/microprocessor taking inventory of the secondary loads connected to the transmitter. As described above, load information may be acquired from constants stored in memory, through interrogation of sensors and circuits and/or by assessment made from measurements drawn from power monitoring circuits flanking the switch mode power supply.

In keeping with the load classifications in the load control subsystem described in connection with FIG. 2D, loads that cannot be adjusted or scheduled may possess a single load requirement while loads that can be adjusted and/or scheduled may possess multiple discrete average load requirements depending on configuration and scheduling rate. For simplicity and robustness, load estimates for loads that may be controlled by the processor system/microprocessor may, for example, be precompiled into a lookup table. The details and procedures regarding adaptable load control for a specific system embodiment may be readily determined. A configuration defining a minimal acceptable transmitter capability may, for example, be instituted to establish a corresponding minimal power requirement. The secondary loads discovered in the inventory process may be summed together to determine an average secondary load.

Figure 16A:
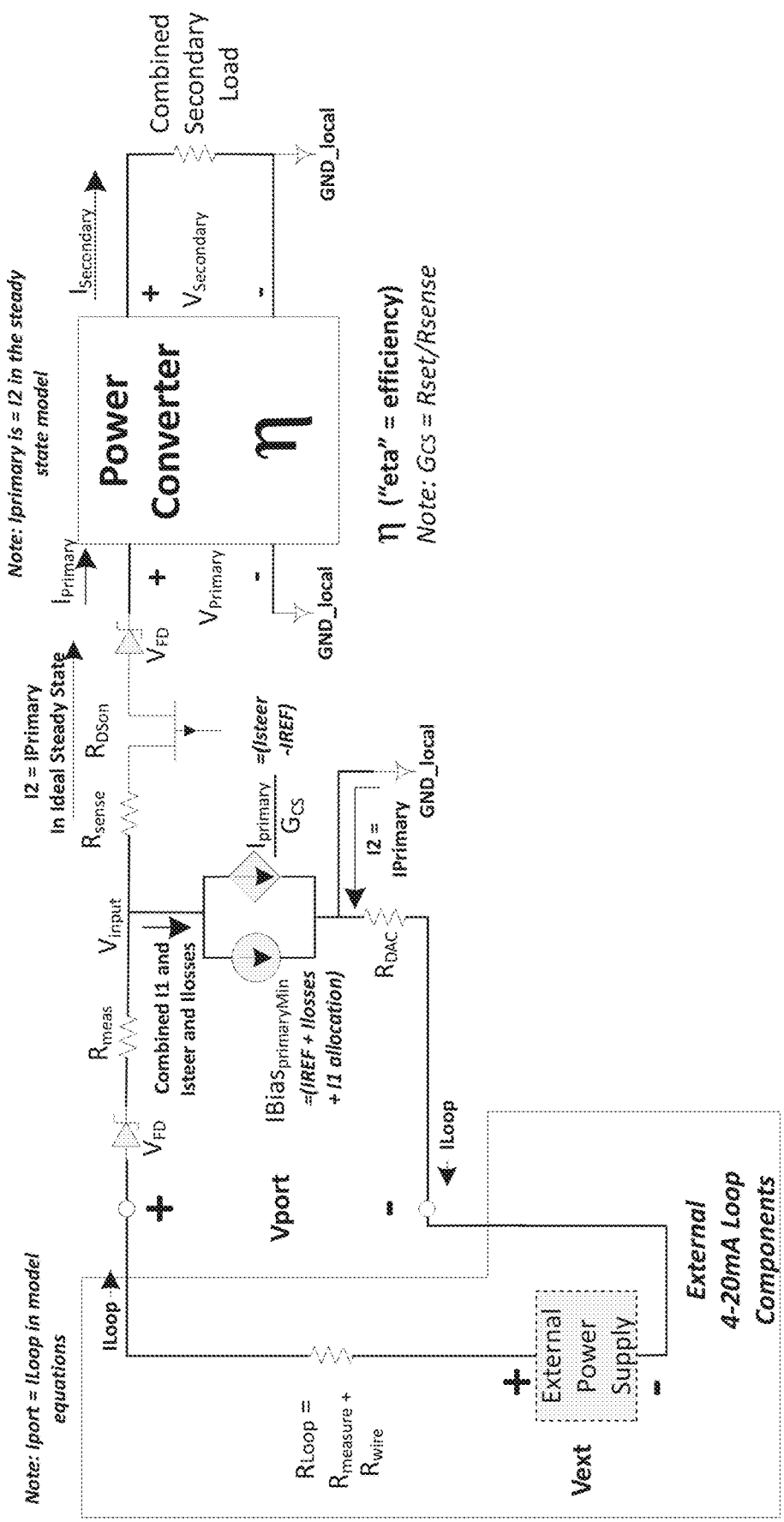
FIG. 16A illustrates an embodiment of a port power estimation model use to project transmitter load and power converter requirements to the transmitter port.
Figure 16D:
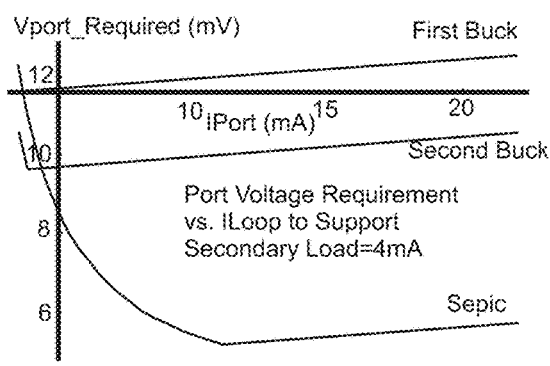
FIG. 16D illustrates load projections to port voltage ($Vport_{Req}$) vs ILoop requirements for transmitter using three different internal power converters.

Projection of the average secondary load to the transmitter port is accomplished using the model equations from the port power estimation model of FIG. 16A. As discussed previously, the origin and derivation of the steady state estimation model in FIG. 16A is illustrated in FIGS. 11A through 11C with the associated model steady state model equations enumerated in FIG. 12. These are simple algebraic equations that account for the losses in the primary loop control circuits and account for the variability in the power converter primary voltage VPrimary requirements with varying primary current IPrimary (that is limited by ILoop) and the secondary load. Using the model of FIG. 16A, the total average secondary load is projected to the transmitter port producing a port voltage requirement VportReq (see equation H of FIG. 12) dependent on the ILoop setpoint. FIG. 16D illustrates a 4 mA average secondary load projected to the transmitter port for three different switch-mode power supply (SMPS) configurations (a first Buck converter configuration, a second Buck converter configuration and a single-ended primary-inductor converter or SEPIC, which are described in further detail below).

Figure 16E:
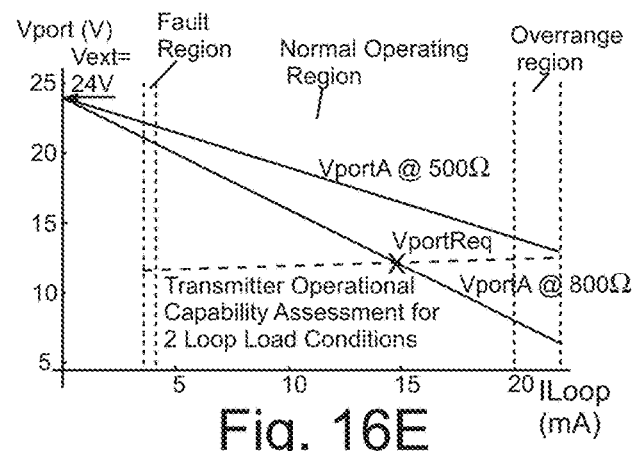
FIG. 16E illustrates an operational capability assessment of a transmitter with $Vport_{Req}$ connected alternatively to a loop with 500 ohm and 800 ohm load resistances, wherein the "X" represents the intersection of the 800 ohm load line with $Vport_{Req}$, indicating that the loop is incapable of supporting the power required by the transmitter.

An operational capability assessment may, for example, compare the power required at the transmitter port for given secondary load condition or mode of operation to the power available at the transmitter port. In simplest terms, this analysis step simply determines if the voltage available to the transmitter port VportAv (equation A of FIG. 12) exceeds the VportReq (equation H of FIG. 12) over the transmitter's full operational range of ILoop. This concept is illustrated graphically in FIG. 16E wherein VportReq to sustain a 4 mA secondary load with a buck converter is plotted against the available port voltage VportAv for two different exterior loop embodiments. Both exterior loops include a 24V loop supply. However, one exterior loop has a loop load resistance of 500 ohms, and the other has loop resistance of 800 ohms. As illustrated, sufficient voltage will be available to the transmitter connected to the loop with 500 ohms resistance as the VportReq remains below the available VportAv across the entire operating ILoop range of the transmitter. The loop with 800 ohm resistance (black) is incapable of supplying sufficient power to the transmitter for full range operation as the corresponding VportAv load line falls below the VportReq line for ILoop>15 mA (wherein the intersection of the lines at 15 mA is marked with an x).

Since the transmitter performs the assessments of VportAv while operating in the fault region, operational capability assessment can proceed as long as the VportAv vs ILoop characteristic of the loop remains above VportReq in this fault region of ILoop. The ILoop intersection ILoop of VportAv and VportReq is defined where VportAv=VportReq, so that, in practice, capability assessment may be realized by numerically finding the $ILoop_x$ at which this condition is met and determining whether it falls outside the operational ILoop range. For this capability assessment, the IPrimaryCmd term in the VportReq equation (equation H FIG. 12) is set to "Max" (see equation C of FIG. 12) In the simplest assessment, the transmitter may remain in a fault mode and possibly display a condition indicating insufficient available loop power for full operation.

As described above, operational modes may be extended beyond basic "go or no-go" decision at power-up to applications in which the operational capabilities of select transmitter subsystems can be tailored (maximized) to operate within the available power limit of the loop. This operational mode may, for example, include an ordered adjustment of select transmitter subsystems (with scheduling and/or adjustment capabilities) with the goal of tailoring VportReq to provide levels of performance dependent on the VportAv available to the transmitter. Such an operational decision mode may, for example, include simple selection among discrete configurations pre-compiled into a look-up table. Each configuration in this lookup table arrangement may specify a load expected when operating in the given configuration. The minimal compliment of configurations available in the table would include a power-up configuration and a minimum acceptable operational performance level for the transmitter. A power-up configuration minimizing the transmitter power requirement during start-up would be useful to lower VportReq as low as possible to permit capability assessment to be carried out with the minimal VportAv over the fault current region. The minimal acceptable operational performance configuration represents the minimum VportReq across the entire ILoop operating range and hence, the minimal VportReq defining a "go or no-go" condition. Other configurations might define transmitter load requirements for performance improvements of select subsystems. An operational capability analysis with multiple configurations may be performed. A configuration may be selected which is the highest performance configuration that can be supplied by the loop. Transmitter operational capability assessment facilitates automated determination of the external loops capability to support defined load configurations of the transmitter. This capability affords opportunities for multiple applications ranging from simple fault detection to potential implementation of more advanced performance vs power optimization schemas.

Figure 2E:
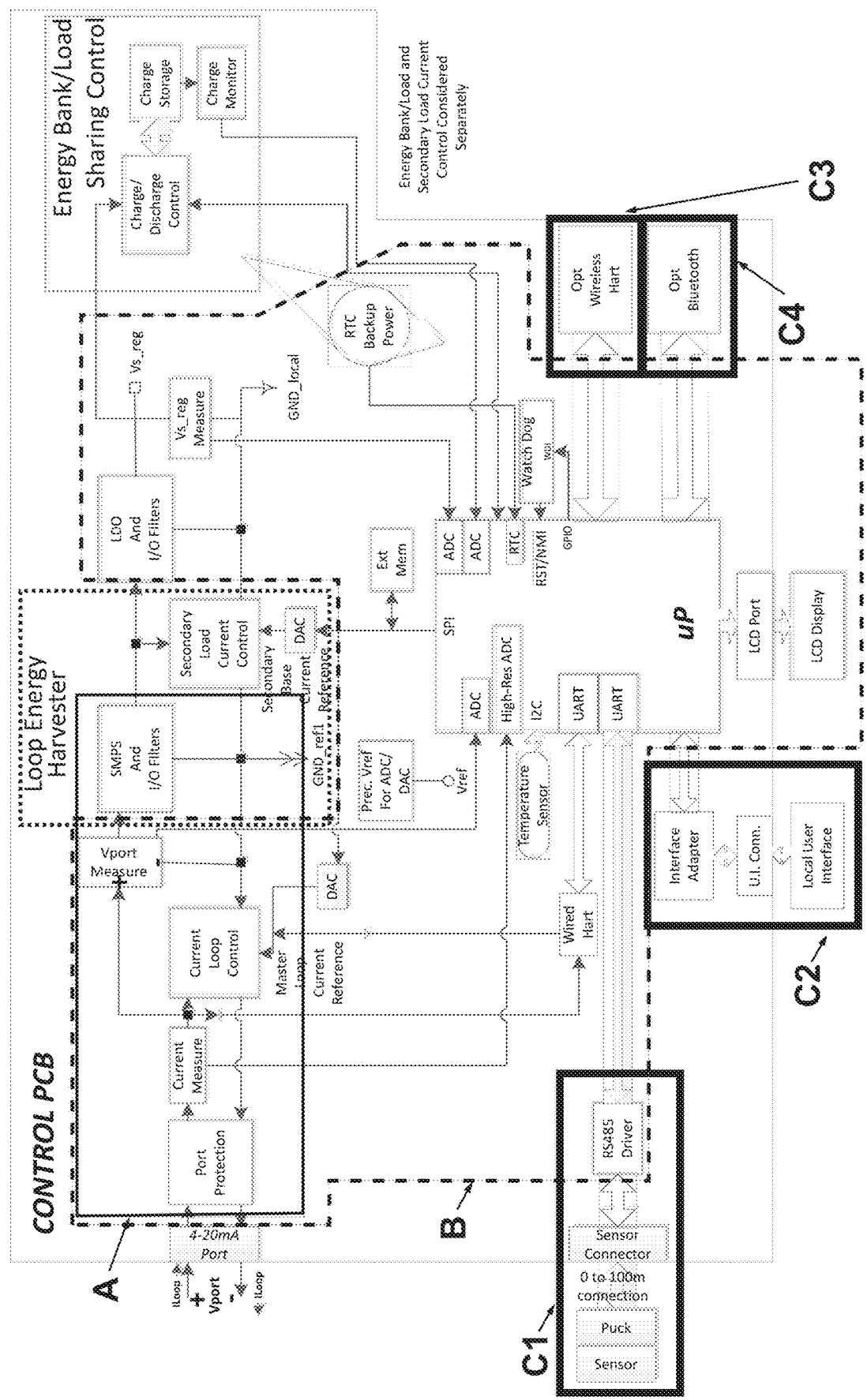
FIG. 2E illustrates another block diagram of a representative embodiment of a 2-wire current loop hereof partitioned for analysis of loads on the system and power requirements.

The above considerations and requirements are discussed further below in terms of partitioning in a transmitter system between "base" transmitter load requirements and an enumeration of options and proposed features/loads that incrementally increase that base load. Such a partitioning is illustrated in FIG. 2E. The partition labeled A in FIG. 2E may be represented by the port power estimation model illustrated in FIG. 16A that represents the associated port current control and power conversion block. As discussed above, this model is represented by a set of system equations that may be used to project the base and secondary loads connected to the transmitter through the power conversion stage to the transmitter port (equations A through I of FIG. 12). Once again, this model also allows examination of the impacts of power converter efficiency ($\eta$ or "eta") and primary voltage limits as those variables are projected to the transmitter port. Conversely, the power made available by the external loop may be projected through these equations to constraints on the power converter and the transmitter secondary load. Power losses from the port to the transmitter loads are also encapsulated in the model. In addition to its usefulness in estimation, the model of FIG. 16A may also be used as part of a model-predictive control regulating the power converter primary (IPrimary and VPrimary) to maximize the secondary current (ISecondary) produced from the port power at the loop current setpoint (ILoop). As an example, in a number of embodiments, a maximum available Isecondary can be calculated/predicted by finding the ISecTarget that maximizes the power converter primary power PPrimMax=VPrimaryMaxAv*IPrimaryReqMin for a given power converter efficiency ($\eta$) with the IPrimaryCmd set to "Max" and the Vport argument in the VPrimaryMaxAv equation set to VportAv (see equations C, G and A of FIG. 12).

As described above, the purpose of the SMPS is to convert a portion of the power available at the transmitter port Pport to secondary current ISecondary to supply internal transmitter circuitry and sensor loads. A generic SMPS model is, for example, shown in context connected to the transmitter port and external 4-20 mA loop in the port power estimation model of FIG. 16A. Characteristics for important parameters identified in FIG. 1A are illustrated graphically in FIGS. 17A, 17B, 17C and 17D. The case represented in those figure results from the following conditions: Vext (external loop supply) is 24V, Rloop is 500 ohm measuring resistor plus 1000 ft of 22 AWG wire (total 516$\Omega$), the secondary load (ISecondary) is 4 mA, the secondary voltage (VSecondary) is 4.5V and a Buck converter SMPS is use at 90% efficiency ($\eta$).

Referring to the parameters identified in, for example, FIG. 16A, the general equation for secondary current for the may be expressed as:

$$ISecondary=VPrimary*IPrimary*\eta/VSecondary$$

Figure 17A:
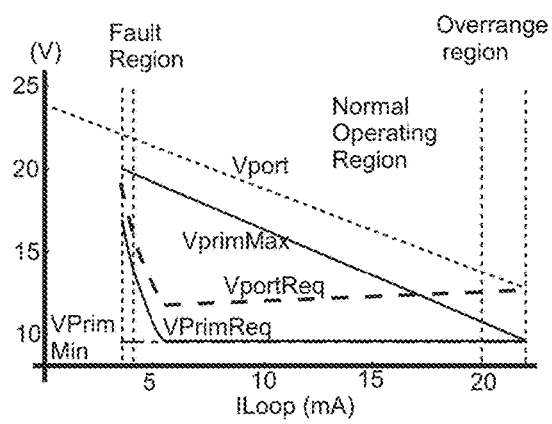
FIG. 17A illustrates primary and port voltage characteristics vs ILoop for a first Buck converter.

VPrimary is the converter primary voltage. Limits associated with VPrimary are depicted in FIG. 17A. The maximum boundary imposed upon VPrimary is VPrimMax, as modeled in equation F of FIG. 12 where, specifically, Vport is set to VportAv (equation A of FIG. 12), and IPrimaryCmd is set to "Max". VPrimMax is constrained to be less than the transmitter port voltage Vport. As discussed previously, the steady state available port voltage VportAV is determined by equation A of FIG. 12. To deliver the required ISecondary with a given VSecondary, IPrimary and efficiency $\eta$, VPrimary must exceed the limit defined by VPrimReq as follows:

$$VPrimary \geq VPrimReq=VSecondary*ISecondary/(IPrimary*\eta)$$

VPrimary is also limited by the lowest voltage at which the converter can operate and still supply VSecondary. Since VPrimary is less than Vport, this minimum VPrimary limit (designated VPrimMin herein and identified as VPrimSMPSMin in the equations of FIG. 12) for the SMPS can project limitations on the minimum VportReq. The governing steady state equation for VPortReq is specified in equation H of FIG. 12. For operation VPrimary$\geq$VPrimReq$\geq$VPrimMin. Since Vport>VPrimary, the required SMPS primary voltage needed to sustain the secondary load demand VPrimReq and the SMPS minimum primary voltage VPrimMin impose minimum bounds VportReq on Vport to sustain transmitter operation across the full range of ILoop as follows:

$$Vport \geq VportReq > VPrimary \geq VPrimReq \geq VPrimMin.$$

As indicated in FIG. 17A, for a given port supply voltage and loop resistance, the efficiency of the power converter is typically the most limiting factor at low ILoop while the power converter minimum primary voltage (VPrimMin) tends to be most limiting at high loop currents.

Figure 17B:
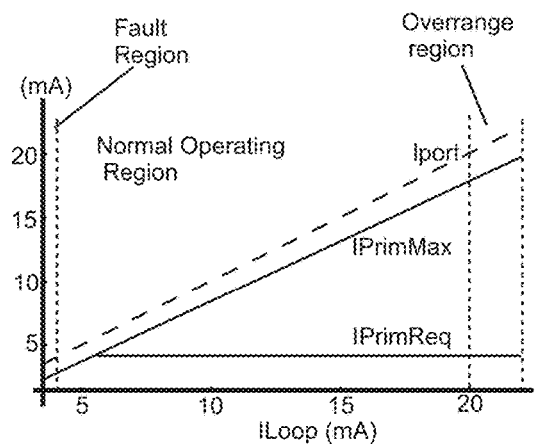
FIG. 17B illustrates primary and port current characteristics vs ILoop for the first Buck converter.

As set forth above, IPrimary is the converter primary current. Limits associated with IPrimary are depicted in FIG. 17B. The maximum IPrimary (IPrimMax) is limited by losses in the transmitter to a value less than the transmitter port current Iport (ILoop) as modeled in the steady state equation C of FIG. 12. To sustain SMPS operations for a given ISecondary load current, IPrimary must be kept at or above a minimum current IPrimReq (see IPrimaryReqMin equation G of FIG. 12). As also set forth above, VSecondary is the converter secondary voltage. This voltage is typically fixed at design to a voltage sufficient to meet or exceed the voltage overhead of all the secondary loads. Once again, η is the conversion efficiency, and accounts for the power losses within the SMPS to convert primary power to secondary power wherein:

η=VSecondary*ISecondary/(VPrimary*IPrimary)
=PSecondary/PPrimary.

Figure 17C:
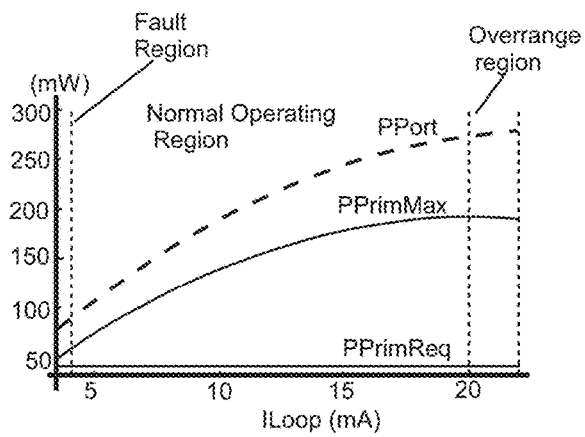
FIG. 17C illustrates primary and transmitter port power characteristics for the first Buck converter.
Figure 17D:
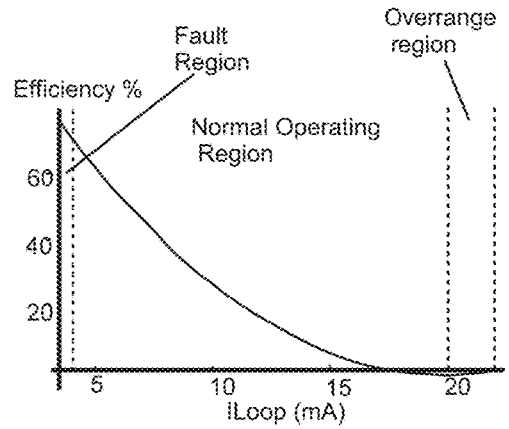
FIG. 17D illustrates SMPS efficiency ($\eta$) required to produce uniform power equal to power at ILoopMax across the entire operating range of ILoop.

The power converter efficiency η imposes a limit on the minimum primary power PPrimReq required to be delivered to the SMPS primary to sustain transmitter operations at a given ISecondary load. (see FIG. 17C). The PPort curve of FIG. 17C is modeled by the product of ILoop*VportReq with IPrimaryCmd set to "Max" (see equation H of FIG. 12), the PPrimMax curve modeled by IPrimaryMax*VPrimaryMaxAv with IPrimaryCmd set to "Max" (see equation F FIG. 12) and the PPrimReq curve modeled as VPrimaryReqMin*IPrimaryReqMin with IPrimaryCmd set to "Max" (see equation G of FIG. 12). Since, as depicted in FIG. 17C, less power Pport is available at the port and subsequently less power PPrimMax is available to the SMPS primary as ILoop decreases, η must be higher at lower ILoop currents to deliver the same amount of secondary power PSecondary and current ISecondary relative to the amount deliverable at high ILoop. As evident for the equation for VPrimReq above, higher η results in lower VPrimReq and, consequentially, lower VportReq. As indicated in FIG. 17A, η is the dominating factor affecting the minimum VPrimReq and VportReq at low ILoop current.

Summarizing the above information as applied to SMPS topology selection and design, the characteristics are important considerations. In a number of embodiments, it is desirable that VPrimReq be as low as possible across the operating range of ILoop to keep VPortReq as low as possible. Lowering VPortReq allows higher loop resistance (wherein RLoop=Rmeasure+Rwire) to be accommodated for a given loop power supply voltage Vext. The greater latitude for increased Rwire translates into longer possible loop distances and/or smaller wire gauges that may be accommodated. Since VPrimReq>VPrimMin, an SMPS topology/design affording low VPrimMin allows VPrimReq and VportReq to be lower across the operating range of ILoop. The impact is most significant at higher ILoop as indicated in FIG. 17A. Since VPrimReq is reduced with higher η, an SMPS topology/design affording high efficiency across the operating range of ILoop is desirable. Again, in a 2-wire application, this is most impactful at low ILoop. Another consideration is the maximum voltage the SMPS primary can sustain without damage (which is designate as the VPrimMaxLimit). This parameter, and the maximum voltage tolerated by the components connecting the SMPS primary to the transmitter port define the maximum voltage limit at Vport (VportMax). Since Vport rises to Vext when ILoop=0, VportMax and VPrimMaxLimit define the maximum Vext that can be supported by the transmitter.

Figure 18:
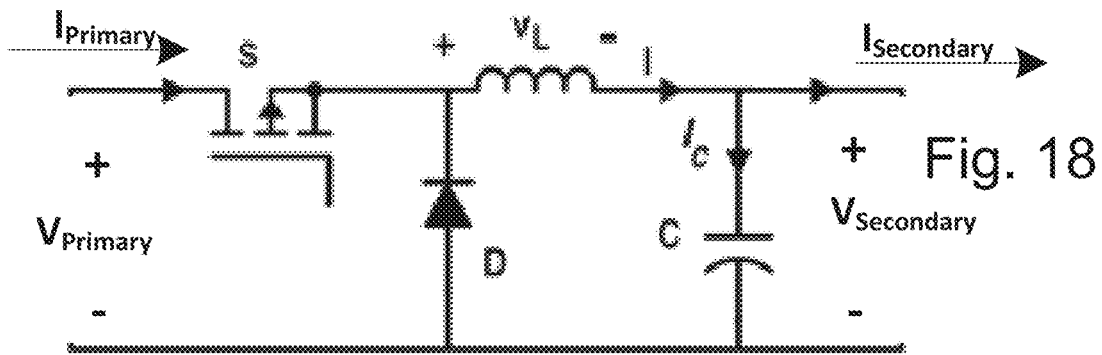
FIG. 18 illustrates schematically a circuit representation of a Buck converter.

The buck converter, illustrated schematically in FIG. 18, regulates a higher VPrimary to a Lower VSecondary. In this topology, VPrimary must be strictly higher than VSecondary so that VPrimMin>VSecondary sets the lowest possible boundary for VPrimReq and VPortReq. Buck converters can have efficiencies in excess of 90%. This high efficiency is most beneficial to the 2-wire application where it results in reduced VPrimReq and VportReq for higher secondary loads ISecondary at low ILoop. Small form factor Buck controllers appropriate to the 2-wire application can support reasonably high maximum primary voltages (VPrimMaxLimit). The first buck controller incorporated in an embodiment of a 2-wire system hereof supports up to 42V. In the system analysis set forth herein, that Buck converter is designated "First Buck" with VPrimMin=9.5V. The Buck converter designated "Second Buck" examines the impacts of lowering VPrimMin on the existing design to 7.5V. There are limitations impacting component size needed to accomplish such a lowering of VPrimMin which must be accommodated. The estimates set forth herein are made with Buck converter η=90%.

Figure 19:
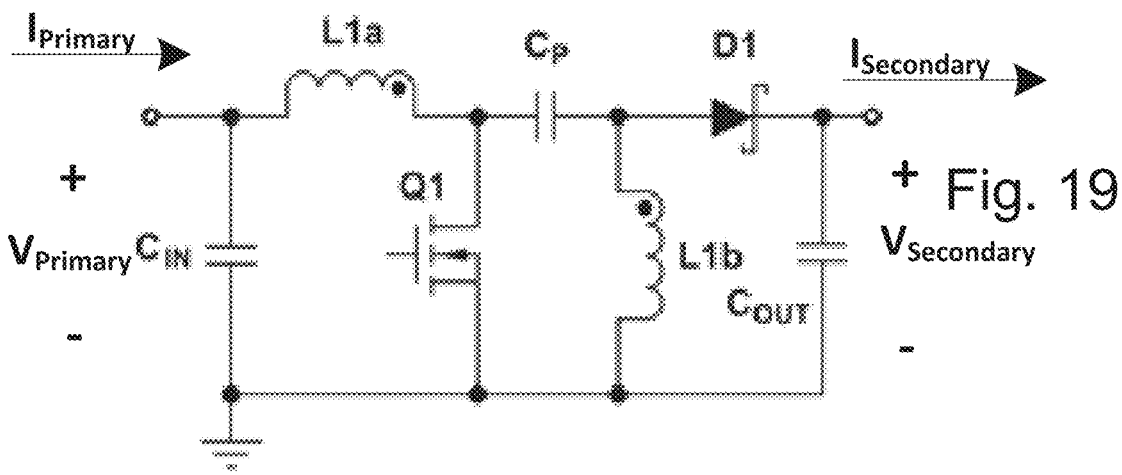
FIG. 19 illustrates schematically a circuit representation of a SEPIC converter.

The SEPIC converter illustrated in FIG. 19 is an example of a Buck-Boost topology. Unlike the Buck converter, this topology is capable of supporting primary voltages VPrimary that are both above and below VSecondary. The ability to support VPrimary<VSecondary affords opportunity, under certain ISecondary load circumstances, to beneficially reduce VPrimReq and VportReq. However, it is difficult to achieve high efficiency with this topology so that practical implementation for this application is limited to η≤75%. Because of the lower efficiency, VportReq can be higher for the SEPIC converter, despite the lower VPrimMin, at lower ILoop for large ISecondary loads. The SEPIC efficiency used in this system analysis is η=75%. As a further consideration, the SEPIC converter has inherent IPrimary noise characteristics that are more favorable to the needs of the 2-wire transmitter system.

Figure 20A:
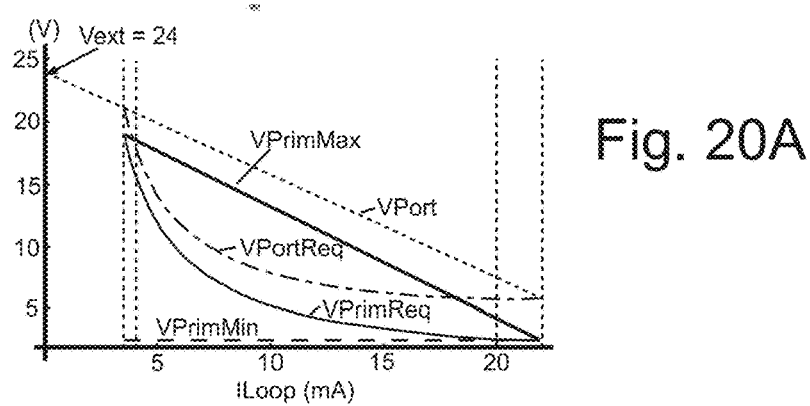
FIG. 20A illustrates SEPIC SMPS primary and port voltage characteristics vs ILoop.

To illustrate the contrast on the voltage characteristics of the SMPS and Vport with the SEPIC converter replacing the Buck converter, the characteristics shown for the Buck regulator in FIG. 16A are set forth in FIG. 20A with a SEPIC converter. Because of the lower VPrimReq and VportReq at high ILoop, the external load resistance with the same secondary load as the Buck converter can be increased from 516Ω to 825Ω, which translates into an additional loop length of 9572 ft beyond the 1000 ft possible with the Buck converter. However, it is important to note that the sharp rise of VPrimReq and VportReq at low ILoop when the ISecondary load is increased results in a reversal of optimal SMPS choice for higher ISecondary.

Figure 20B:
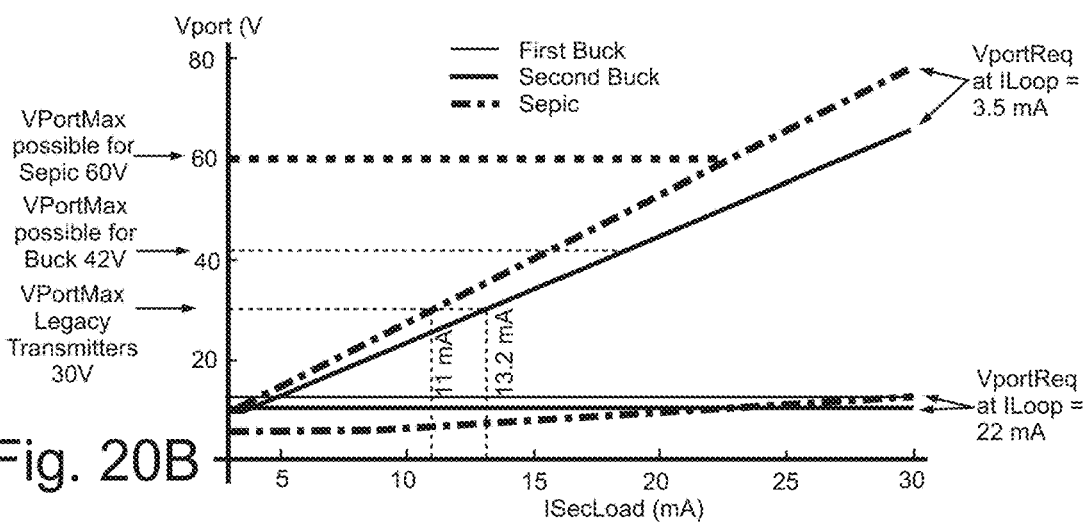
FIG. 20B illustrates a comparison of $Vport_{Req}$ for three SMPS designs (a first Buck converter, a second Buck converter, and a SEPIC converter) at 3.5 and 22 mA.

Which SMPS topology is best suited for the 2-wire transmitter systems hereof is dependent on the 4-20 mA loop supply, loop load and ISecondary. Referring to the VportReq lines in FIGS. 16A and 20A, the Buck converter can deliver the maximum secondary power for situations where the Vport load line intersects VPortReq at the minimal Loop current. The SEPIC is more suitable in instances where Vport intersects VportReq at the maximum ILoop current. FIG. 20B illustrates differences in VPortReq vs ISecondary at 3.5 mA and 22 mA for the two Buck configurations studied herein and the SEPIC configuration. The intersection of VportReq for all three configurations, when ILoop=3.5 mA with a Vport of 30V, is illustrated by the dashed lines. As a result of its lower efficiency, the VportReq for the SEPIC intersects the 30V line at a lower secondary load current (that is, at ~11 mA) while both Buck converters (each having the same top intersection because each has the same efficiency) intersect at a hither secondary load current (that is, at ~13.2 mA). Since the VportReq at ILoop=22 mA (shown at the bottom of the graph of FIG. 20B) is lower than either Buck regulator, the SEPIC is clearly more optimal for ISecondary≤11 mA at VportMax=30V. For ISecondary>11 mA, the Buck topology is likely to be more optimal at a VportMax of 30V. The interplay of loop voltage, load and VportReq vs ISecondary are important factors when determining the appropriate SMPS topology and the general feasibility of incorporating various transmitter features/ loads with higher ISecondary demands. To cover the broadest range of features, it may be preferable to partition the SMPS onto a separate printed circuit board or PCB that plugs into the transmitter main PCB to enable a SEPIC converter to be used for low to medium secondary loads to maximize loop distance and a Buck converter to be used to support features drawing high secondary current.

In another alternative to, for example, buck converters and SEPIC converters, a switched capacitor converter may be used as a power converter in the systems hereof. As known in the art, capacitive voltage conversion may, for example, be achieved in a switched capacitor (voltage) converter by switching a capacitor periodically.

The partition labeled B in FIG. 2C includes the components and peripherals defining a core transmitter load. Generally, those components conform to the constant load category described above. The user input interface is separately partitioned for the convenience of examining different options. Likewise, sensor loads are also excluded from the core transmitter load.

A proposed budget allocating Isecondary current to key categories of secondary peripherals is enumerated in Table 1. As indicated, the total budget apportioned to the base secondary load in this analysis is 1.865 mA.

TABLE 1

2-Wire Transmitter Standard
Secondary Load Estimate
Note: Does not include the main
power supply/energy harvester
overhead or UI input options

| | ISecBudget uA | Notes |
|---|---|---|
| uP PeripheralIs | | |
| Ext Watchdog | 35 | |
| Secondary Lin Regulation and Measurement | 180 | |
| Precison Ext Reference for ADC | 180 | |
| Misc | 50 | |
| LCD Display | 100 | |
| Wired Hart | 300 | |
| 4_20 mA Circuit Port Secondary Current | 120 | |
| Sensor Port Support DC Current | 100 | Dynamic 485 current allocated to sensor and is not included here |
| uP Core Budget | 800 | |
| Subtotal w/o User Interface Buttons or Sensor | 1865 | |

Figure 21A:
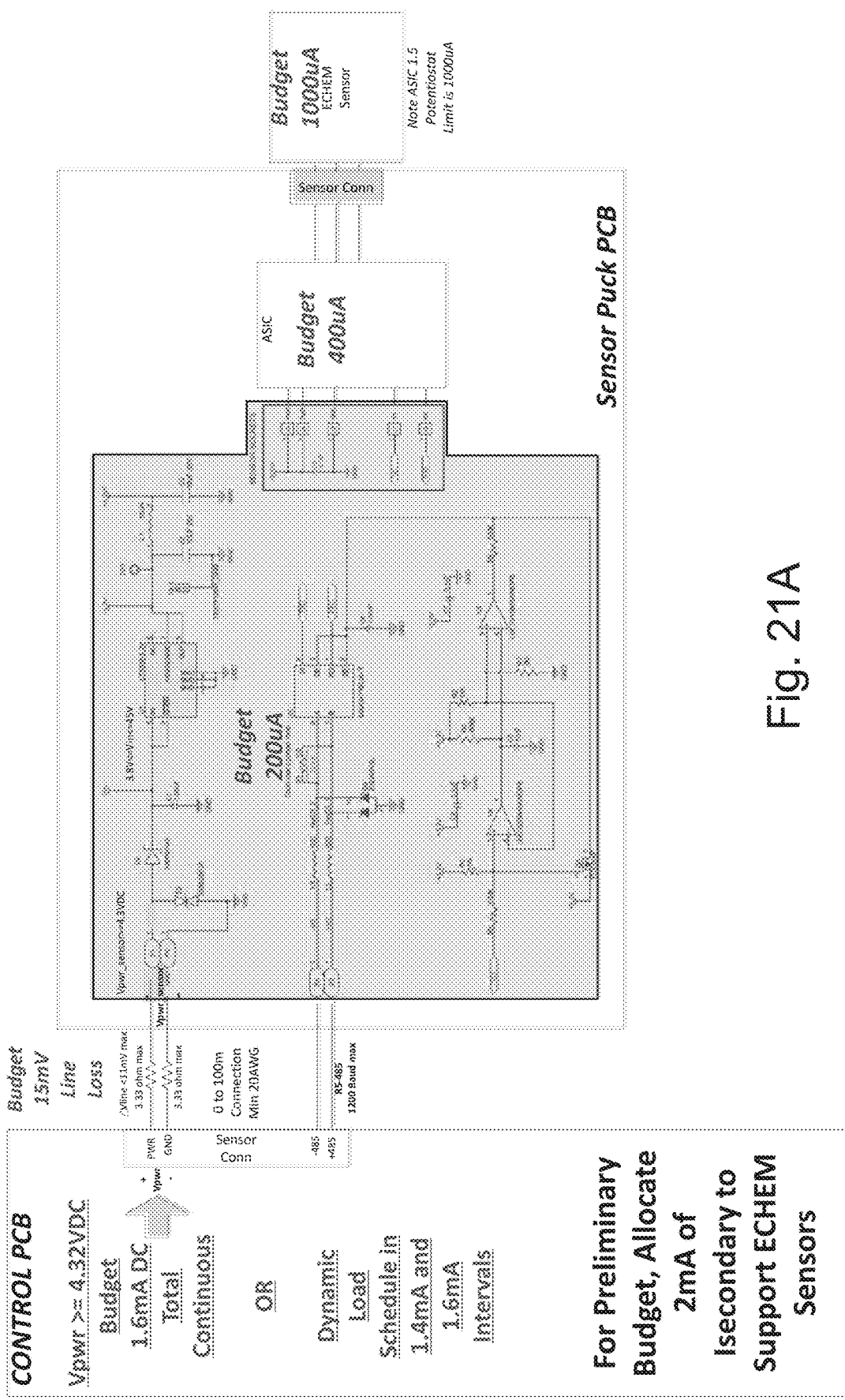
FIG. 21A illustrates a worst case load estimate for a transmitter including an electrochemical gas sensor connected thereto.
Figure 21B:
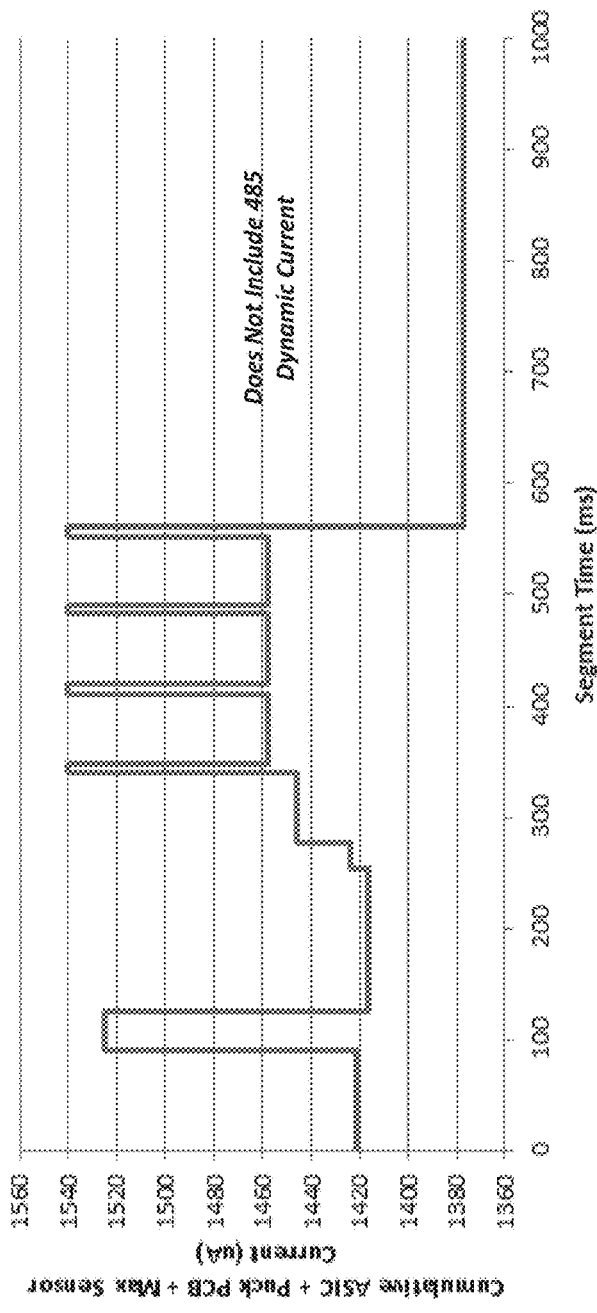
FIG. 21B illustrates the electrochemical gas sensor dynamic current at a 1 second sampling interval for the electrochemical gas sensor include in the estimate of FIG. 21A.

Optional and/or variable features/loads in FIG. 2E are designated with the label C. For, example, the partition labeled C1 in the lower left corner of FIG. 2E encompasses the portion of the total transmitter secondary load allocated to the sensor. The sensor load may, for example, be based on an estimated worst case load presented by a certain sensor. FIGS. 21A and 21B illustrates a worst case load estimate for an electrochemical or Echem sensor with a support sensor puck (the support sensor puck representing a printed circuit board with the electronics that support operation of the sensor). The load tallied in FIGS. 21A and 21B includes dynamic current consumed on the transmitter control board for transmitter communications. For a preliminary budget, the total transmitter secondary current budgeted to the sensor for the analysis was established as 2 mA.

The partition designated C2 at the bottom of FIG. 2E captures the portion of the total transmitter secondary load allocated to a user input interface. Three different user input interface options are discussed herein. The secondary current estimate for each of those user interface options is then tallied with the estimates for the base transmitter loads and the electrochemical sensor load into a total secondary load estimate. Each total secondary load estimate is then projected to the transmitter port via the port power estimation model described in connection with FIG. 16A to determine the port requirements to support the collective system. The projected port requirements are generated three times to examine the merits of three different switch mode power supplies (SMPS). These SMPS include a first Buck converter having a minimum primary voltage of 9.5V and 90% efficiency, a second Buck converter having a minimum primary voltage of 7.5V with a 90% efficiency, and a SEPIC including single-ended primary converter topology with a minimum primary voltage of 2.5V and an assumed 70% efficiency. The secondary voltage (Vsecondary) is 4.5V for all estimates. Maximum loop length estimates are generated for each SMPS case with a 250 ohm measurement resistance and a loop including 22 and 18 AWG copper wire.

Figure 22A:
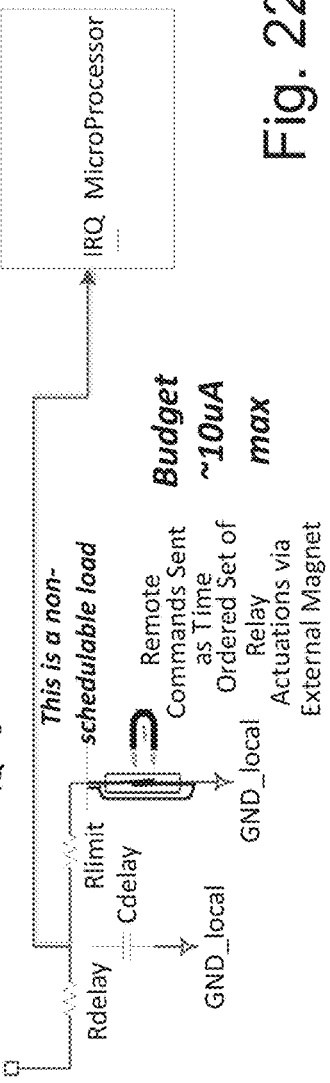
FIG. 22A illustrates an embodiment of a representative load in the form of a reed relay and magnet user input interface and an estimate of associated required secondary current.

FIG. 22A illustrates schematically a simple magnetic user input interface. That type of user interface is often used in explosion-proof designs and includes a simple reed relay actuated by a handheld magnet. This type of interface requires the user to have access to a tool (the magnet) and tends to respond more sluggishly than the other two input interface embodiments discussed below. As illustrated in FIG. 22A, this interface draws very little secondary current (drawing switch current only when the reed relay is closed by the magnet) and represents the lowest power option among the three user interface options considered herein. Combining the 10 uA allocated for this interface with the currents partitioned to the base transmitter and the electrochemical sensor results in a total transmitter secondary current estimate of 3.875 mA.

Figure 22B:
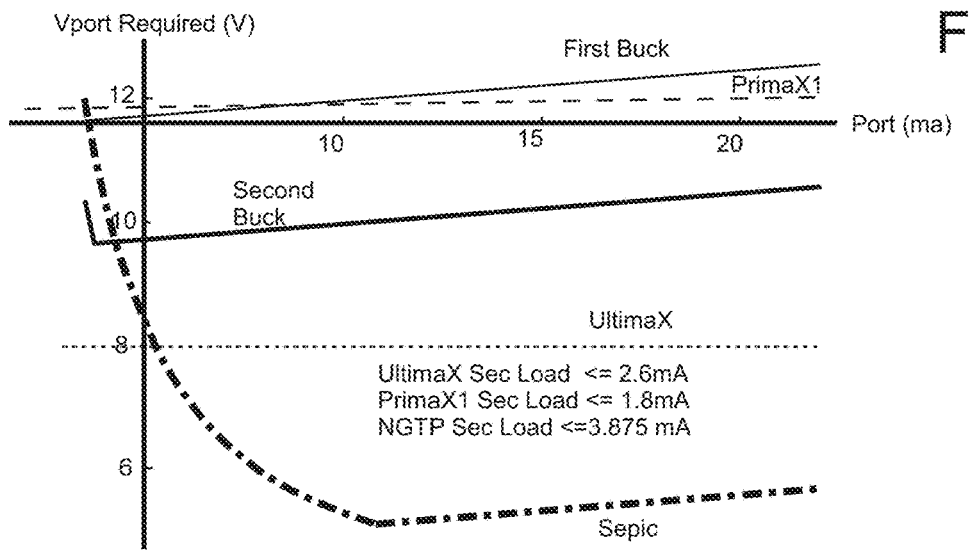
FIG. 22B illustrates port voltage requirements vs. loop current (Iport) with the magnet user input interface of FIG. 22A.
Figure 22C:
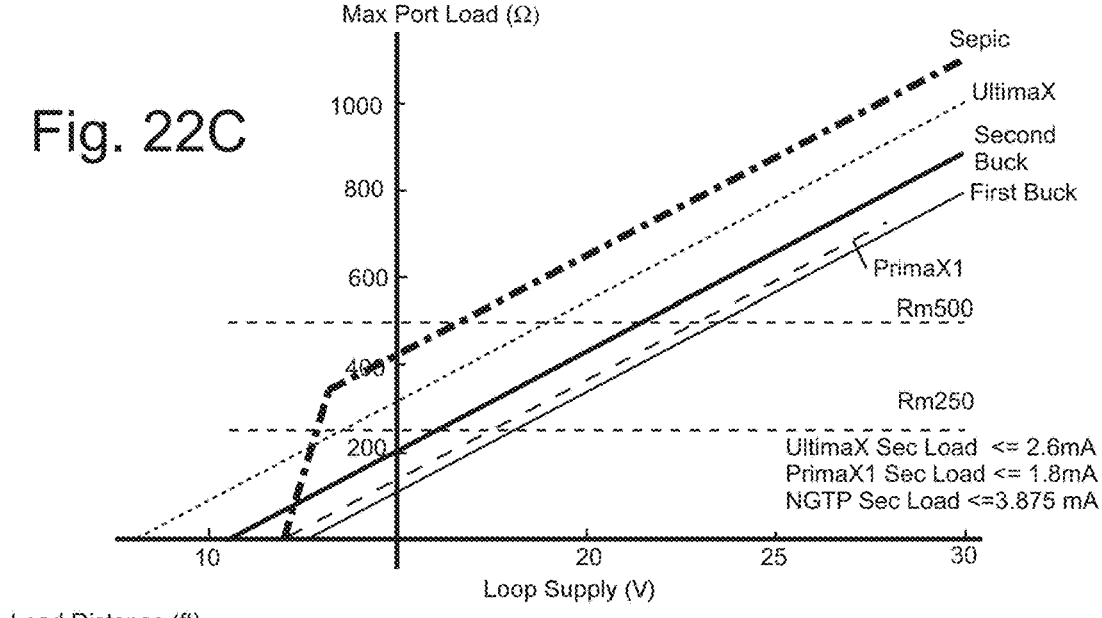
FIG. 22C illustrates port load capability vs loop supply voltage with the magnet input interface of FIG. 22A.
Figure 22D:
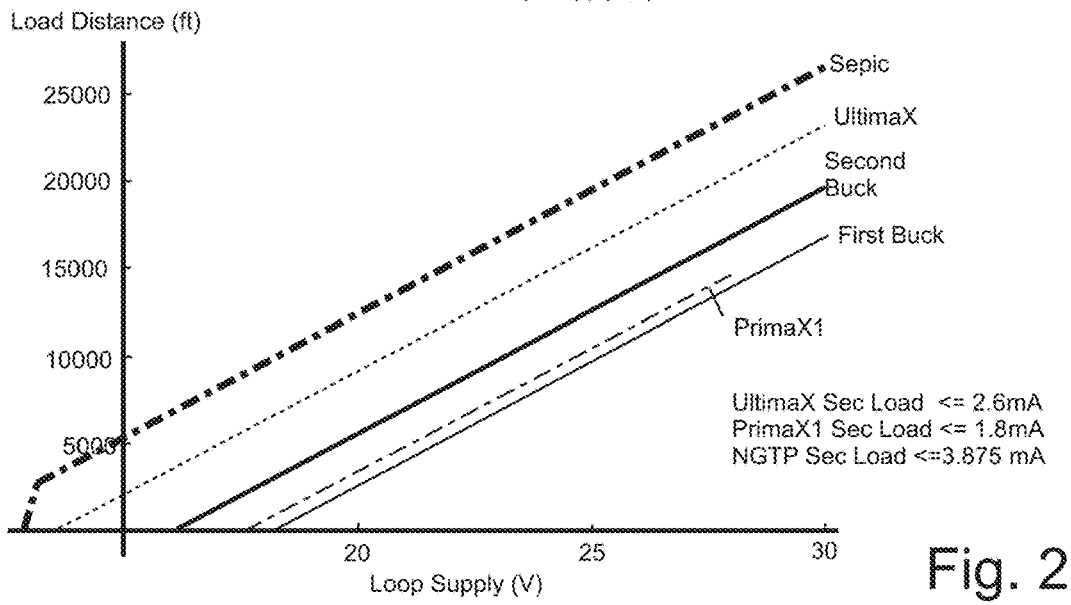
FIG. 22D illustrates loop length capability with a 24V supply and a 250 ohm measurement resistor with the magnet input interface of FIG. 22A.

The port voltage required to support the secondary current load and internal power supply primary requirements is depicted in FIG. 22B. The maximum estimated port load and loop distance capabilities vs loop supply voltage are illustrated in FIGS. 22C and 22D. Legacy 2-wire systems used in connection with the ULTIMA® X and PRIMAX® I sensor systems available from MSA Safety Incorporated of Cranberry Township, Pa. are included as benchmarks for study of transmitter replacement. Port voltages (VportReq) required at the prescribed ILoop limits (Iport) and loop length estimates for the three power converter designs (SMPS) are set forth in Table 2 of FIG. 22E.

Operational and power requirements for other features/loads for inclusion in systems hereof include: BLUETOOTH low energy (BLE), wireless HART, a combustible gas sensor, a backlit LCD, blockage detection and other display options. There are a significant number of variables and factors that may affect power versus performance for such features/loads. System analysis indicated that BLE, Wireless HART and a combustible gas sensor may be supported (powered) on the 2-wire transmitter system hereof given specific constraints on the power made available at the transmitter 4-20 mA port. LCD backlighting is also possible. The power demands for an OLED display may, for example, fall outside the practical boundaries for a 2-wire transmitter. Blockage detection as, for example, disclosed in U.S. Patent Publication Nos. 2017/0227498 and 2017/0227499 using sensors developed for a 3-wire system may not be supported on the 2-wire systems hereof, but such detection methodologies may be supported with sensors designed to work with the 2-wire systems hereof.

Table 3 sets forth estimates for practical power budgets to support BLE, Wireless HART and the an SGX hotplate combustible gas sensor or pellistor available from SGX Sensortech, SA of Corcelles-Coromondreche, Switzerland. Configuration and operational settings required to realize higher performance for such load will increase the power demand. The Total ISecondary and loop distance estimates assume the feature/load is connected to a transmitter with an IR touchscreen and an electrochemical sensor.

TABLE 3

| Feature/Load | Feature/Load ISecondary | Total ISecondary | VLoop | SMPS | VPrimReq | Max Loop Distance (ft) | Max Loop Distance UltimaX (ft) |
|---|---|---|---|---|---|---|---|
| BLE | 500 uA | 4.58 mA | 24 V | First Buck | 12.56 | 8371 | 14785 |
|  |  |  |  | Second Buck | 11.83 | 11170 |  |
|  |  |  |  | SEPIC | 13.8 | 18000 |  |
| WirelessHART | 850 uA | 4.925 mA | 24 V | First Buck | 12.58 | 8366 |  |
|  |  |  |  | Second Buck | 12.58 | 11164 |  |
|  |  |  |  | SEPIC | 14.67 | 17979 |  |
| WirelessHART + BLE | 1.35 mA | 5.425 mA | 24 V | First Buck | 13.64 | 8359 |  |
|  |  |  |  | Second Buck | 13.64 | 11155 |  |
|  |  |  |  | SEPIC | 15.94 | 17947 |  |
| SGX Combustible | 5 mA | 9.075 mA | 24 V | Second Buck | 21.38 | 8308 |  |
|  |  |  |  | Second Buck | 21.38 | 11091 |  |
|  |  |  |  | SEPIC | 25.23 | — |  |
| SGX Combustible | 5 mA | 9.075 mA | 30 V | First Buck | 21.38 | 16757 | 23234 |
|  |  |  |  | Second Buck | 21.38 | 19540 |  |
|  |  |  |  | SEPIC | 25.23 | 25864 |  |

As set forth above, in a number of embodiments, the energy harvesting system hereof are used in connection with a combustible gas sensor. The combustible gas sensor may, for example, be a low-power combustible gas sensor including a microminiature pelement system, a microelectronic mechanical systems (MEMS) or a micro-hotplate sensor as, for example, disclosed in U.S. Pat. No. 8,826,721. Although such sensors are relatively low-power (in comparison to convention combustible gas sensors including pelements), in many embodiments of systems hereof, the sensor will use most of the power harvested from the current loop.

Low thermal time constants associated with low thermal mass sensors assist in providing quick response times, reducing the time an element may be unavailable for use in a detection mode and decreasing power requirements. In a number of embodiments, sensors hereof have a sensing element having a thermal time constant of 8 second or less, 6 seconds or less, 1 second or less, 0.5 seconds or less or 0.250 second or less. A low thermal mass/low thermal time constant sensor may, for example, include a MEMS pellistor as described above or a microminiature pelement of low thermal mass to provide a low thermal time constant. As used herein the thermal time constant of an element is defined as the time required to change 63.2% of the total difference between its initial and final temperature when subjected to a step function change in drive power, under zero power initial conditions. MEMS pellistors typically have a lower thermal time constant than low-thermal-mass pelements. MEMS pellistors may, for example, have thermal time constants of 1 second or less, 0.5 seconds or less or 0.250 second or less.

In general MEMS elements for sensors hereof have a dimension less than 1 mm. Such element may be manufactured via a microfabrication technique. In a number of representative embodiments, sensing elements may be manufactured with a thick film layer suitable to cause combustion of an analyte gas upon heating to a predetermined temperature. Sensor elements hereof may be powered to an operating temperature by resistive heating and to detect combustible gases analytes. In a number of representative embodiments, the thickness and diameter for a MEMS hotplate oxidative film is 15 microns and 650 microns, respectively.

In a number of embodiments, beads or pelements of low thermal mass and having low thermal constants as described above may be used as trigger sensor elements as well as primary sensor element hereof. Low-thermal-mass/low-thermal-time constant pelements are, for example, discussed in U.S. Pat. No. 8,826,721, the disclosure of which is incorporated herein by reference. Such pelements may, for example, have a diameter less than 500 μm or have a volume less than a sphere having a diameter 500 μm.

Catalytic or combustible (flammable) gas sensors have been in use for many years to, for example, prevent accidents caused by the explosion of combustible or flammable gases. In general, combustible gas sensors operate by catalytic oxidation of combustible gases.

The operation of a catalytic combustible gas sensor proceeds through electrical detection of the heat of reaction of a combustible gas on the oxidation catalysts, usually through a resistance change. The oxidation catalysts typically operate in a temperature above 100° C. (and more typically about 300° C.) to catalyze combustion of an analyte (for example, typically in the range of 300 to 700° C. temperature range for methane detection). Therefore, the sensor must sufficiently heat the sensing element through resistive heating. In a number of combustible gas sensors, the heating and detecting element are one and the same and composed of a platinum alloy because of its large temperature coefficient of resistance and associated large signal in target/analyte gas. The heating element may be a helical coil of fine wire or a planar meander formed into a hotplate or other similar physical form. The catalyst being heated often is an active metal catalyst dispersed upon a refractory catalyst substrate or support structure. Usually, the active metal is one or more noble metals such as palladium, platinum, rhodium, silver, and the like and the support structure is a refractory metal oxide including, for example, one or more oxides of aluminum, zirconium, titanium, silicon, cerium, tin, lanthanum and the like. The support structure may or may not have high surface area (that is, greater than 75 $m^2$/g). Precursors for the support structure and the catalytic metal may, for example, be adhered to the heating element in one step or separate steps using, for example, thick film or ceramic slurry techniques. A catalytic metal salt precursor may, for example, be heated to decompose it to the desired dispersed active metal, metal alloy, and/or metal oxide.

As illustrated in FIGS. 23A and 23B, a number of conventional combustible gas sensors such as illustrated sensor 10 typically include an element such as a platinum heating element wire or coil 20 encased in a refractory (for example, alumina), microminiature bead 30, which is impregnated with a catalyst (for example, palladium or platinum) to form an active or sensing element, which is sometimes referred to as a pelement 40, pellistor, detector or sensing element. A detailed discussion of pelements and catalytic combustible gas sensors which include such pelements is found in Mosely, P. T. and Tofield, B. C., ed., *Solid State Gas Sensors*, Adams Hilger Press, Bristol, England (1987). Combustible gas sensors are also discussed generally in Firth, J. G. et al., *Combustion and Flame* 21, 303 (1973) and in Cullis, C. F., and Firth, J. G., Eds., *Detection and Measurement of Hazardous Gases*, Heinemann, Exeter, 29 (1981).

Bead 30 will react to phenomena other than catalytic oxidation that can change its output (i.e., anything that changes the energy balance on the bead) and thereby create errors in the measurement of combustible gas concentration. Among these phenomena are changes in ambient temperature, humidity, and pressure.

To minimize the impact of secondary effects on sensor output, the rate of oxidation of the combustible gas may, for example, be measured in terms of the variation in resistance of sensing element or pelement 40 relative to a reference resistance embodied in an inactive, compensating element or pelement 50. The two resistances may, for example, be part of a measurement circuit such as a Wheatstone bridge circuit as illustrated in FIG. 23B. The output or the voltage developed across the bridge circuit when a combustible gas is present provides a measure of the concentration of the combustible gas. The characteristics of compensating pelement 50 are typically matched as closely as possible with active or sensing pelement 40. In a number of systems, compensating pelement 50 may, however, either carry no catalyst or carry an inactivated or poisoned catalyst. In general, changes in properties of compensating elements caused by changing ambient conditions are used to adjust or compensate for similar changes in the sensing element.

Active or sensing pelement 40 and compensating pelement 50 can, for example, be deployed within wells 60a and 60b of an explosion-proof housing 70 and can be separated from the surrounding environment by a flashback arrestor, for example, a porous metal frit 80. Porous metal frit 80 allows ambient gases to pass into housing 70 but prevents ignition of flammable gas in the surrounding environment by the hot elements. Such catalytic gas sensors are usually mounted in instruments which, in some cases, must be portable or wireless and, therefore, carry their own power supply. It is, therefore, desirable to minimize the power consumption of a catalytic gas sensor.

Oxidation catalysts formed onto a helical wire heater are typically referred to as pelements, while those formed onto hotplates (whether microelectronic mechanical systems (MEMS) hotplates or conventional, larger hotplates) are sometimes known by the substrate. Oxidative catalysts formed on MEMS heating elements are sometimes referred to herein as MEMS pellistors. As described above, the detecting pelements or catalytically active hotplates can be paired with a similarly sized heater coated with materials with similar thermal conductivity as the active catalyst but without active sites. The inactive pelement or hotplate may be used to compensate for changes in ambient temperature, relative humidity, or background thermal conductivity not associated with a combustible gas and are therefore often referred to as compensators. The matched pair of detecting and compensating elements can be assembled in a Wheatstone bridge configuration for operation and combustible gas detection, which requires that both the detector and compensator operate at the same elevated temperature. The high-temperature operation of the catalytic sensing element requires a significant amount of power consumption. Power consumption is particularly a problem in the case of detecting combustible gases as detection should be performed very often or continuously to ensure a safe environment. Portable instrument and wireless installations rely on battery systems for power.

In several embodiments, pulse width modulation may be used to control the energy delivered to the hotplates. Pulse width modulation is a well-known control technique used to control the average power and/or energy delivered to a load. In embodiments hereof, a voltage is supplied to, for example, a MEMS hotplate or other heating element to heat the supported catalyst to a desired temperature. Because the pellisters or pelements hereof have relatively low thermal mass, the cycle times can be relatively short.

Heating energy (that is, heating voltage(s) or heating currents(s)) may be periodically supplied to the heating element(s) during an "ON time". Rest energy (that is, rest voltage(s) or a rest current(s)), which is less than the heating energy may be supplied during a "REST time". The total of the higher-energy or ON time plus the lower-energy or REST time correspond to a cycle time or a cycle duration. Gas concentration or the analyte is measured during the ON time. The heating energy (voltages/currents) supplied during the ON time may be constant during the ON time or may be varied (for example, supplied as heating voltage/current plateau or as heating voltage/current ramp). The rest energy (voltages/currents) may be equal to zero, or be sufficiently lower than the heating energy so that the gas sensor does not consume any gas or substantially any gas to be detected. Similar to the ON time, the rest energy supplied during the REST time may be constant during all the REST time or may be varied (for example, supplied as rest voltage/current plateau or as rest voltage/current ramp). The cycle may be repeated.

Combustible gas detectors are operated in a Wheatstone bridge as, for example, described in connection with FIG. 23B, in constant current or constant voltage. As described above, such sensors are powered to run the pelements or hotplates in, for example, a temperature range of 100–700° C. (and, more typically 350-600° C.) whenever the sensor is operational. This mode of operation may be termed a "continuous" mode of operation. An alternate operational mode, which is particularly suitable for low mass pelements or MEMS hotplates/pellistors, is to quickly heat and cool the detector in a pulsed power mode. Low mass pelements are, for example, described in U.S. Pat. No. 8,826,721, the disclosure of which is incorporated herein by reference. An advantage to operating in pulse mode is significantly lower power consumption as compared to continuous mode. Another advantage is improved span response as a result of adsorption of excess combustible gas on the catalyst at cooler temperatures during unpowered or lower powered operation (that is, during the REST time) as compared to continuously powering the catalyst at the run temperature of, for example, 350-600° C.

As used herein, the term "MEMS pellistor" refers to a sensor component with dimensions less than 1 mm that is manufactured via microfabrication techniques. In a number of representative embodiments, sensing elements formed as MEMS pellistors hereof may be manufactured with a thick film catalyst, powered to an operating temperature by resistive heating and are used to detect combustible gases. In a number of representative embodiments, the thickness and diameter for a MEMS catalyst film is 15 microns and 650 microns, respectively.

A representative embodiment of a MEMS sensor 100 suitable for use in a number of studies hereof is illustrated in FIGS. 24A and 24B. The output of MEMS pellistor 100 may, for example, be measured by connecting it as two arms of a Wheatstone bridge as described in connection with FIG. 23B. This method of measuring output is a straightforward and reliable method of comparing the relative change of a resistance.

MEMS hotplate sensor 100 may, for example, mounted on a printed circuit board or PCB 200. The two resistances of the sensing element 150 and the compensating element may, for example, be part of a measurement circuit such as a Wheatstone bridge circuit or a simulated Wheatstone bridge circuit as described above. A representative example of a MEMS hotplate sensor suitable for use herein is a SGX MP7217 hotplate sensor or pellistor available from SGX Sensortech, SA of Corcelles-Coromondreche, Switzerland. Such a MEMS hotplate sensor is disclosed, for example, in U.S. Pat. No. 9,228,967, the disclosure of which is incorporated herein by reference.

FIG. 24A illustrates a cutaway view of an embodiment of a MEMS pellistor, which includes a housing 102 having a gas inlet 110. A screen or cap 120, which may include or function as a filter 130, may, for example, be placed in connection with inlet 110. The energy (current and voltage) used in pellistor 100 may, for example, be sufficiently low to provide intrinsic safety such that a flashback arrestor, as known in the combustible gas detector arts, may not be necessary. Flashback arrestors (for example, porous frits) allow ambient gases to pass into a housing but prevent ignition of combustible/flammable gas in the surrounding environment by hot elements within the housing. One or more heating elements or hotplates 140 may be used to heat an oxidative catalyst layer 150 to operating temperature. A MEMS compensating element or compensator may be included within MEMS pellistor 100. As described above, MEMS compensator may include an inactive layer 150' which may be heated by one or more heating elements or hotplates 140'. Alternatively layer 150' may include an active catalyst and be operated at a sufficiently low temperature to prevent oxidation of combustible gas. MEMS pellistor 100 is mounted on a PCB 200 as described above. In a number of studies, a SGX MP7217 pellistor available from SGX Sensortech, SA of Corcelles-Coromondreche, Switzerland was used in the studied systems hereof.

Catalytic combustible sensors offer an end user a sensing solution which can detect a vast variety of flammable gasses. While other technologies (such as nondispersive infrared or NDIR sensors) have achieved lower power levels, they are not as broad in sensing capability as a catalytic combustible gas sensor. NDIR sensors cannot, for example, detect hydrogen, a key industrial hazard. The use of catalytic sensors has not yet been offered in a two-wire configuration because of their high power consumption. Standard or conventional catalytic permanent sensors have power requirements of 1000 mW or more. A typical portable system consumes approximately 250 mW. Sensors taking advantage of advancements in miniaturization using MEMS, miniature coils and microhotplate technologies, while operated in a continuous power mode have power requirements which are still above 100 mW. A catalytic combustible sensor solution which operates within the constraints of a two-wire system would represent a significant advancement in the art.

A pulse mode operation of a combustible gas sensor including low-thermal-mass element in which the combustible sensor is operated for a period of time short enough to measure the target gas and then discontinue its use long enough to store the power needed for the next cycle provides a solution. This operational mode is sufficiently flexible to adapt to changing measurement requirements, efficient enough to store the required power without exceeding the 4 mA operating limitations of a 4-20 mA, and electrically quiet enough not to disrupt the system integrity.

A commercially available catalytic microhotplate device (SGX MP-7217) can reach operating temperatures in 30-50 mS and stabilize in 100 mS. During this period of operation, the device would require 120 mW. When considering a typical response time requirement of 10 seconds, a desirable operating interval may, for example, be 1 second. Therefore, if the remainder of the system is active while the catalytic combustible gas sensor is in an off state, the system needs to store enough energy for the next cycle and complete any other tasks. For example, if the system uses 20 mW while the sensors is off, the average power would be [(120 mW*0.100)+(20 mW*0.900)]=30 mW and thus meet the system needs. While this is overly simplified one skilled in the art will appreciate how the goal of powering a catalytic combustible sensor within the constraints of power harvested from a two-wire system.

Figure 25:
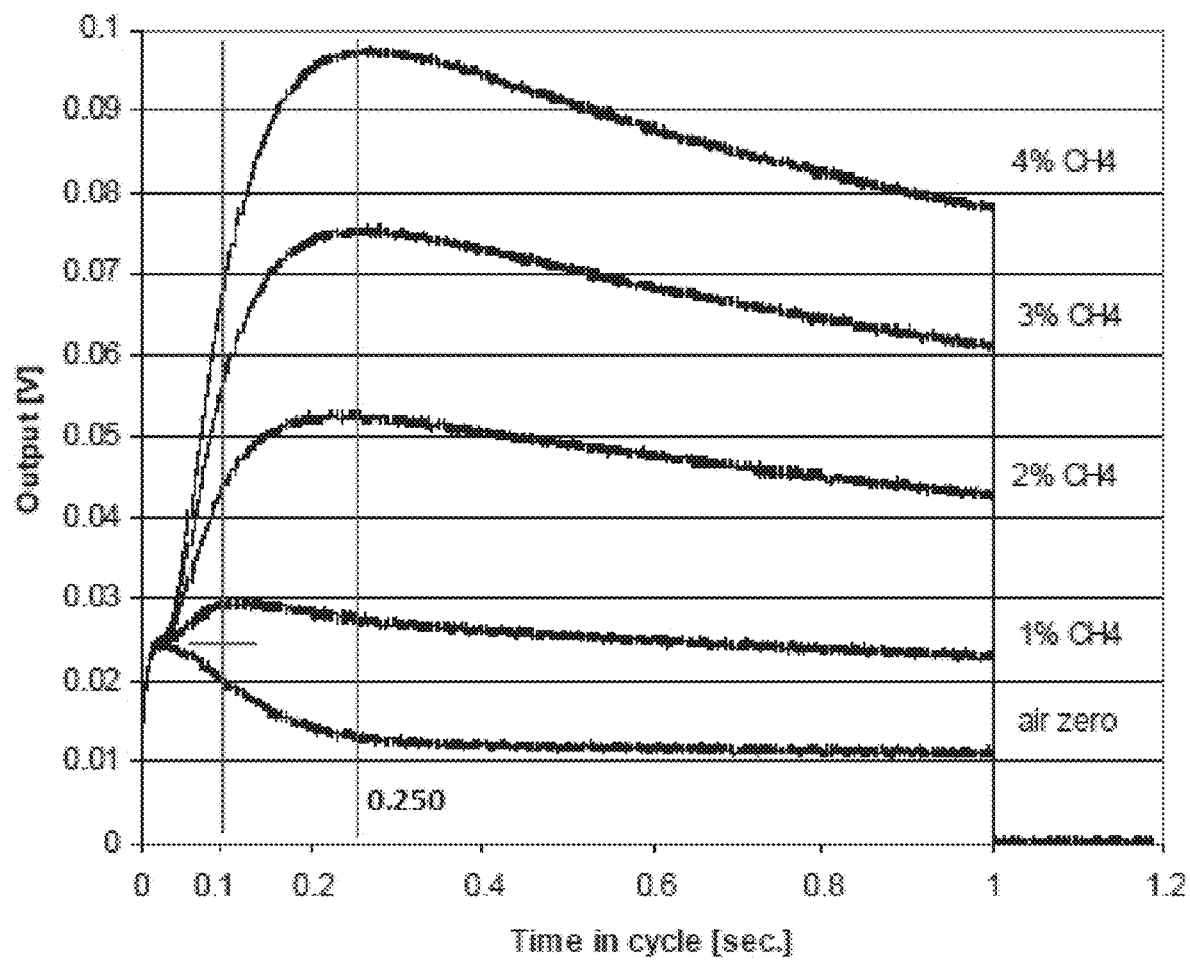
FIG. 25 illustrates a response profile at various concentration of methane for a commercially available microhotplate or MEMS device.

A collection of various methane responses is depicted in FIG. 25 for a commercially available microhotplate device (SGX MP-7217). At 100 ms, the sensor is able to discern that a gas is present, and an accurate analysis can be accomplished at 250 ms. From FIG. 25, one can conclude that the sensor would be consuming an average power of 30 mW at a 250 ms on-time interval, meeting the system requirements discussed above. Further, when the gas concentration reaches 50% as shown in Table 4 of FIG. 26, the SGX MP-7127 sensor could remain on all the time if so desired. Similar data is provided for an MSA XCell® combustible gas sensor available from MSA of Cranberry Township, Pa. in Table 5 of FIG. 27. In general, when there is gas present, the loop current will be higher and more power is available. One may, for example, shorten the duty cycle when gas is present because of in the increase in power available. One could also deploy a mixture of devices that are both lower and higher power and switch in alternate technologies as more power becomes available.

As set forth above, the devices, systems and method methodology hereof may be used in connection with any low-power combustible gas sensors. Typically, such sensors include low-thermal-mass elements such as microhotplates or microminiature coil pelements. One may merge a variety of power savings techniques such as pulse width modulation or the split bridge operation as in the apparatus used in U.S. Pat. No. 8,826,721, wherein the elements are operated independently. In a number of embodiments, the combustible gas sensor is operated so that it can be in an off state long enough to store the power required when the sensor returns to an on state. Continuous operational modes, as described above, may also be possible.

Control modes and electronics for the operation of combustible gas sensor elements suitable for use herein are, for example, disclosed in U.S. patent application Ser. Nos. 15/597,933 and 15/597,859, and U.S. Pat. Nos. 8,826,721, 4,533,520 and 5,780,715, the disclosures of which are incorporated herein by reference. Such methodologies and circuits may be readily adapted for use herein.

The foregoing description and accompanying drawings set forth a number of representative embodiments at the present time. Various modifications, additions and alternative designs will, of course, become apparent to those skilled in the art in light of the foregoing teachings without departing from the scope hereof, which is indicated by the following claims rather than by the foregoing description. All changes and variations that fall within the meaning and range of equivalency of the claims are to be embraced within their scope.

What is claimed is:

1. A system comprising a two-conductor loop in electrical connection with a power source and with a loop current controller, the loop current controller comprising a first port having a first terminal and a second terminal to connect to respective conductors of the two-conductor loop and a second port in operative connection with a sensor, the loop current controller controlling a current in the two-conductor loop to be equal to a current signal to transmit the current signal to a receiver connected to the two-conductor loop, the current in the two-conductor loop being controlled by the loop current controller to be proportional to a signal output from the sensor, the system further comprising energy harvesting circuitry in electrical connection with the two-conductor loop, the energy harvesting circuitry comprising a second current controller in parallel electrical connection with the loop current controller and a power converter in electrical connection with the second current controller, the second current controller controlling a portion of current drawn from the two-conductor loop and delivered to the power converter from an output port of the second current controller, the portion of the current drawn from the two-conductor loop being less than the current signal into an input port thereof, the power converter converting a primary current and a primary voltage to a secondary current and a predetermined secondary voltage to be supplied to at least one load device, the portion of the current drawn from the two-conductor loop being returned to the loop current controller from the energy harvesting circuit, wherein noise in the portion of the current drawn from the two-conductor loop by the second current controller is controlled by the second current controller to be below a predetermined threshold so that the loop current controller controls noise in the current in the two-conductor loop to be less than a current corresponding to a resolution of the sensor.

2. The system of claim 1 wherein noise in the portion of the current drawn from the two-conductor loop to the secondary current controller is controlled so that the loop current controller controls noise in the current in the two-conductor loop to be less than a current corresponding to one half the resolution of the sensor.

3. The system of claim 2 wherein the second current controller has a secondary bandwidth and the loop current controller has a first bandwidth, the secondary bandwidth being greater than the first bandwidth.

4. The system of claim 3 wherein the secondary bandwidth is sufficient to resist variation in the portion of current drawn from the two-conductor loop in response to variation in the primary current and the primary voltage arising in the energy harvesting circuit.

5. The system of claim 4 wherein the second current controller restricts noise in the current drawn from the two-conductor loop such that the first bandwidth of the loop current controller is sufficient to restrict noise in the current signal to be within one half of the resolution of the sensor.

6. The system of claim 4 further comprising a processor system in operative connection with the sensor to receive an analog signal from the sensor, the processor system converting the analog signal to a digital signal to be delivered to the loop current controller to establish a first setpoint equivalent to the current signal.

7. The system of claim 6 wherein the processor system is in operative connection with the second current controller to set a second setpoint equal the portion of the current drawn from the two-conductor loop by the second current controller based upon data feedback to the processor system indicating a status of power conversion.

8. The system of claim 7 wherein the loop current controller draws a current I1 from the two-conductor loop such that I1 plus the returned portion of the current drawn from the two-conductor loop by the second current controller is equal to the first setpoint, wherein the second setpoint is always less than the first setpoint.

9. The system of claim 8 wherein the primary current is controlled to maintain the power input to the power converter in a predetermined manner based upon data feedback to the processor system indicating a status of power conversion.

10. The system of claim 7 wherein the energy harvesting system further comprises a third current controller having an input port in electrical connection with an output of the power converter, the third current controller determining the secondary current drawn through the power converter.

11. The system of claim 10 wherein the energy harvesting system further comprises at least one energy storage component in electrical connection with an output of the third current controller and in electrical connection with the at least one load device.

12. The system of claim 11 wherein the at least one energy storage component comprises at least one high-capacity capacitor.

13. The system of claim 12 wherein energy is transferred to the at least one load device from the at least one high-capacity capacitor if an instantaneous power requirement of the at least one load device exceeds an instantaneous power available from the power converter.

14. The system of claim 12 wherein energy is transferred to the at least one load device from the at least one high-capacity capacitor if the primary voltage is below a predetermined threshold.

15. The system of claim 13 wherein energy is transferred to the at least one high-capacity capacitor if the instantaneous power required by the at least one load device is less than the instantaneous power energy available from the power converter.

16. The system of claim 14 wherein the processor system is in operative connection with the third current controller, determines a third setpoint equivalent to the secondary current to be drawn through the power converter and transmits the third setpoint to the third current controller.

17. The system of claim 16 wherein the processor system further controls energy transfer from the at least one high-capacity capacitor.

18. The system of claim 16 wherein the third setpoint is determined by the processor system on the basis of at least one of a power available to the power converter and a predetermined operating range of the primary current and the primary voltage.

19. The system of claim 16 wherein the second setpoint and the third setpoint are determined to maintain each of the primary current and the primary voltage in a predetermined range.

20. The system of claim 16 wherein the second setpoint and the third setpoint are determined to restrict noise in the primary current arising from the power converter.

21. The system of claim 16 wherein the at least one load device is a combustible gas sensor.

22. The system of claim 21 wherein the combustible gas sensor is the sensor from which the signal is output and comprises a first element, the first element comprising a first electric heating element, a first support structure on the first electric heating element and a first catalyst supported on the first support structure, the combustible gas sensor further comprising electronic circuitry in electrical connection with the energy harvesting system and with the first element, the electronic circuitry providing energy to the first element to heat the first element to at least a first temperature at which the first catalyst catalyzed combustion of an analyte gas and the electronic circuitry applies energy to the first element in a pulsed manner.

23. The system of claim 22 comprising a plurality of load devices comprising the combustible gas sensor in operative connection with the power conversion system, wherein a capacity of the at least one high-capacity capacitor is determined based upon a predicted load profile of the plurality of load devices.

24. The system of claim 23 wherein the processor system controls application of power to at least one of the plurality of load devices based upon a predetermined rule set.

25. The system of claim 4 wherein the energy harvesting system further comprises at least one energy storage component in electrical connection with an output of the power converter and in electrical connection with the at least one load device.

26. The system of claim 25 wherein the at least one energy storage component comprises at least one high-capacity capacitor.

27. The system of claim 26 wherein energy is transferred to the at least one load device from the at least one high-capacity capacitor if an instantaneous power requirement of the at least one load device exceeds an instantaneous power available from the power converter.

28. The system of claim 1 wherein the power converter comprises a DC-DC switched-mode power supply to provide a predetermined secondary voltage.

29. The system of claim 1 wherein the power converter comprises a buck converter, a sepic converter or a switched capacitor converter to provide a predetermined secondary voltage.

30. The system of claim 1 wherein an impedance looking into the output of the second current controller is greater than an impedance looking into a bypass capacitance in electrical connection of the output of the second current controller and with the input of the power converter.

31. The system of claim 20 the impedance looking into the output of the second current controller is sufficiently greater than the impedance of the input looking into the bypass capacitance so that harmonics above the second bandwidth are drawn from the bypass capacitance.

32. A method of harvesting energy from a two-conductor loop in electrical connection with a power source and with a loop current controller, the loop current controller comprising a first port having a first terminal and a second terminal to connect to respective conductors of the two-conductor loop and a second port in operative connection with a sensor, the loop current controller controlling a current in the two-conductor loop to be equal to a current signal to transmit the current signal to a receiver connected to the two-conductor loop, the current in the two-conductor loop being controlled by the loop current controller to be proportional to a signal output from the sensor, comprising: electrically connecting an energy harvesting circuit to the two-conductor loop, the energy harvesting circuit comprising a second current controller connected in parallel electrical connection with the loop current controller and a power converter in electrical connection with an output of the second current controller, the second current controller controlling a portion of current drawn from the two-conductor loop and delivered to the power converter from an output port of the second current controller, the portion of the current drawn from the two-conductor loop being less than the current signal into an input port thereof, converting the primary current and a primary voltage to a secondary current and a predetermined secondary voltage to be supplied to at least one load device via the power converter, and returning the portion of the current drawn from the two-conductor loop to the loop current controller from the energy harvesting circuit, wherein noise in the portion of the current drawn from the two-conductor loop by the second current controller is controlled by the second current controller to be below a predetermined threshold so that the loop current controller controls noise in the current in the two-conductor loop to be less than a current corresponding to a resolution of the sensor.

33. A system comprising a two-conductor loop in electrical connection with a power source and with a loop current controller, the loop current controller comprising a first port having a first terminal and a second terminal to connect to respective conductors of the two-conductor loop and a second port in operative connection with a combustible gas sensor, the loop current controller controlling a current in the two-conductor loop to be equal to a current signal to transmit the current signal to a receiver connected to the two-conductor loop, the current in the two-conductor loop being controlled by the loop current controller to be proportional to a signal output from the combustible gas sensor, the system further comprising energy harvesting circuitry in electrical connection with the two-conductor loop, the energy harvesting circuitry comprising a second current controller in parallel electrical connection with the loop current controller and a power converter in electrical connection with the second current controller, the second current controller drawing a portion of current from the two-conductor loop which is less than the current signal into an input port thereof, the second current controller controlling a portion of current drawn from the two-conductor loop and delivered to the power converter from an output port of the second current controller, the portion of the current drawn from the two-conductor loop being less than the current signal into an input port thereof, the power converter converting a primary current and a primary voltage to a secondary current and a predetermined secondary voltage to be supplied to at least one load device, the portion of the current drawn from the two-conductor loop being returned to the loop current controller from the energy harvesting circuit, wherein noise in the portion of the current drawn from the two-conductor loop by the second current controller is controlled by the second current controller to be below a predetermined threshold so that the loop current controller controls noise in the current in the two-conductor loop to be less than a current corresponding to a resolution of the combustible gas sensor.

\* \* \* \* \*

UNITED STATES PATENT AND TRADEMARK OFFICE
CERTIFICATE OF CORRECTION

PATENT NO. : 10,897,133 B2
APPLICATION NO. : 16/518942
DATED : January 19, 2021
INVENTOR(S) : Sexton et al.

Page 1 of 1

It is certified that error appears in the above-identified patent and that said Letters Patent is hereby corrected as shown below:

In the Specification
Column 19, Line 59 delete "control controller" and insert --current controller--.
Column 38, Line 19 delete "select" and insert --selected--.
Column 47, Line 42 delete "systems" and insert --system--.
Column 51, Line 33 delete "mounted" and insert --be mounted--.
Column 51, Line 46 delete "MEMS pellistor" and insert --MEMS pellistor 100--.

Signed and Sealed this
Thirtieth Day of March, 2021

Drew Hirshfeld
*Performing the Functions and Duties of the*
*Under Secretary of Commerce for Intellectual Property and*
*Director of the United States Patent and Trademark Office*